(12) United States Patent
Sato et al.

(10) Patent No.: US 7,737,707 B2
(45) Date of Patent: Jun. 15, 2010

(54) SHEET-LIKE PROBE, METHOD OF PRODUCING THE PROBE, AND APPLICATION OF THE PROBE

(75) Inventors: Katsumi Sato, Chuo-ku (JP); Kazuo Inoue, Chuo-ku (JP); Hitoshi Fujiyama, Chuo-ku (JP); Mutsuhiko Yoshioka, Chuo-ku (JP); Hisao Igarashi, Chuo-ku (JP)

(73) Assignee: JSR Corporation, Tokyo (JP)

( * ) Notice: Subject to any disclaimer, the term of this patent is extended or adjusted under 35 U.S.C. 154(b) by 577 days.

(21) Appl. No.: 11/587,401

(22) PCT Filed: Apr. 26, 2005

(86) PCT No.: PCT/JP2005/007939

§ 371 (c)(1),
(2), (4) Date: Jan. 22, 2007

(87) PCT Pub. No.: WO2005/103734

PCT Pub. Date: Nov. 3, 2005

(65) Prior Publication Data

US 2007/0205783 A1    Sep. 6, 2007

(30) Foreign Application Priority Data

Apr. 27, 2004    (JP) ............................. 2004-132151

(51) Int. Cl.
*G01R 1/073*    (2006.01)
*H05K 3/02*    (2006.01)

(52) U.S. Cl. ........................................ 324/754; 29/846

(58) Field of Classification Search ......... 324/754–765; 174/257, 258; 29/830, 846; 106/1.18
See application file for complete search history.

(56) References Cited

U.S. PATENT DOCUMENTS 4,322,682 A * 3/1982 Schadwill .................... 324/761

(Continued)

FOREIGN PATENT DOCUMENTS

JP    51-93393    8/1976

(Continued)

OTHER PUBLICATIONS

U.S. Appl. No. 12/089,608, filed Apr. 9, 2008, Yamada, et al.

*Primary Examiner*—Ernest F Karlsen
(74) *Attorney, Agent, or Firm*—Oblon, Spivak, McClelland, Maier & Neustadt, L.L.P.

(57) ABSTRACT

A sheet-like probe and a method of producing the probe. In the probe electrode structure bodies do not come out from an insulation film and achieve high durability, and in a burn-in test for a wafer having a large area and for a circuit device having to-be-inspected electrodes with small intervals, positional displacement, caused by temperature variation, between the electrode structure bodies and the to-be-inspected electrode can be reliably prevented for stable connection conditions. The sheet-like probe includes an insulation layer and a contact film provided with electrode structure bodies arranged on the insulation layer to be apart from each other in the surface direction of the insulation layer and penetratingly extend in the thickness direction of the insulation layer. The electrode structure bodies each are composed of a surface electrode section exposed to the front surface of the insulation layer.

14 Claims, 45 Drawing Sheets

U.S. PATENT DOCUMENTS 6,297,658 B1 * 10/2001 Nakata et al. ............... 324/765
6,663,799 B2 * 12/2003 Kokubo et al. ............. 252/512

FOREIGN PATENT DOCUMENTS

| | | |
|---|---|---|
| JP | 53-147772 | 12/1978 |
| JP | 61-250906 | 11/1986 |
| JP | 7-231019 | 8/1995 |
| JP | 11 204177 | 7/1999 |
| JP | 11-326378 | 11/1999 |
| JP | 2001 015565 | 1/2001 |
| JP | 2001 208776 | 8/2001 |
| JP | 2001-351702 | 12/2001 |
| JP | 2002-196018 | 7/2002 |
| JP | 2002 289277 | 10/2002 |
| JP | 2004-172589 | 6/2004 |

* cited by examiner

FIG. 6
(a)
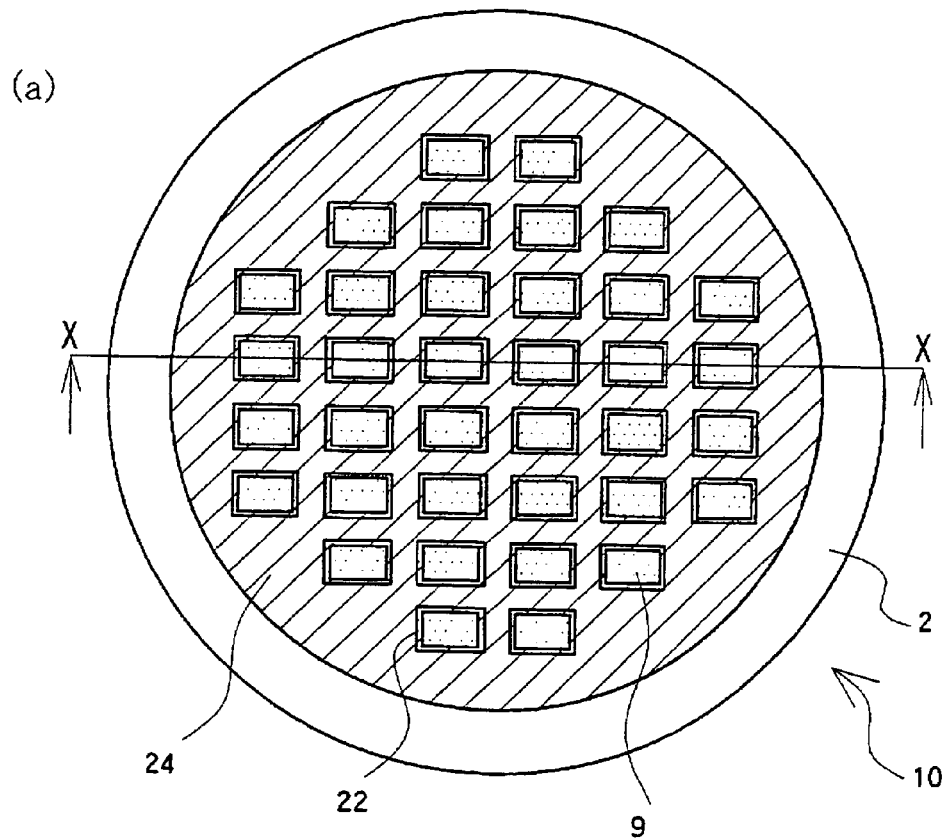
(b)
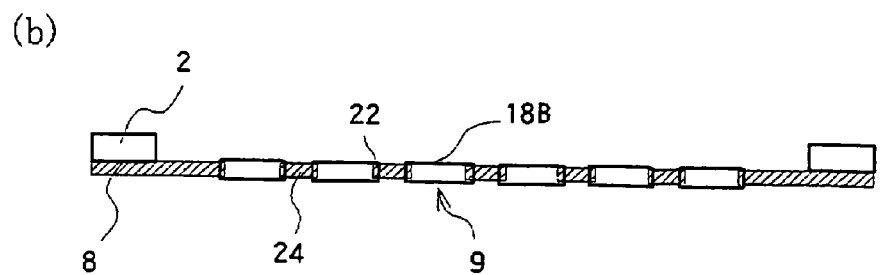

FIG. 24
(a)
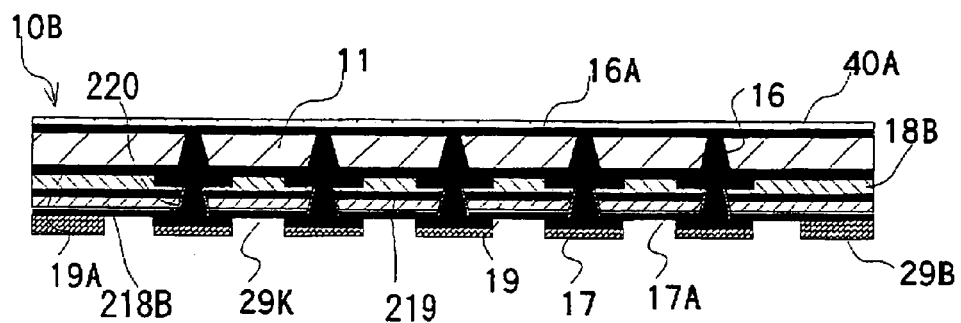
(b)
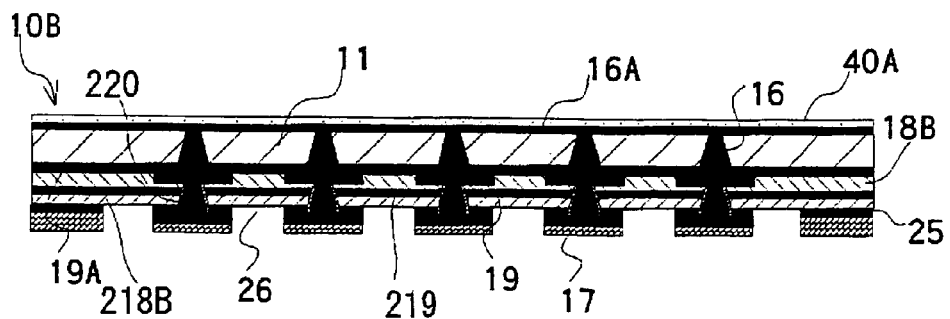
(c)
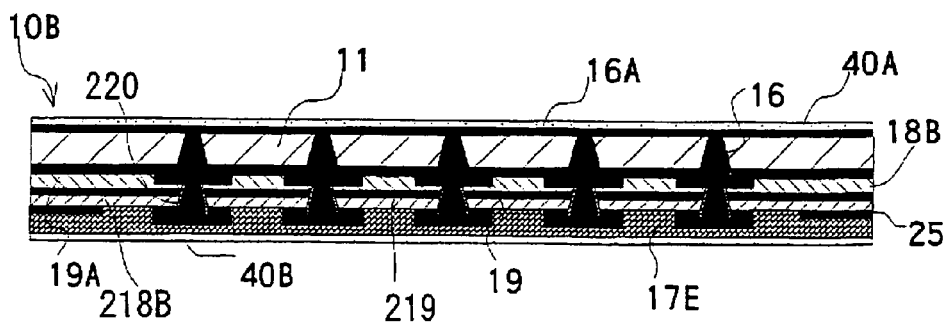

FIG. 38
(a)
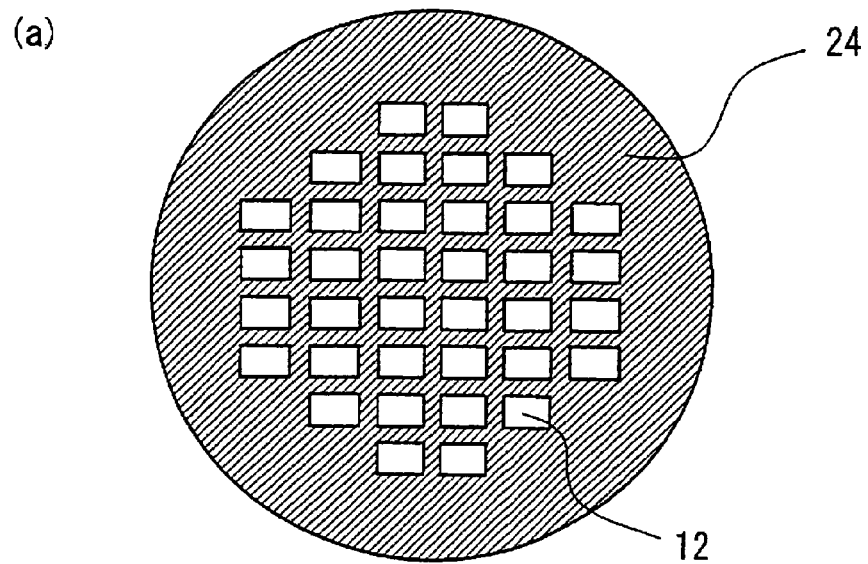
(b)
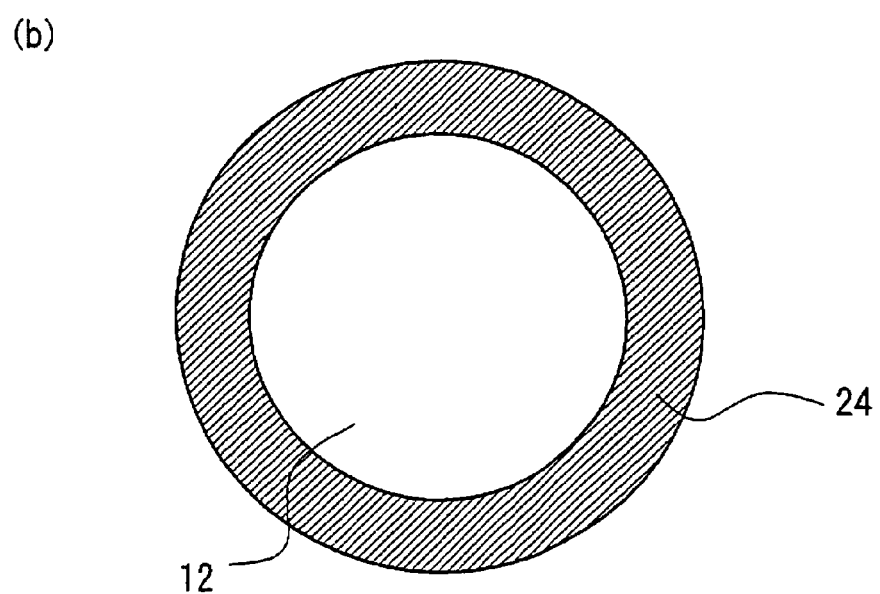

SHEET-LIKE PROBE, METHOD OF PRODUCING THE PROBE, AND APPLICATION OF THE PROBE

CONTINUING DATA

This application is a 371 of PCT/JP05/07939, filed Apr. 26, 2005.

TECHNICAL FIELD

The present invention relates to a sheet-like probe which is suitable for a probe apparatus to carry out an electrical connection to a circuit, a method of manufacturing the probe and an application thereof in an electrical inspection for a circuit such as an integrated circuit.

BACKGROUND ART

For example, in an electrical inspection for a wafer on which a large number of integrated circuits are formed or a circuit device such as an electronic component, for example, a semiconductor device, there has been used a probe for an inspection which has inspection electrodes arranged in accordance with a pattern corresponding to a pattern of electrodes to be inspected in a circuit device to be inspected.

Conventionally, there has been used a probe for an inspection in which the inspection electrodes formed by a pin or a blade are arranged.

However, in the case in which the circuit to be inspected is a wafer having a large number of integrated circuits formed thereon, it is necessary to arrange a large number of inspection electrodes when fabricating a probe for an inspection to inspect the wafer. Therefore, the probe for an inspection is very expensive. Moreover, in the case in which the pitch of the electrodes to be inspected is small, it is hard to carry out the fabrication of the probe for an inspection itself.

Furthermore, a warpage is generally generated on the wafer and the state of the warpage is also varied for each product (wafer). For this reason, it is practically hard to cause each of the inspection electrodes of the probe for an inspection to come in contact with a large number of electrodes to be inspected in the wafer stably and reliably.

For the above reasons, in recent years, there has been proposed a probe for an inspection which serves to inspect an integrated circuit formed on a wafer, comprising a circuit board for an inspection on which a plurality of inspection electrodes is formed in accordance with a pattern corresponding to a pattern of electrodes to be inspected on a surface, an anisotropically conductive sheet disposed on a surface of the circuit board for an inspection and a sheet-like probe in which a plurality of electrode structures extended to penetrate in a direction of a thickness thereof is arranged in a flexible insulating sheet (for example, see Patent Document 1).

FIG. 39 is an explanatory sectional view showing a structure according to an example of a conventional probe card comprising a circuit board 85 for an inspection, an anisotropically conductive sheet 80 and a sheet-like probe 90.

In the probe card, there is provided a circuit board 85 for an inspection having a large number of inspection electrodes 86 formed in accordance with a pattern corresponding to a pattern of electrodes to be inspected in a circuit device to be inspected over a surface, and a sheet-like probe 90 is disposed on the surface of the circuit board 85 for an inspection through the anisotropically conductive sheet 80.

The anisotropically conductive sheet 80 has a pressurizing conducting portion exhibiting a conductivity in only a direction of a thickness or exhibiting the conductivity in only the direction of the thickness when a pressurization is carried out in the direction of the thickness. There have been known the anisotropically conductive sheets having various structures. For example, Patent Document 2 and the like have disclosed an anisotropically conductive sheet obtained by uniformly dispersing a metal particle in an elastomer (which will be hereinafter referred to as a "dispersion type anisotropically conductive sheet").

Moreover, Patent Document 3 and the like have disclosed an anisotropically conductive sheet obtained by unevenly distributing a conductive magnetic particle into an elastomer, thereby forming a large number of conductive portions extended in a direction of a thickness and an insulating portion for mutually insulating them (which will be hereinafter referred to as an "an uneven distribution type anisotropically conductive sheet") . Furthermore, Patent Document 4 and the like have disclosed the uneven distribution type anisotropically conductive sheet in which a step is formed between a surface of a conducting portion and an insulating portion.

The sheet-like probe 90 has a flexible insulating sheet 91 formed of a resin, for example, and has such a structure that a plurality of electrode structures 95 extended in a direction of a thickness is disposed on the insulating sheet 91 in accordance with a pattern corresponding to a pattern of electrodes to be inspected in a circuit device to be inspected.

Each of the electrode structures 95 has such a structure that a projected surface electrode portion 96 exposed from a surface of the insulating sheet 91 and a plate-shaped back electrode portion 97 exposed from a back of the insulating sheet 91 are integrally coupled through a short circuit portion 98 extended to penetrate through the insulating sheet 91 in a direction of a thickness thereof.

Such a sheet-like probe 90 is generally manufactured in the following manner.

First of all, a laminate material 90A obtained by forming a metal layer 92 over a surface of the insulating sheet 91 is prepared as shown in FIG. 40(a) and a through hole 98H penetrating in a direction of a thickness is formed on the insulating sheet 91 as shown in FIG. 40(b).

As shown in FIG. 40(c), subsequently, a resist film 93 is formed on the metal layer 92 of the insulating sheet 91, and furthermore, an electrolytic plating treatment is carried out by setting the metal layer 92 to be a common electrode. Consequently, the through hole 98H of the insulating sheet 91 is filled with a metal deposit so that the short circuit portion 98 coupled integrally with the metal layer 92 is formed, and furthermore, a projected surface electrode portion 96 coupled integrally with the short circuit portion 98 is formed on a surface of the insulating sheet 91.

Then, the resist film 93 is removed from the metal layer 92, and furthermore, as shown in FIG. 40(d), a resist film 94A is formed on the surface of the insulating sheet 91 including the surface electrode portion 96 and a resist film 94B is formed on the metal layer 92 in accordance with a pattern corresponding to a pattern of a back electrode portion to be formed, thereby carrying out an etching treatment over the metal layer 92. As shown in FIG. 40(e), consequently, an exposed portion in the metal layer 92 is removed so that the back electrode portion 97 is formed. Thus, the electrode structure 95 is formed.

Thereafter, the resist film 94A formed on the insulating sheet 91 and the surface electrode portion 96 is removed, and furthermore, the resist film 93 formed on the back electrode portion 97 is removed. Consequently, the sheet-like probe 90 is obtained.

In the probe for an inspection, the surface electrode portion 96 of the electrode structure 95 in the sheet-like probe 90 is provided so as to be positioned on an electrode to be inspected in the wafer over a surface of the wafer, for example, in the circuit device to be inspected.

In this state, the wafer is pressed by the probe for an inspection. Consequently, the anisotropically conductive sheet 80 is pressed by the back electrode portion 97 of the electrode structure 95 in the sheet-like probe 90.

Consequently, a conducting path is formed in a direction of a thickness between the back electrode portion 97 and the inspection electrode 86 of the circuit board 85 for an inspection over the anisotropically conductive sheet 80. As a result, an electrical connection between the electrode to be inspected in the wafer and the inspection electrode 86 of the circuit board 85 for an inspection can be achieved.

Then, a predetermined electrical inspection is executed for the wafer in this state.

According to such a probe for an inspection, the anisotropically conductive sheet 80 is deformed according to the degree of the warpage of the wafer when the wafer is pressed by the probe for an inspection. Therefore, it is possible to reliably achieve an excellent electrical connection for each of a large number of electrodes to be inspected in the wafer.

However, the probe for an inspection has the following problems.

In a process for forming the short circuit portion 98 and the surface electrode portion 96 in the method of manufacturing the sheet-like probe 90 described above, a plated layer formed by the electrolytic plating grows isotropically. As shown in FIG. 41, therefore, a distance W from a peripheral edge of the surface electrode portion 96 to that of the short circuit portion 98 is equivalent to a projection height h of the surface electrode portion 96 in the surface electrode portion 96 which is obtained.

Accordingly, a diameter R of the surface electrode portion 96 which is obtained exceeds a double of the projection height h and is considerably great.

For this reason, in the case in which the electrode to be inspected in the circuit device to be inspected is minute and is disposed at a very small pitch, a distance between the adjacent electrode structures 95 cannot be maintained sufficiently. As a result, in the sheet-like probe 90 which is obtained, the flexibility of the insulating sheet 91 is lost. For this reason, it is hard to achieve a stable electrical connection to the circuit device to be inspected.

In the electrolytic plating treatment, moreover, it is actually difficult to supply a current having an even current density distribution to the whole surface of the metal layer 92. Due to the uneven current density distribution, a growth speed of a plated layer is varied for each through hole 98H of the insulating sheet 91. Therefore, a great variation is generated in the projection height h of the surface electrode portion 96 which is formed and the distance W from the peripheral edge of the surface electrode portion 96 to that of the short circuit portion 98, that is, the diameter R.

In the case in which the projection height h of the surface electrode portion 96 has a great variation, it is hard to carry out a stable electrical connection to the circuit device to be inspected. On the other hand, in the case in which the diameter of the surface electrode portion 96 has a great variation, there is a possibility that the adjacent surface electrode portions 96 might be short-circuited.

In the foregoing, there is means for reducing the projection height h of the surface electrode portion 96. For the means to reduce the diameter of the surface electrode portion 96 which is thus obtained, there can be supposed means for reducing a diameter r of the short circuit portion 98 (which indicates the smallest length in the case in which a sectional shape is not circular), that is, a diameter of the through hole 98H of the insulating sheet 91. In a sheet-like probe obtained by the former means, however, it is hard to reliably achieve a stable electrical connection to the electrode to be inspected.

On the other hand, it is hard to carry out the formation itself of the short circuit portion 98 and the surface electrode portion 96 through the electrolytic plating treatment by the latter means.

In order to solve such problems, there have been proposed sheet-like probes obtained by disposing a large number of electrode structures having a tapered surface electrode portion which has a smaller diameter from a base end toward a tip respectively in Patent Document 5 and Patent Document 6.

The sheet-like probe described in the Patent Document 5 is manufactured in the following manner.

As shown in FIG. 42(*a*), there is prepared a laminate material 90B obtained by forming a resist film 93A and a surface side metal layer 92A on a surface of an insulating sheet 91 in this order and laminating a back side metal layer 92B on a back face of the insulating sheet 91.

As shown in FIG. 42(*b*), then, there is formed a through hole communicating with each of the back side metal layer 92B, the insulating sheet 91 and the resist film 93A in the laminate material 90B and extended in a direction of a thickness.

Consequently, a concave portion 90K for forming an electrode structure which has a tapered configuration adapted to a short circuit portion and a surface electrode portion in an electrode structure to be formed is provided on a back face of the laminate material 90B.

As shown in FIG. 42(*c*), subsequently, a plating treatment is carried out by setting the surface side metal layer 92A in the laminate material 90B to be an electrode so that the concave portion 90K for forming an electrode structure is thus filled with a metal to form a surface electrode portion 96 and a short circuit portion 98.

Then, the back side metal layer 92B in the laminate material is subjected to an etching treatment and is thus removed partially. Consequently, a back electrode portion 97 is formed as shown in FIG. 42(*d*). Thus, the sheet-like probe 90 is obtained.

Moreover, the sheet-like probe described in the Patent Document 6 is manufactured in the following manner.

As shown in FIG. 43(*a*), there is prepared a laminate material 90C obtained by forming a surface side metal layer 92A on a surface of an insulating sheet material 91A having a greater thickness than an insulating sheet in a sheet-like probe to be formed and laminating a back side metal layer 92B on a back face of the insulating sheet material 91A.

As shown in FIG. 43(*b*), then, there is formed a through hole communicating with each of the back side metal layer 92B and the insulating sheet material 91A in the laminate material 90C and extended in a direction of a thickness. Consequently, a concave portion 90K for forming an electrode structure which has a tapered configuration adapted to a short circuit portion and a surface electrode portion in an electrode structure to be formed is provided on a back face of the laminate material 90C.

By carrying out a plating treatment with the surface side metal layer 92A in the laminate material 90C set to be an electrode, subsequently, the concave portion 90K for forming an electrode structure is thus filled with a metal to form a surface electrode portion 96 and a short circuit portion 98 as shown in FIG. 43(*c*).

Subsequently, the surface side metal layer 92A in the laminate material 90C is removed, and furthermore, the insulating sheet material 91A is subjected to an etching treatment, thereby removing a surface side portion of the insulating sheet. As shown in FIG. 43(d), thus, the insulating sheet material 91 having a predetermined thickness is formed and the surface electrode portion 96 is exposed.

Then, the back side metal layer 92B is subjected to the etching treatment so that the back electrode portion 97 is formed. Thus, the sheet-like probe 90 is obtained as shown in FIG. 43(e).

According to such a sheet-like probe 90, the surface electrode portion 96 is tapered. Therefore, the surface electrode portion 96 having a small diameter and a great projection height can be formed in a state in which a distance from the surface electrode portion 96 of an adjacent electrode structure is maintained sufficiently. Furthermore, each of the surface electrode portions 96 of the electrode structure 95 is formed by setting, as a cavity, the concave portion 90K for forming an electrode structure which is provided on the laminate material. Consequently, it is possible to obtain the electrode structure 95 having a small variation in the projection height of the surface electrode portion 96.

In these sheet-like probes, however, the diameter of the surface electrode portion in the electrode structure is equal to or smaller than the diameter of the short circuit portion, that is, the diameter of the through hole formed on the insulating sheet. Therefore, the electrode structure slips from the back face of the insulating sheet. Consequently, it is hard to actually use the sheet-like probe.

In order to solve the problem, for example, there has been proposed a sheet-like probe which has a holding portion on the surface electrode portion side in the electrode structure which has a small diameter and a tapered configuration described in the Patent Document 7 and prevents the electrode structure from slipping from the back face of the insulating sheet.

The sheet-like probe described in the Patent Document 7 is manufactured in the following manner.

As shown in FIG. 44(a), there is prepared a laminate material 132 including five layers formed by a surface side metal layer 122, an insulating sheet 124, a first back side metal layer 126, an insulating layer 128 and a second back side metal layer 130.

As shown in FIG. 44(b), an opening portion 134 is provided on the second back side metal layer 130 in the laminate material 132 and the insulating layer 128 is subjected to etching through the opening portion 134 so that a through hole 136 is provided on the insulating layer 128.

Next, the etching is carried out over the first back side metal layer 126 exposed from the bottom portion of the through hole of the insulating layer 128, thereby exposing the insulating sheet 124 from the bottom portion of the through hole 136.

Then, the insulating sheet 124 is subjected to the etching via the through hole 136 of the first back side metal layer 126, thereby exposing the surface side metal layer 122 from the bottom portion of the through hole 136.

Thus, the metal layer and the resin layer (the insulating layer 128 and the insulating sheet 124) are mutually subjected to the etching, thereby forming a through hole 138 communicating with each of the second back side metal layer 130, the insulating layer 128, the first back side metal layer 126 and the insulating sheet 124 and extended in a direction of a thickness. Thus, a concave portion 90K for forming an electrode structure having a tapered configuration adapted to a short circuit portion and a surface electrode portion of an electrode structure to be formed is provided on the back face of the laminate material 132.

Subsequently, a plating treatment is carried out by setting the surface side metal layer 122 in the laminate material 132 as an electrode. As shown in FIG. 44(c), consequently, the concave portion 90K for forming an electrode structure is filled with a metal to form the surface electrode portion 96 and the short circuit portion 98.

Then, the surface side metal layer 122 in the laminate material 132 is removed, and the insulating sheet 124 is subjected to the etching treatment and is thus removed to expose the first back side metal layer 126 (FIG. 44(d)).

Thereafter, the first back side metal layer 126 is subjected to the etching treatment to form a holding portion, and the first back side metal layer 126 is subjected to the etching treatment and is thus removed partially, thereby forming the back electrode portion 97 and a support portion. As shown in FIG. 44(e), thus, the sheet-like probe 90 is obtained.

In the sheet-like probe obtained by such a manufacturing method, furthermore, the back face of the laminate material 90C is provided with the concave portion 90K for forming an electrode structure which has a tapered configuration adapted to the short circuit portion and the surface electrode portion in the electrode structure to be formed. Therefore, a tip diameter 92T of the concave portion for forming an electrode structure is smaller than a diameter of an opening portion 92H formed on the back face of the laminate material 90C.

In this fabrication process of the sheet-like probe described in the Patent Document 7, a through hole for forming the electrode structure is formed in a insulating layer made of polyimide or the like. As shown in FIG. 45, the through hole can be obtained by forming the pattern of a photoresist film 140 including an opening 140a in the section in which the through hole will be formed on one face of the second back side metal layer 130 and by immersing the whole sheet in an etchant and carrying out an etching, thereby forming the through hole in the insulating layer 128 and the insulating sheet 124 made of polyimide.

In this method, a through hole 142a is formed in such a manner that a surface side metal layer 122 that has been laminated on the insulating sheet 124 is exposed at the bottom of the through hole 81a, and the electrode structure is formed through the process in which an electrolytic plating is carried out using the surface side metal layer 122 as a common electrode.

However, in the case in which a through hole is formed by carrying out an etching to the insulating layer 128 and the insulating sheet 124 made of polyimide, as shown in FIG. 45, the through hole 142a is tapered, and the diameter of the through hole becomes smaller as the through hole is deeper. Accordingly, in the case in which a polyimide film with a large film thickness is used, a through hole is closed before the through hole reaches to the surface side metal layer 122, thereby preventing the through hole 142a from being formed.

More specifically, in the case in which a through hole for forming the electrode structure is tried to be formed in a insulating layer made of polyimide by etching processing as a conventional method, there is a problem of that the through hole 142a that reaches to the surface side metal layer 122 cannot be formed in the case in which an film thickness t1 of the insulating sheet 124 and an film thickness t2 of the insulating layer 128 of which the surface is covered by a photoresist film 140 is thicker.

An etching treatment angle θ in an etching treatment, which differs in processing conditions, is said to be in the range of 45° to 55° in general.

Consequently, the through hole 142a cannot be reliably formed in the insulating layer if the sum of the film thickness t1 and the film thickness t2 of the insulating sheet 124 and the insulating layer 128 is more than half of a diameter φ1 of an opening.

Therefore, to reliably form the through hole 142a, it is necessary to decrease an film thickness t1 of the insulating sheet 124 or an film thickness t2 of the insulating layer 128. Accordingly, there is a case in which it is difficult to form the surface electrode portion having a large projection height. In the case in which a thickness of the electrode structure of the sheet-like probe is decreased and, for instance, the periphery of an electrode to be inspected in a circuit device to be inspected is covered by an insulating layer having a large thickness, it may be difficult to connect the electrode structure and the electrode to be inspected.

In this manufacturing method, a thickness of the electrode structure is almost equivalent to the sum of a thickness of the insulating sheet 124 and a thickness of the insulating layer 128, and a thickness of the short circuit portion is equivalent to a thickness of the insulating layer 128. Consequently, to increase a thickness of the electrode structure, it is necessary to increase a thickness of the insulating layer.

The sheet-like probe with an insulating layer having a large thickness has an effect of a high durability in repeated use. However, for such a sheet-like probe, a deformation amount of the insulating layer in a direction of a thickness is decreased, thereby decreasing a moving amount of the electrode structure in a direction of a thickness.

In particular, to suppress a positional shift of the electrode structure in a planar direction thereof, the sheet-like probe having a shape supporting the insulating film by a metal support material tends to further decrease a moving amount of the electrode structure in a direction of a thickness.

A decrease in a moving amount of the electrode structure in a direction of a thickness for the sheet-like probe causes a concave and convex absorbing ability of a probe card using the sheet-like probe to be reduced.

More specifically, for a probe card, the sum of a concave and convex absorbing ability of an anisotropically conductive connector and a concave and convex absorbing ability of the sheet-like probe becomes a concave and convex absorbing ability of the probe card. Consequently, a decrease in a concave and convex absorbing ability of the sheet-like probe causes a concave and convex absorbing ability of the probe card to be reduced.

In the case in which an electrode to be inspected in a circuit device has a variation in height for the probe card having a reduced concave and convex absorbing ability, a large pressure is required to achieve an electrical connection of the probe card to each electrode to be inspected. Accordingly, since there is increased a compressive deformation amount of a conductive portion in an anisotropically conductive connector, a permanent deformation of a conductive portion in an anisotropically conductive connector occurs early and an electrical connection is made difficult, thereby requiring an exchange of the anisotropically conductive connector and increasing an inspection cost.

In addition, in the case in which an electrode to be inspected in a circuit device is a solder bump electrode having a large variation in height, it may be impossible to achieve an electrical connection of the probe card to each electrode to be inspected.

Therefore, it is desired to increase a moving amount of the electrode structure in a direction of a thickness for the sheet-like probe to obtain a probe card having a large concave and convex absorbing ability.

As a means of increasing a concave and convex absorbing ability, a sheet-like connector as shown in the Patent Document 8 is known for instance.

Such a sheet-like connector is an anisotropically conductive connector composed of a complex conductive sheet in which a tapered movable conductor adapted to a tapered through hole formed in an insulating sheet is formed movably in a direction of a thickness of an insulating sheet and two anisotropically conductive elastomer sheets disposed on one and another faces of the complex conductive sheet.

For such an anisotropically conductive connector having a complex conductive sheet, a movable electrode in the complex conductive sheet can be moved in a direction of a thickness. Therefore, in the case in which the movable electrode is pressurized in a direction of a thickness, the two anisotropically conductive elastomer sheets disposed on one and another faces of the complex conductive sheet are compressed and deformed linking to each other. As a result, the total concave and convex absorbing ability of the two anisotropically conductive elastomer sheets appears as a concave and convex absorbing ability of the anisotropically conductive connector, thereby obtaining a high concave and convex absorbing ability.

Moreover, a thickness required for obtaining the desired concave and convex absorbing ability can be ensured by the total thickness of the two anisotropically conductive elastomer sheets, and an individual anisotropically conductive elastomer sheet having a small thickness can be used, thereby obtaining a high resolution.

However, the above described anisotropically conductive connector has a following problem in practice.

For the above described anisotropically conductive connector, a movable conductor in the complex conductive sheet is supported by both the insulating sheet and the anisotropically conductive elastomer sheet. In the case in which the complex conductive sheet and the anisotropically conductive elastomer sheet are separated from each other, the movable conductor may slip from the insulating sheet. Consequently, it is extremely hard to actually use the complex conductive sheet individually.

Accordingly, in the case in which a failure occurs in either of the complex conductive sheet and the anisotropically conductive elastomer sheet in the anisotropically conductive connector, either of the complex conductive sheet and the anisotropically conductive elastomer sheet cannot be exchanged to new one but the whole anisotropically conductive connector must be exchanged to new one.

Moreover, to form the movable conductor and its projecting portion in the above described sheet-like connector, a laser processing is carried out from the side of the insulating sheet to a laminate material in which an insulating sheet material and an auxiliary layer for forming a projecting portion are laminated, and a tapered through hole is formed.

Therefore, as described in a formation of the concave portion 90K for forming an electrode structure shown in the Patent Document 7, the sheet-like connector has problems of a miniaturization in a diameter of a tip portion of the movable conductor in the case in which a processing is carried out to a laminate sheet having a large thickness and of ensuring an insulating property between adjacent movable conductors in the case in which an electrode pitch of a wafer to be inspected described later is decreased. As a result, there are problems in the case in which a sheet-like connector is used as a sheet-like probe for inspecting a wafer.

As an electrode pitch of a wafer to be an object to be inspected becomes shorter, a disposition pitch of an electrode structure of the sheet-like probe becomes shorter. Although a disposition pitch of the electrode structure is generally in the range of 100 to 120 μm at present, it is thought that the disposition pitch must be for instance less than 100 μm in the future and 80 μm or less in the further future.

On the other hand, to ensure an insulating property between adjacent electrode structures, a width of an insulating portion between the electrode structures must be for instance in the range of 40 to 50 μm (a difference between a disposition pitch of an electrode structure and a diameter φ1 of an opening).

In the case in which a thick polyimide film is used to ensure the strength of the polyimide film, a diameter φ1 of an opening must be larger to form a through hole by etching as described above. However, in the case in which a diameter φ1 of an opening is made larger while a disposition pitch of an electrode structure is kept constant, an insulating property between adjacent electrode structures cannot be ensured.

Accordingly, in the case in which a disposition pitch of an electrode structure is made smaller, a thickness of a polyimide film is restricted. For instance, in the case in which a disposition pitch of an electrode structure is 120 μm and a diameter φ1 of an opening of a through hole is 70 μm, a thickness t of a polyimide film to be used must be 35 μm or less. In addition, in the case in which a diameter φ2 of an opening at a bottom side is made a certain level or more, the thickness t must be further less.

If the insulating layer 128 with a thickness of 50 μm is tried to be used to make the strength of the insulating layer 128 higher, a diameter φ1 of an opening of a through hole must be 100 μm or larger, thereby preventing an insulating property between adjacent insulating layers of electrode structures to be manufactured from being ensured. Consequently, it is impossible to make a diameter of an opening larger corresponding to a thickness of the insulating layer 128.

In the case in which an electrode structure is formed in a tapered through hole 142a as shown in FIG. 45, since a diameter φ2 of an opening at an end side in an etching direction is smaller, an electric resistance value increases. Accordingly, it is preferable that a diameter φ2 of an opening at the small diameter section is as large as possible.

Moreover, in the case in which the diameter φ2 of an opening is small, the small diameter section affects the electric resistance value. As a result, there is a problem that a variation of electric resistance values between electrode structures formed in the sheet-like probe may become larger.

Patent Document 1: Japanese Laid-Open Patent Publication No. 1995-231019

Patent Document 2: Japanese Laid-Open Patent Publication No. 1976-93393

Patent Document 3: Japanese Laid-Open Patent Publication No. 1978-147772

Patent Document 4: Japanese Laid-Open Patent Publication No. 1986-250906

Patent Document 5: Japanese Laid-Open Patent Publication No. 1999-326378

Patent Document 6: Japanese Laid-Open Patent Publication No. 2002-196018

Patent Document 7: Japanese Laid-Open Patent Publication No. 2004-172589

Patent Document 8: Japanese Laid-Open Patent Publication No. 2001-351702

DISCLOSURE OF THE INVENTION

Problems to be Solved by the Invention

The present invention has been made in consideration of the circumstances described above.

It is an object of the present invention to provide a sheet-like probe in which an electrode structure including a surface electrode portion having a small diameter can be formed and a stable electrical connecting state can be reliably achieved for a circuit device having an electrode formed at a small pitch of 160 μm or less, moreover 120 μm or less, particularly 100 μm or less, and furthermore, the electrode structure does not slip from an insulating layer so that a high durability can be obtained.

It is an object of the present invention to provide a sheet-like probe comprising an electrode structure having a great thickness and an insulating layer having a small thickness which can reliably achieve a stable electrical connecting state for a circuit device having an electrode formed at a small pitch and has a high durability and a high concave and convex absorbing ability.

It is an object of the present invention to provide a sheet-like probe comprising an electrode structure movable in a direction of a thickness of an insulating layer, wherein the electrode structure can be prevented from slipping from the insulating layer and it is easy to use the sheet-like probe even individually.

It is an object of the present invention to provide a method capable of manufacturing a sheet-like probe which can form an electrode structure including a surface electrode portion having a small variation in a projection height, can reliably achieve a stable electrical connecting state for a circuit device having an electrode formed at a small pitch, and furthermore, can prevent the electrode structure from slipping from an insulating layer, can comprise an insulating layer having a small thickness, and can obtain a high durability.

It is an object of the present invention to provide a method capable of manufacturing a sheet-like probe which can form an electrode structure including a surface electrode portion having a small variation in a projection height, can reliably achieve a stable electrical connecting state for a circuit device having an electrode formed at a small pitch and having a large variation in an electrode height, and furthermore, can prevent the electrode structure from slipping from an insulating layer, can comprise an electrode structure movable in a direction of a thickness of an insulating layer, and can obtain a high durability.

Moreover, it is an object of the present invention to provide a sheet-like probe capable of reliably preventing a positional shift of an electrode structure from an electrode to be inspected due to a change in a temperature, thereby maintaining an excellent electrical connecting state stably in a burn-in test also in the case in which an inspecting object is a wafer having a large area in a diameter of 8 inches or more or a circuit device having a very small pitch of the electrode to be inspected of 100 μm or less, and a method of manufacturing the sheet-like probe.

It is an object of the present invention to provide a probe card comprising the sheet-like probe.

It is an object of the present invention to provide an apparatus for inspecting a circuit device which comprises the probe card.

Means for Solving the Problems

A sheet-like probe according to the present invention comprises:

an insulating layer; and a contact film including a plurality of electrode structures disposed on the insulating layer apart from each other in a planar direction thereof and extended to penetrate in a direction of a thickness of the insulating layer, each of the electrode structures including:

a surface electrode portion exposed from a surface of the insulating layer, projected from the surface of the insulating layer, and shaped to have a diameter which is gradually reduced from the base end toward a tip;

a back electrode portion exposed from a back face of the insulating layer; and a short circuit portion extended to penetrate through the insulating layer in a direction of a thickness thereof continuously from a base end of the surface electrode portion and coupled to the back electrode portion, wherein a diameter of the base end of the surface electrode portion is larger than a diameter of the end of the side which comes into contact with the surface electrode portion on the short circuit portion, and a thickness of the short circuit portion is larger than a thickness of the insulating layer.

For the sheet-like probe according to the present invention, it is preferable that the short circuit portion is movable in a direction of a thickness of the insulating layer.

For the sheet-like probe according to the present invention, it is preferable that a length in which the electrode structure can move in a direction of a thickness of the insulating layer is in the range of 5 to 30 µm.

A method of manufacturing a sheet-like probe according to the present invention comprises the steps of:

preparing a laminate material having at least an insulating sheet, a surface side metal layer formed on a surface of the insulating sheet, and a first back side metal layer formed on a back face of the insulating sheet;

forming a through hole mutually communicating with the first back side metal layer and the insulating sheet in the laminate material and extended in a direction of a thickness, thereby providing a concave portion for forming a surface electrode portion on a back face of the laminate material;

carrying out a plating treatment over the laminate material by using the surface side metal layer as an electrode to fill a metal in the concave portion for forming a surface electrode portion, thereby forming a surface electrode portion projected from a surface of an insulating layer, forming an insulating layer configured by a plurality of resin layers having different etching speeds in a direction of a thickness on a back side of the laminate material and a second back side metal layer formed on a surface of the insulating layer;

providing a concave portion for forming a short circuit portion mutually communicating with each of the second back side metal layer and the insulating layer in the laminate material and having a bottom face from which the surface electrode portion is exposed;

carrying out the plating treatment over the laminate material by using the surface side metal layer as an electrode to fill a metal in the concave portion for forming a short circuit portion, thereby forming a short circuit portion extended to penetrate through the insulating layer in a direction of a thickness thereof continuously from a base end of the surface electrode portion;

then carrying out an etching treatment over the second back side metal layer, thereby forming a back electrode portion;

removing the surface side metal layer and the insulating sheet, thereby exposing the surface electrode portion and the first back side metal layer;

thereafter carrying out the etching treatment over the first back side metal layer, thereby forming a holding portion extended outward along the surface of the insulating sheet continuously from the base end portion of the surface electrode portion; and thereafter carrying out an etching treatment over the insulating layer to remove the surface side portion of the insulating layer, thereby decreasing a thickness of the insulating layer.

For the method of manufacturing a sheet-like probe according to the present invention, it is preferable that an etching speed of a resin layer on the side which comes into contact with the surface electrode portion is higher among the resin layers having different etching speeds that configure the insulating layer.

It is preferable that the method of manufacturing a sheet-like probe according to the present invention comprises the step of removing at least one resin layer in a plurality of resin layers having different etching speeds that configure the insulating layer.

For the method of manufacturing a sheet-like probe according to the present invention, it is preferable that the insulating layer is formed of a plurality of resin layers laminated through the metal layer and a resin layer on the surface electrode portion side from the metal layer is removed by an etching.

The present invention provides a probe card for electrically connecting a circuit device to be an inspecting object to a tester, comprising:

a circuit board for an inspection which has a plurality of inspection electrodes formed thereon corresponding to an electrode to be inspected in the circuit device to be the inspecting object;

an anisotropically conductive connector disposed on the circuit board for an inspection; and a sheet-like probe described in any of the above descriptions which is disposed on the anisotropically conductive connector.

The present invention provides a probe card for electrically connecting a circuit device to be an inspecting object to a tester, comprising:

a circuit board for an inspection which has a plurality of inspection electrodes formed thereon corresponding to an electrode to be inspected in the circuit device to be the inspecting object;

an anisotropically conductive connector disposed on the circuit board for an inspection; and a sheet-like probe manufactured by the method described in any of the above descriptions which is disposed on the anisotropically conductive connector.

The probe card according to the present invention is preferably characterized in that the circuit device to be the inspecting object is a wafer having a large number of integrated circuits formed thereon, and the anisotropically conductive connector includes:

a frame plate having a plurality of openings formed thereon corresponding to an electrode region on which electrodes to be inspected in all or a part of integrated circuits formed on a wafer to be the inspecting object are disposed; and an anisotropically conductive sheet disposed to close each of the openings of the frame plate.

An apparatus for inspecting a circuit device according to the present invention is characterized by having the probe card.

The present invention provides a method of inspecting a wafer comprising the steps of:

electrically connecting each integrated circuit of a wafer having a plurality of integrated circuits formed thereon to a tester through the probe card described in any of the above descriptions; and electrically inspecting the integrated circuit.

EFFECT OF THE INVENTION

According to the sheet-like probe in accordance with the present invention, a diameter of the base end of the surface electrode portion of the electrode structure is larger than a diameter of the end of the side which comes into contact with the surface electrode portion on the short circuit portion. Even in the case in which the surface electrode portion has a small diameter, therefore, the electrode structure can be prevented from slipping from the insulating layer so that a high durability can be obtained.

According to the sheet-like probe in accordance with the present invention, a thickness of the electrode structure is large. Even in the case in which the periphery of an electrode to be inspected in a circuit device to be inspected is covered by an insulating layer having a large thickness, therefore, it is easy to connect the electrode structure and the electrode to be inspected.

According to the sheet-like probe in accordance with the present invention, even in the case in which an inspecting object is a wafer having a large area in a diameter of 8 inches or more and a circuit device having a very small pitch of the electrode to be inspected of 120 μm or less, a tip of the surface electrode portion has a suitable diameter and a projection height is large, and a diameter of the surface electrode portion is larger than a diameter of the short circuit portion, an insulating property between adjacent electrode structures can be ensured and the electrode structure can be prevented from slipping from the insulating layer. In addition, since a thickness of the insulating layer is small, it is easy to move the electrode structure in a direction of a thickness, and a concave and convex absorbing ability of the sheet-like probe is increased.

Consequently, a concave and convex absorbing ability of the probe card using the sheet-like probe in accordance with the present invention is improved. Moreover, even in the case in which an electrode to be inspected in a circuit device to be inspected has a variation in height, an electrical connection of the probe card to each electrode to be inspected can be easily achieved.

According to the sheet-like probe in accordance with the present invention, the short circuit portion of the electrode structure can be moved in a direction of a thickness of the insulating layer, thereby increasing a concave and convex absorbing ability of the sheet-like probe.

Consequently, a concave and convex absorbing ability of the probe card using the sheet-like probe in accordance with the present invention is improved. Moreover, even in the case in which an electrode to be inspected in a circuit device to be inspected has a variation in height, an electrical connection of the probe card to each electrode to be inspected can be easily achieved.

According to the sheet-like probe in accordance with the present invention, the short circuit portion of the electrode structure can be moved in a direction of a thickness of the insulating layer, and the surface electrode portion and the back electrode portion of the electrode structure are larger than the short circuit portion, thereby preventing the electrode structure from slipping from the insulating layer and simplifying the individual use of the sheet-like probe. Consequently, for an inspection apparatus of the probe card using the sheet-like probe and a circuit device, it is easy to exchange an anisotropically conductive connector and the sheet-like probe, thereby improving an inspection efficiency of the inspection apparatus.

According to the method of manufacturing a sheet-like probe in accordance with the present invention, a plating treatment is carried out over the laminate material by using the surface side metal layer as an electrode to fill a metal in the concave portion for forming a surface electrode portion, thereby forming a surface electrode portion projected from a surface of an insulating layer, an insulating layer configured by a plurality of resin layers having different etching speeds in a direction of a thickness is laminated, a concave portion for forming a short circuit portion is formed in the insulating layer;

a metal is filled in the concave portion for forming a short circuit portion, thereby forming a short circuit portion, and an etching treatment is carried out over the insulating layer to remove the surface side portion of the insulating layer, thereby decreasing a thickness of the insulating layer.

Consequently, a sheet-like probe in which a thickness of the short circuit portion is larger than a thickness of the insulating layer can be advantageously manufactured.

According to the method of manufacturing a sheet-like probe in accordance with the present invention, an insulating layer is configured by a plurality of resin layers having different etching speeds, and an etching speed of a resin layer on the side which comes into contact with the surface electrode portion is higher. Consequently, a resin layer on the side which comes into contact with the surface electrode portion can be easily removed, and a sheet-like probe in which a thickness of the short circuit portion is larger than a thickness of the insulating layer can be advantageously manufactured.

According to the method of manufacturing a sheet-like probe in accordance with the present invention, since the insulating layer is formed of a plurality of resin layers laminated through the metal layer, a resin layer on the side which comes into contact with the surface electrode portion can be easily removed, and a sheet-like probe in which a thickness of the short circuit portion is larger than a thickness of the insulating layer can be advantageously manufactured.

BRIEF DESCRIPTION OF THE DRAWINGS

FIG. 6 is a view showing yet another embodiment of the sheet-like probe according to the present invention, FIG. 6(*a*) being a plan view and FIG. 6(*b*) being a sectional view taken along an X-X line.

FIG. 24 is an explanatory sectional view showing a further structure of the laminate material for manufacturing the sheet-like probe according to the present invention.

FIG. 38 is a plan view for explaining a shape of a metal frame plate in the sheet-like probe according to the present invention.

Figure 1:
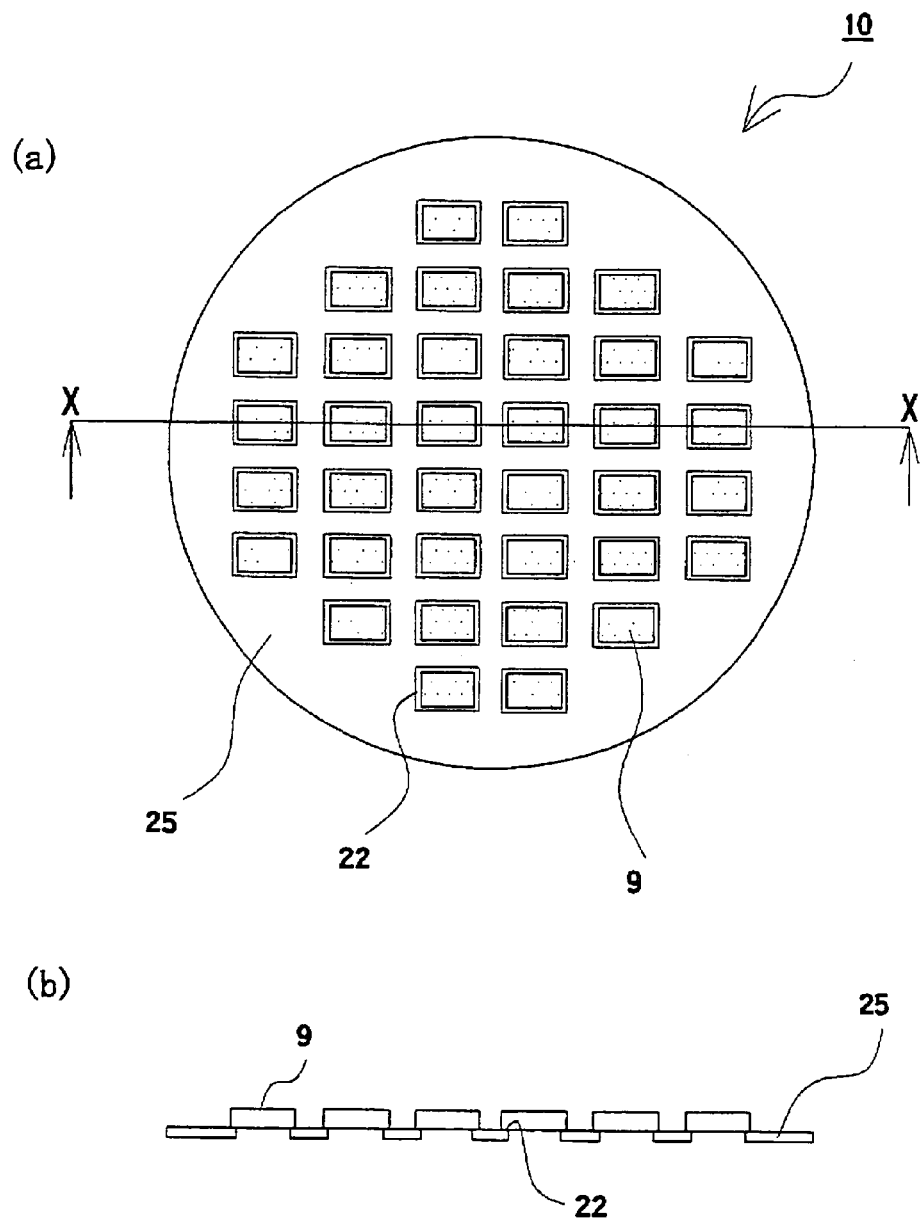
FIG. 1 is an explanatory sectional view showing a structure of a first embodiment of a sheet-like probe according to the present invention, FIG. 1(a) being a plan view, and FIG. 1(b) being a sectional view taken along an X-X line.

EXPLANATION OF THE LETTERS OR NUMERALS 1 probe card
2 support member
3 pressurizing plate
4 wafer mounting table
5 heater
6 wafer
7 electrode to be inspected
8 adhesive
9 contact film
10 sheet-like probe
10A laminate material
10B laminate material
10C laminate material 10K concave portion for forming each surface electrode portion
11 insulating sheet
11H through hole
12 through hole
12A resist film
12H pattern hole
13A resist film
13H pattern hole
14A resist film
15 electrode structure
16 surface electrode portion
16A surface side metal layer
17 back electrode portion
17A second back side metal layer
17E resist film
17F resist film
17H pattern hole (through hole)
18 short circuit portion
18B insulating layer
18C polyimide layer
18K concave portion for forming short circuit portion
18H through hole
19 holding portion
19A first back side metal layer
19H pattern hole
20 circuit board for inspection
21 inspection electrode
22 support portion
24 metal frame plate
25 metal frame plate
26 opening portion
28A resist film
29B resist film
29H pattern hole
29K pattern hole
30 anisotropically conductive connector
31 frame plate
32 opening
35 anisotropically conductive sheet
36 conducting portion
37 insulating portion
38 projected portion
40A protective film
40B protective film
50 guide pin
80 anisotropically conductive sheet
85 circuit board for inspection
86 inspection electrode
90 sheet-like probe
90A laminate material
90B laminate material
90C laminate material
90K concave portion for forming electrode structure
91 insulating sheet material
91A insulating sheet material
92 metal layer
92A surface side metal layer
92B back side metal layer
92H opening portion
93 resist film
93A resist film
94A resist film
94B resist film
95 electrode structure
96 surface electrode portion
97 back electrode portion
98 short circuit portion
98H through hole
122 surface side metal layer
124 insulating sheet
126 first back side metal layer
128 insulating layer
130 second back side metal layer
132 laminate material
134 opening portion
136 through hole
138 through hole
140 photoresist film
140a opening
142a through hole
218A polyimide layer
218B polyimide film
219 metal layer
220 metal thin layer
318 through hole

BEST MODE FOR CARRYING OUT THE INVENTION

Embodiments of the present invention will be described below in detail.

Sheet-Like Probe of the First Embodiment

Figure 2:
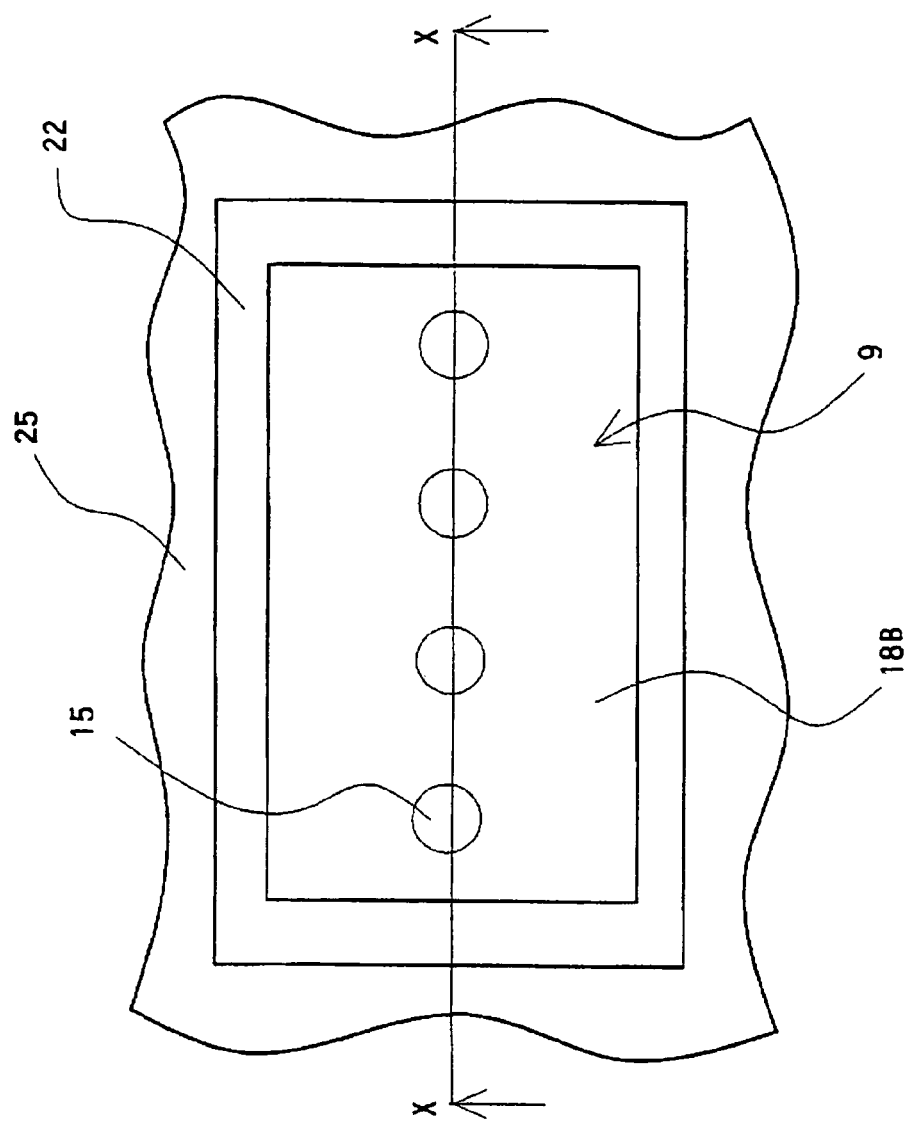
FIG. 2 is a plan view showing an enlarged contact film in the sheet-like probe of FIG. 1.
Figure 3:
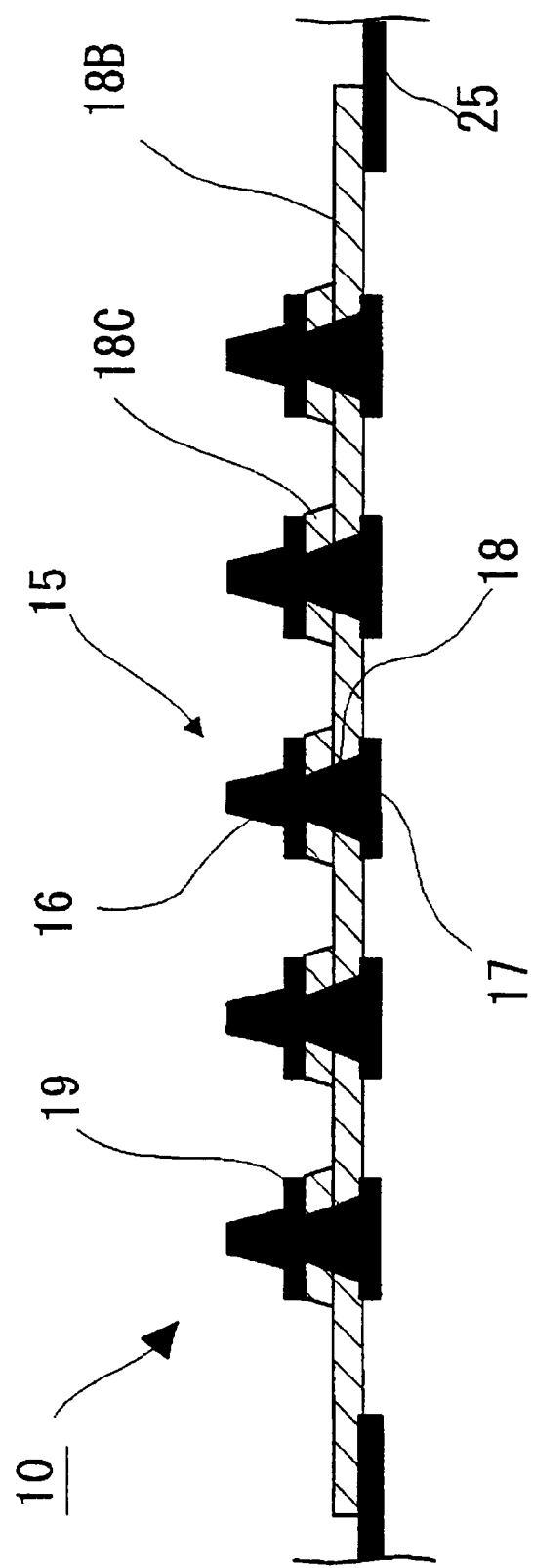
FIG. 3 is an explanatory sectional view showing a structure of the sheet-like probe of the first embodiment according to the present invention.
Figure 4:
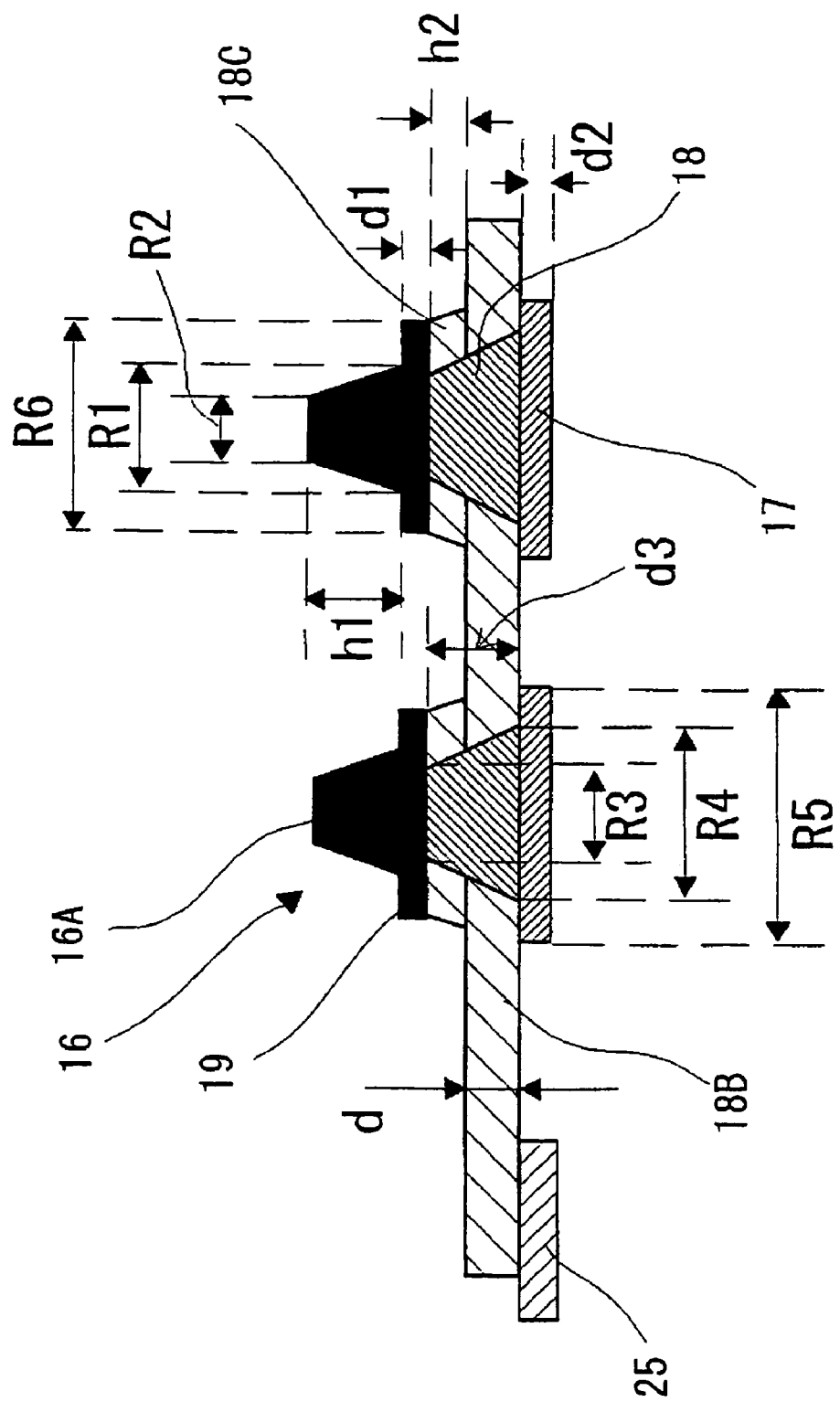
FIG. 4 is an explanatory sectional view showing an enlarged electrode structure in the sheet-like probe of the first embodiment according to the present invention.

FIG. 1 is an explanatory sectional view showing a structure of a first embodiment of a sheet-like probe according to the present invention, FIG. 1(a) being a plan view and FIG. 1(b) being a sectional view taken along an X-X line, FIG. 2 is a plan view showing an enlarged contact film in the sheet-like probe of FIG. 1, FIG. 3 is an explanatory sectional view showing a structure of the sheet-like probe according to the present invention, and FIG. 4 is an explanatory sectional view showing an enlarged electrode structure in the sheet-like probe according to the present invention.

A sheet-like probe 10 according to the present embodiment is used for carrying out an electrical inspection for each integrated circuit in a state of a wafer for a wafer having a size of 8 inches or the like in which a plurality of integrated circuits is formed.

As shown in FIG. 1(a), the sheet-like probe 10 has a metal flame plate 25 having a through hole formed in each position corresponding to each integrated circuit on a wafer to be an object to be inspected and a contact film 9 is disposed in the through hole.

The contact film 9 is supported on the metal frame plate 25 at a support portion 22 provided around the through hole of the metal frame plate 25.

As shown in FIG. 1(b), the support portion 22 is provided with the contact film 9 formed by an insulating film over the metal frame plate 25 and the contact film 9 is supported by the metal frame plate 25.

The contact film 9 has such a structure that an electrode structure 15 is formed to penetrate through a soft insulating layer 18B as shown in FIG. 2.

More specifically, a plurality of electrode structures 15 extended in a direction of a thickness of the insulating layer 18B is disposed apart from each other in a planar direction of the insulating layer 18B in accordance with a pattern corresponding to the electrode to be inspected in the wafer to be an inspecting object.

As shown in FIG. 3, moreover, each of the electrode structures 15 is provided with a projected surface electrode portion 16 which is exposed from a surface of the insulating layer 18B and projected from the surface of the insulating layer 18B. The electrode structure 15 is also provided with a rectangular plate-shaped back electrode portion 17 exposed from a back face of the insulating layer 18B. The electrode structure 15 is also provided with a short circuit portion 18 extended to penetrate in the direction of the thickness of the insulating layer 18B continuously from a base end of the surface electrode portion 16 and coupled to the back electrode portion 17. The electrode structure 15 is also provided with a circular ring plate-shaped holding portion 19 which is radially extended outward along the surface of the insulating layer 18B continuously from a peripheral surface of the base end portion of the surface electrode portion 16.

In the electrode structure 15 according to this first embodiment, the surface electrode portion 16 is linked to the short circuit portion 18 and is tapered to have a smaller diameter from the base end toward a tip, and is thus formed wholly like a truncated cone. Furthermore, the short circuit portion 18 linked to the base end of the surface electrode portion 16 is tapered to have a smaller diameter from the back face of the insulating layer 18B toward the surface thereof.

As shown in FIG. 4, moreover, a diameter R6 of the holding portion 19 is larger than a diameter R3 of one of ends of the short circuit portion 18 linked to the base end.

A thickness d of the insulating layer 18B is smaller than a thickness d3 of the short circuit portion 18.

The insulating layer 18B is not particularly restricted if it is a soft layer having an insulating property. For example, it is possible to use a resin sheet formed of a polyimide resin, a liquid crystal polymer, polyester, a fluorine type resin or the like, a sheet obtained by impregnating a fiber woven cloth with the resin, and the like. A material which can be etched, particularly, polyimide is preferable in that a through hole for forming the short circuit portion 18 can easily be provided by etching.

Moreover, a thickness d of the insulating layer 18B is not particularly restricted if the insulating layer 18B is soft, and is preferably 5 to 50 μm and is more preferably 10 to 30 μm.

The metal frame plate 25 is provided integrally with the insulating layer 18B and may be provided on the surface of the insulating layer 18B in a lamination state on the insulating layer 18B and may be included as an intermediate layer in the insulating layer 18B.

The metal frame plate 25 is provided apart from the electrode structure 15, and the electrode structure 15 and the metal frame plate 25 are coupled to each other through the insulating layer 18B. Therefore, the electrode structure 15 and the metal frame plate 25 are electrically insulated from each other.

According to a method of manufacturing the sheet-like probe 10 which will be described below, moreover, the metal frame plate 25 is formed by removing a part of a second back side metal layer 17A.

For a metal constituting the second back side metal layer 17A to be the metal frame plate 25, it is possible to use iron, copper, nickel, titanium, their alloy or alloy steel. In the manufacturing method which will be described below, iron-nickel alloy steel such as a 42 alloy, invar or kovar, copper, nickel and their alloy are preferable in that the second back side metal layer 17A can be easily separated and divided into the metal frame plate 25 and the back electrode portion 17 by an etching treatment.

For the metal frame plate 25, moreover, a coefficient of linear thermal expansion is preferably equal to or smaller than $3 \times 10^{-5}$/K, is more preferably $-1 \times 10^{-7}$ to $1 \times 10^{-5}$/K, and is particularly preferably $-1 \times 10^{-6}$ to $8 \times 10^{-6}$/K.

Specific examples of a material for constituting the metal frame plate 25 include an alloy or alloy steel, for example, an invar type alloy such as invar, an elinvar type alloy such as elinvar, super-invar, kovar or a 42-alloy.

A thickness of the metal frame plate 25 is preferably 3 to 100 μm and is more preferably 5 to 50 μm.

In some cases in which the thickness is excessively small, a necessary strength cannot be obtained as a metal frame plate for supporting the sheet-like probe. On the other hand, in some cases in which the thickness is excessively great, it is hard to carry out a separation and division into the metal frame plate 25 and the back electrode portion 17 through the second back side metal layer 17A by an etching treatment in the manufacturing method which will be described below.

Figure 11:
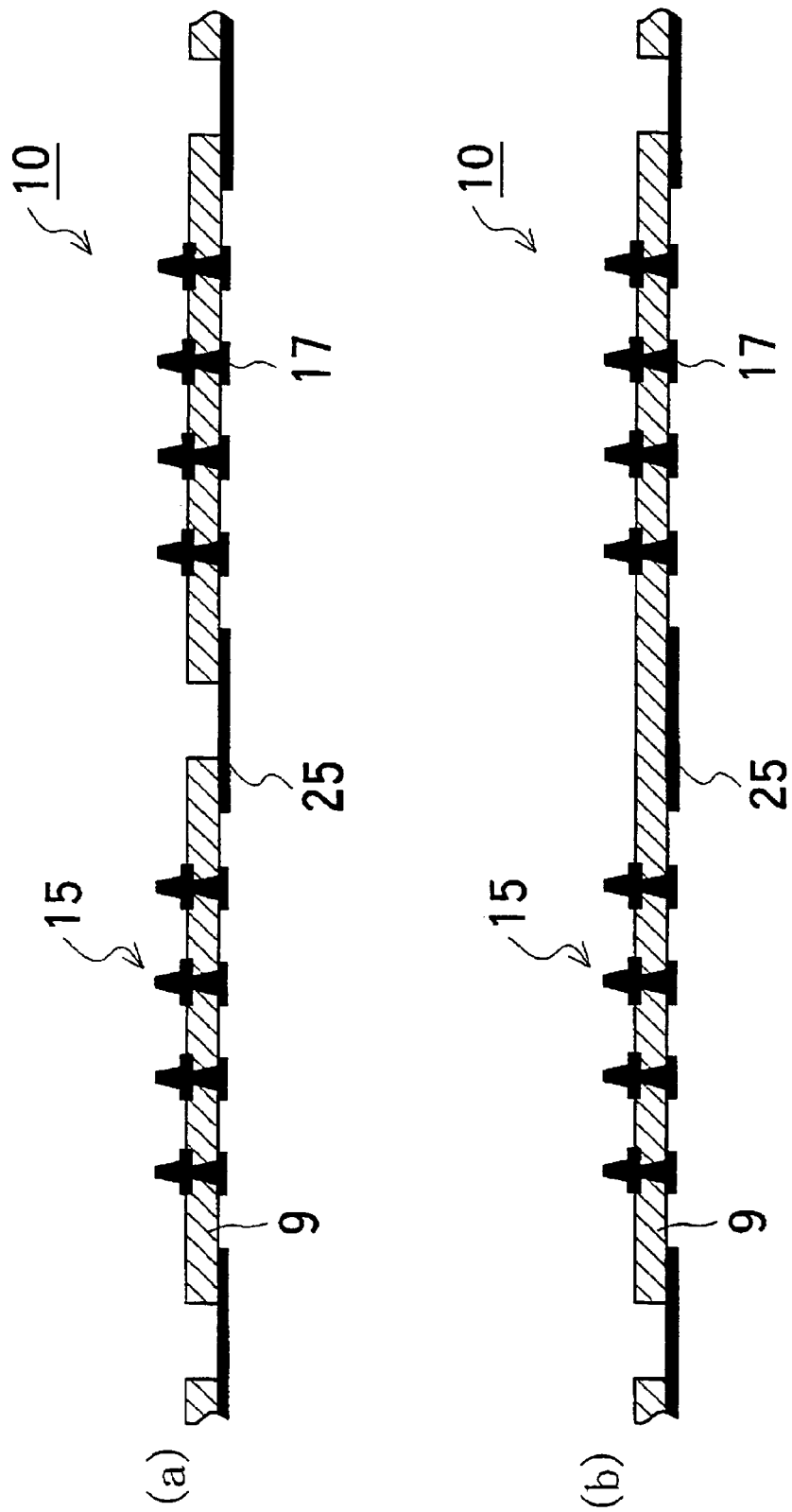
FIG. 11 is a sectional view showing a further embodiment of the sheet-like probe according to the present invention.

Moreover, the insulating sheet may be separated into a large number of contact films 9 to be supported on the metal frame plate 25 through the etching or the like as shown in FIGS. 11(a) and (b).

In this case, the soft contact films 9 for holding the electrode structures 15 in opening portions 26 of the metal frame plates 25 are disposed independently of each other (FIG. 11(a)) and partially independently of each other (FIG. 11(b)).

As shown in FIGS. 11(a) and (b), each of the contact films 9 has the soft insulating layer 18B. In the insulating layer 18B, a plurality of electrode structures 15 extended in the direction of the thickness of the insulating layer 18B and formed of a metal is disposed apart from each other in the planar direction of the insulating layer 18B in accordance with a pattern corresponding to a pattern of an electrode to be inspected in an electrode region of a wafer to be an inspecting object. Furthermore, the contact film 9 is provided to be positioned in the opening portion of the metal frame plate 25.

For a metal constituting the electrode structure 15, it is possible to use nickel, copper, gold, silver, palladium, iron or the like. Moreover, the electrode structure 15 may be wholly formed of a single metal, may be formed of an alloy containing two kinds of metals or more or may be formed by laminating two kinds of metals or more, and the surface electrode portion 16 and the short circuit portion 18 may be constituted by different metals from each other.

Moreover, a metal coated film having a chemical stability and a high conductivity, for example, gold, silver, palladium or the like may be formed on the surfaces of the surface electrode portion 16 and the back electrode portion 17 in the electrode structure 15 in order to prevent the electrode portion from being oxidized and to obtain an electrode portion having a small contact resistance.

In the electrode structure 15, as shown in FIG. 4, a ratio (R2/R1) of a diameter R2 in a tip to the diameter R1 of the base end of the surface electrode portion 16 is preferably 0.11 to 0.9 and is more preferably 0.15 to 0.6.

An arrangement pitch of the electrode structure 15 is equal to a pitch of an electrode to be inspected in a circuit device to be connected, and is preferably 40 to 160 μm, is more preferably 40 to 120 μm, and is particularly preferably 40 to 100 μm.

By satisfying such conditions, it is possible to reliably obtain a stable electrical connecting state for the circuit device even if the circuit device to be connected has a minute electrode having a small pitch of 120 μm or less or a minute electrode having a very small pitch of 100 μm or less.

Furthermore, the diameter R1 of the base end of the surface electrode portion 16 is preferably 30 to 70% of the pitch of the electrode structure 15 and is more preferably 35 to 60%.

In addition, as shown in FIG. 4, a ratio h1/R1 of a projection height h1 to the diameter R1 in the base end of the surface electrode portion 16 is preferably 0.2 to 0.8 and is more preferably 0.25 to 0.6.

By satisfying such conditions, it is possible to easily form the electrode structure 15 in a pattern corresponding to the pattern of the electrode and to obtain a stable electrical connecting state for the circuit device still more reliably even if the circuit device to be connected has a minute electrode having a small pitch of 120 μm or less or a minute electrode having a very small pitch of 100 μm or less.

The diameter R1 of the base end of the surface electrode portion 16 is set in consideration of the conditions described above and a diameter of an electrode to be connected, and is 30 to 80 μm, for example, and is more preferably 30 to 60 μm.

The projection height h1 of the surface electrode portion 16 is preferably 12 to 50 μm and is more preferably 15 to 30 μm in that a stable electrical connection to the electrode to be connected can be achieved.

Moreover, as shown in FIG. 4, it is sufficient that an outside diameter R5 of the back electrode portion 17 is larger than a diameter R4 on a back side of the insulating layer 18B in the short circuit portion 18 coupled to the back electrode portion 17 and is smaller than the pitch of the electrode structure 15, the outside diameter R5 is preferably as large as possible. Consequently, it is possible to reliably achieve a stable electrical connection to an anisotropically conductive sheet, for example.

Furthermore, a thickness d2 of the back electrode portion 17 is preferably 10 to 80 μm and is more preferably 12 to 60 μm in that a strength is sufficiently high and an excellent repetitive durability can be obtained.

In addition, a ratio R3/R4 of the diameter R3 on the surface side of the insulating layer 18B to the diameter R4 on the back side of the insulating layer 18B of the short circuit portion 18 is preferably 0.2 to 1 and is more preferably 0.3 to 0.9.

Moreover, the diameter R3 on the surface side of the insulating layer 18B of the short circuit portion 18 is preferably 10 to 50% of the pitch of the electrode structure 15 and is more preferably 15 to 45%.

Furthermore, a thickness d3 of the short circuit portion 18 is preferably 10 to 60 μm and is more preferably 15 to 40 μm.

Furthermore, a difference h2 between a thickness d3 of the short circuit portion 18 and a thickness d of the insulating layer 18B is 5 to 30 μm and is preferably 10 to 25 μm.

Furthermore, a diameter R6 of the holding portion 19 is preferably 30 to 70% of the pitch of the electrode structure 15 and is more preferably 40 to 60%.

In addition, a thickness d1 of the holding portion 19 is preferably 3 to 50 μm and is more preferably 4 to 40 μm.

In the sheet-like probe 10 according to the present invention, moreover, the metal frame plate 25 and the back electrode portion 17 may be constituted by different metal members from each other.

More specifically, as will be described below, the metal frame plate 25 is constituted by a metal material having a plurality of through holes 12 formed through punching, laser processing or the like, for example.

Figure 17:
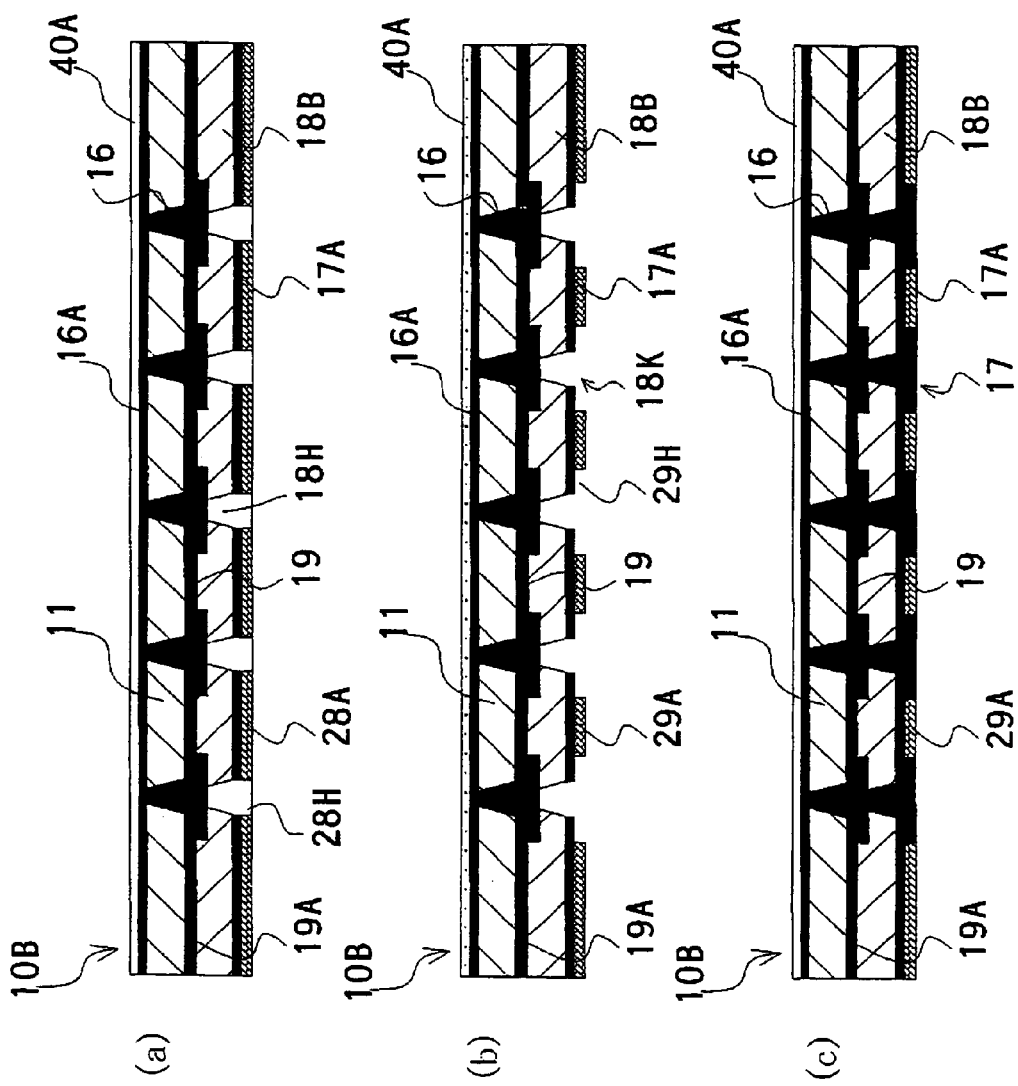
FIG. 17 is an explanatory sectional view showing the structure of the laminate material for manufacturing the sheet-like probe according to the present invention.

On the other hand, as will be described below, the back electrode portion 17 is constituted by a metal material formed as the back electrode portion 17 by carrying out an electrolytic plating treatment and filling a metal in a concave portion 18K for forming each short circuit portion and each pattern hole 29H of a resist film 29A as shown in FIGS. 17(b) and 17(c).

Thus, the metal frame plate 24 and the back electrode portion 17 are constituted by different metal members from each other. Therefore, the type and thickness of a metal for constituting of the metal frame plate 24 and the like have no restriction and it is possible to form the metal frame plate 24 by an optional metal type in an optional thickness in consideration of an elasticity for bending, an availability and the like, for example.

Furthermore, the back electrode portion 17 is constituted by the different metal member from the metal frame plate 24. Therefore, the back electrode portion 17 is not restricted to the metal to be the metal frame plate 24 but a preferable metal, for example, copper having an excellent electrical characteristic or the like can be used as the metal for constituting the back electrode portion 17.

In this case, a metal constituting a metal member for forming the metal frame plate 24 and a metal constituting a metal member for forming the back electrode portion 17 may be constituted by different types of metals.

In addition, the metal constituting the metal member for forming the metal frame plate 24 and the metal constituting the metal member for forming the back electrode portion 17 may be constituted by the same type of metals.

A plate ring-shaped support member 2 having a rigidity is provided in a peripheral edge portion of the sheet-like probe 10 as shown in FIG. 6. A material of the support member 2 includes a metal material having low thermal expansion, for example, an invar type alloy such as invar or super-invar, an elinvar type alloy such as elinvar, kovar, a 42-alloy or the like and a ceramics material such as alumina, silicon carbide or silicon nitride.

Moreover, a thickness of the support member 2 is preferably equal to or greater than 2 mm.

By setting the thickness of the ring-shaped support member 2 within this range, it is possible to further suppress a positional shift of an electrode structure from an electrode to be inspected by an influence of a difference in a coefficient of thermal expansion between the metal frame plate 25 and the ring-shaped support member 2, that is, a change in a temperature.

By supporting the sheet-like probe 10 with the rigidity of the support member 2, a hole formed on the support member 2 is engaged with a guide pin provided on a probe card which will be described below or the support member 2 and a peripheral step portion provided in a peripheral edge portion of the probe card are fitted each other in the probe card, for example. Consequently, it is possible to easily align the electrode structure 15 provided in the contact film 9 of the sheet-like probe 10 with an electrode to be inspected in an object to be inspected or a conducting portion of an anisotropically conducive connector. Furthermore, it is possible to reliably prevent sticking to the object to be inspected and a positional shift from a predetermined position of the electrode structure 15 also in case of repetitive use in an inspection.

Figure 5:
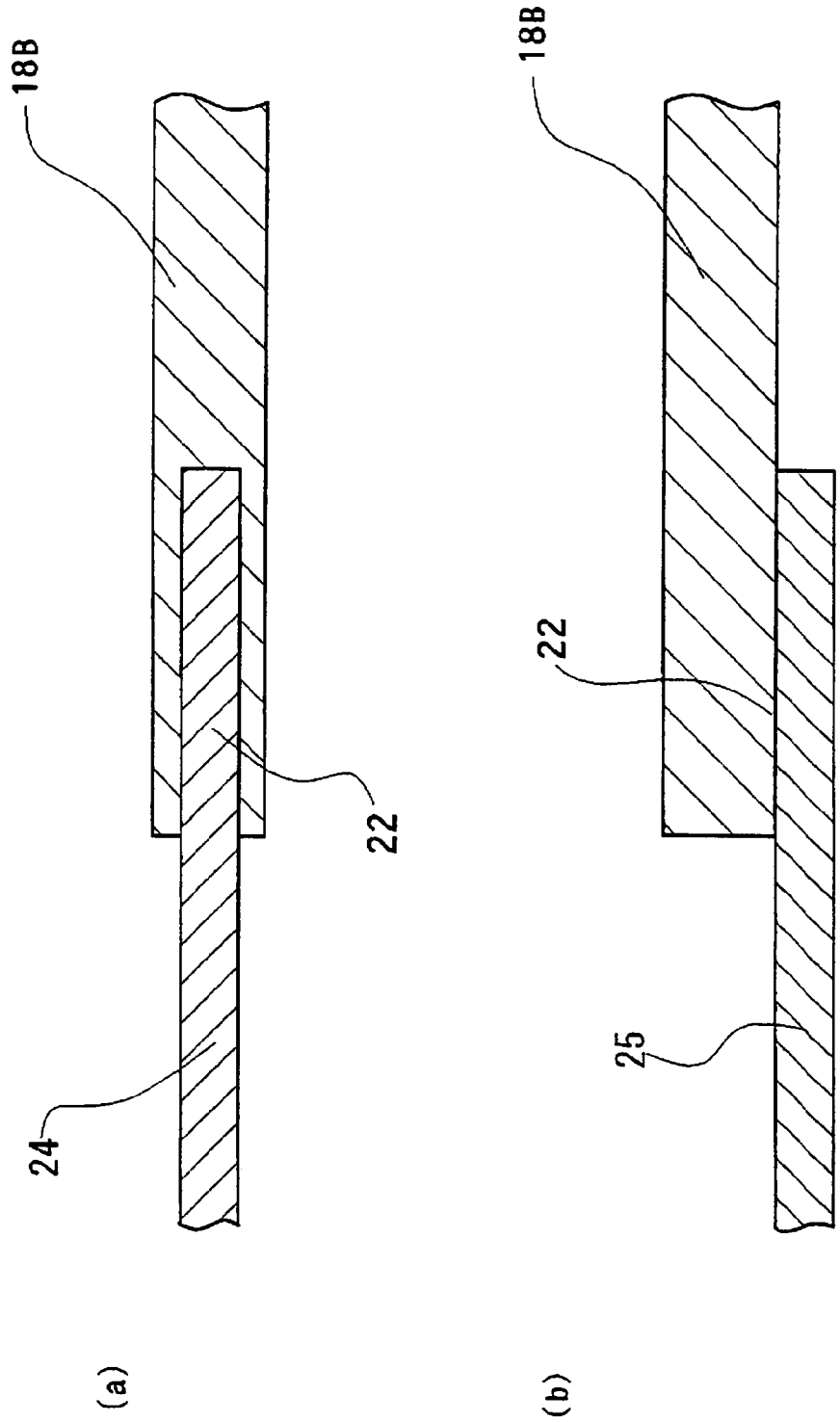
FIG. 5(a) is a sectional view showing a support portion of the contact film in the sheet-like probe according to the present invention and FIG. 5(b) is a sectional view showing a support portion of the contact film in the sheet-like probe according to the present invention.

Moreover, the sheet-like probe 10 according to the present invention can also employ a structure in which the metal frame plate 24 is provided (interposed) in the insulating layer 18B as shown in FIGS. 5(a) and 6(b) in addition to a structure in which the insulating layer 18B is supported by the metal frame plate 25 as shown in FIG. 5(b).

In such a sheet-like probe 10 shown in FIGS. 5(a) and 6(b), the soft contact films 9 holding the electrode structures 15 in respective opening portions of the contact films may be disposed independently of each other (FIG. 12(a)) or partially independently of each other (FIG. 12(b)).

In the following, the sheet-like probe 10 according to the present invention that employs a structure in which the insulating layer 18B is supported by the metal frame plate 25 as shown in FIG. 5(b) is described based on FIGS. 7 to 9.

Figure 12:
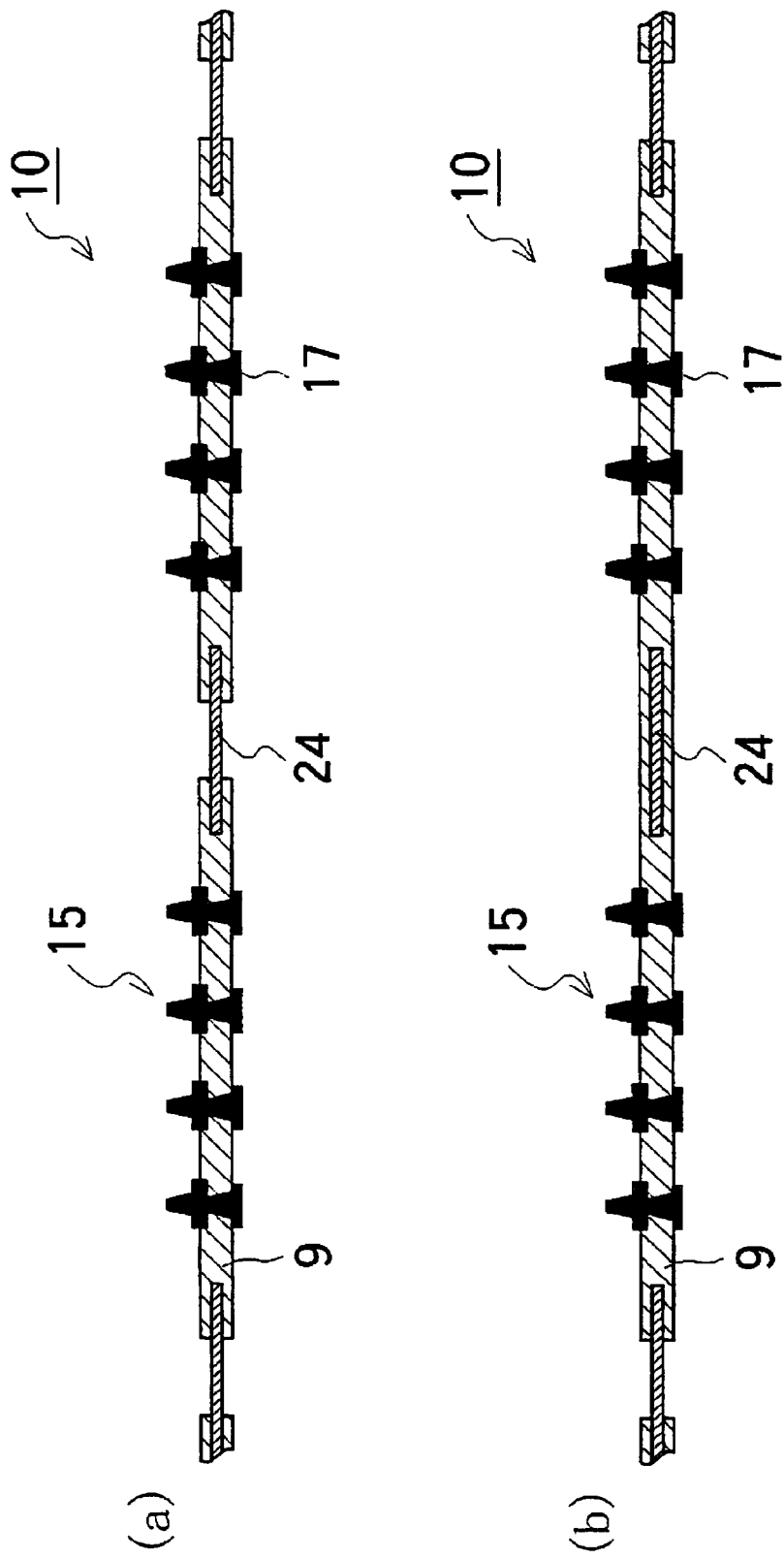
FIG. 12 is a sectional view showing a further embodiment of the sheet-like probe according to the present invention.

A method of manufacturing the sheet-like probe 10 according to the present invention shown in FIGS. 9 and 12 will be described below in detail and there is employed a basically identical structure except for a difference in a configuration for supporting the insulating layer 18B by the metal frame plate.

The sheet-like probe 10 has the metal frame plate 25 having a through hole formed in each position corresponding to each integrated circuit over a wafer to be an object to be an inspected, and the contact film 9 is disposed in the through hole.

The contact film 9 is supported on the metal frame plate 25 through the support portion 22 in the peripheral portion of the through hole of the metal frame plate 25.

As a supporting method of the contact film 9 with the metal frame plate 25, in addition to a structure in which the support portion 22 is formed in such a manner that the support portion 22 comes into contact with the metal frame plate 25 on one face of the contact film 9 as shown in FIG. 5(b), the support portion 22 can be supported with the metal frame plate 24 interposed by the insulating layer 18B formed of a resin as shown in FIGS. 5(a) and 6(b).

In such a sheet-like probe 10, the soft contact films 9 holding the electrode structures 15 in respective opening portions of the contact films may be disposed independently of each other (FIG. 11(a)) or partially independently of each other (FIG. 11(b)).

In such a sheet-like probe 10, as shown in FIG. 6(b), the metal frame plate 24 is bonded and fixed to the support member 2 through an adhesive 8.

A material of the ring-shaped support member 2 includes a metal material having low thermal expansion, for example, an invar type alloy such as invar or super-invar, an elinvar type alloy such as elinvar, kovar, a 42-alloy or the like and a ceramics material such as alumina, silicon carbide or silicon nitride.

By supporting the sheet-like probe 10 with the rigidity of the support member 2, a hole formed on the frame plate is engaged with a guide pin provided on a probe card which will be described below or the support member 2 and a peripheral step portion provided in a peripheral edge portion of the probe card are fitted each other in the probe card, for example. Consequently, it is possible to easily align the electrode structure 15 provided in the contact film 9 of the sheet-like probe 10 with an electrode to be inspected in an object to be inspected or a conducting portion of an anisotropically conducive connector.

Also in case of repetitive use in an inspection, furthermore, it is possible to reliably prevent sticking to the object to be inspected and a positional shift from a predetermined position of the electrode structure 15.

According to such a sheet-like probe 10, the electrode structure 15 is provided with the holding portion 19 extended outward along the surface of the insulating layer 18B continuously from the base end portion of the surface electrode portion 16. Even if the surface electrode portion 16 has a small diameter, therefore, the holding portion 19 is maintained to be supported on the surface of the insulating layer 18B. Consequently, the electrode structure 15 can be prevented from slipping from a back face of the insulating layer 18B so that a high durability can be obtained.

Moreover, the surface electrode portion 16 having a small diameter is provided. Therefore, a distance between the adjacent surface electrode portions 16 is maintained sufficiently. Consequently, the flexibility of the insulating layer can be exhibited fully since a thickness of the insulating layer 18B is small. As a result, it is also possible to reliably achieve a stable electrical connecting state for a circuit device in which an electrode is formed at a small pitch.

Method of Manufacturing Sheet-Like Probe of the First Embodiment

A method of manufacturing the sheet-like probe 10 of the first embodiment will be described below.

Figure 14:
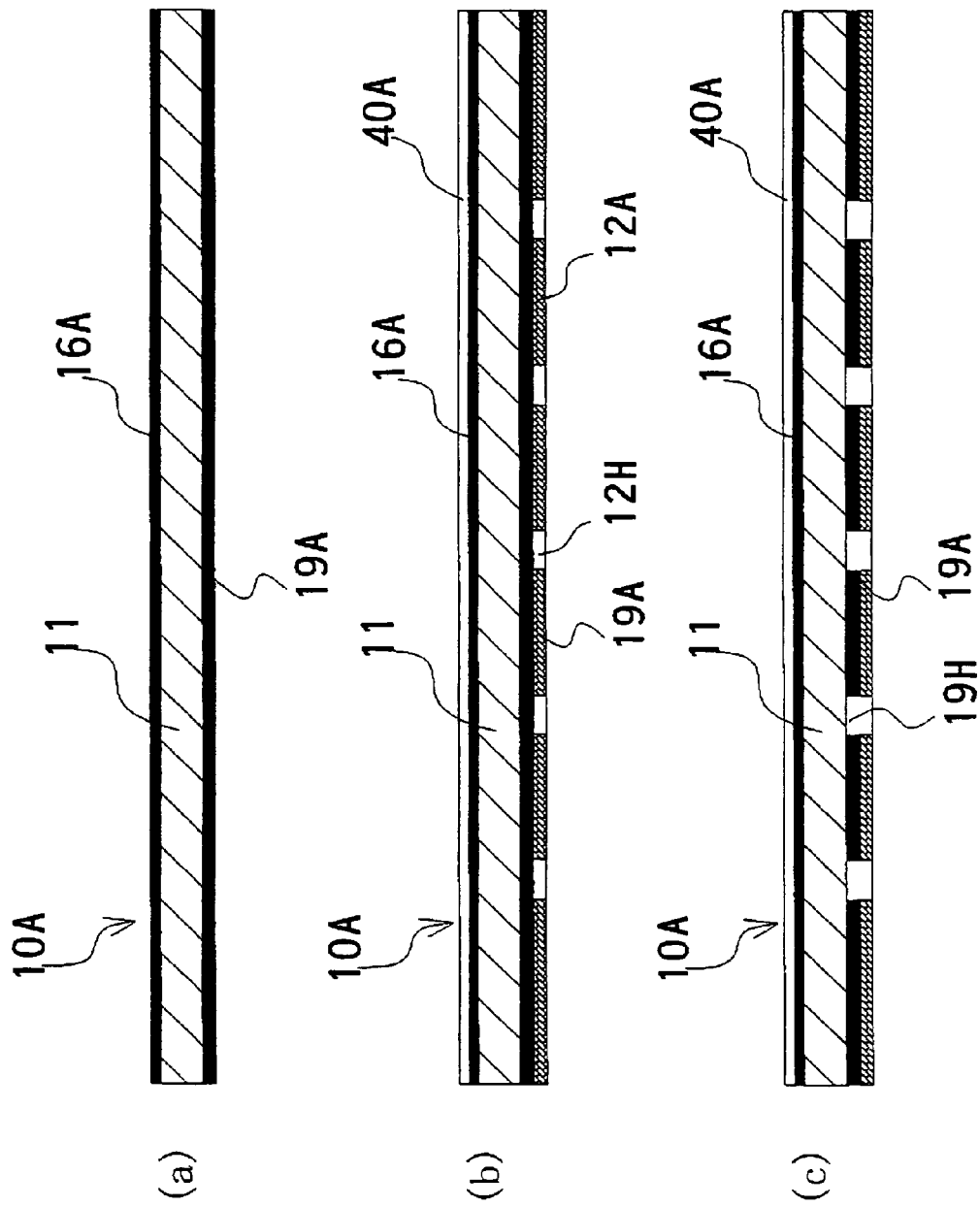
FIG. 14 is an explanatory sectional view showing a structure of a laminate material for manufacturing the sheet-like probe according to the present invention.

Referring to the method of manufacturing the sheet-like probe 10 having such a structure that the insulating layer 18B is supported on the metal frame plate 25, as shown in FIG. 14(a), first of all, there is prepared the laminate material 10A constituted by an insulating sheet 11, a surface side metal layer 16A formed on a surface of the insulating sheet 11 and a first back side metal layer 19A formed on a back face of the insulating sheet 11.

As for the insulating sheet 11, a total of a thickness of the insulating sheet 11 and that of the first back side metal layer 19A is assumed to be equivalent to a projection height of the surface electrode portion 16 in the electrode structure 15 to be formed.

Moreover, as for a material for constituting the insulating sheet 11 which has an insulating property and is flexible is not particularly restricted and it is possible to use a resin sheet formed by a polyimide resin, a liquid crystal polymer, polyester, a fluorine type resin or the like, a sheet obtained by impregnating a fiber woven cloth with the resin and the like, for example. A material which can be etched is preferable and polyimide is particularly preferable in that a through hole for forming the surface electrode portion 16 can easily be formed by etching.

If the insulating sheet 11 is flexible, moreover, a thickness of the insulating sheet 11 is not particularly restricted but is preferably 10 to 50 μm and is more preferably 10 to 25 μm.

For such a laminate material 10A, it is possible to use a laminated polyimide sheet obtained by laminating a metal layer formed of copper on both sides which has generally been put on the market, for example.

For the laminate material 10A, as shown in FIG. 14(b), a protective film 40A is laminated over a whole surface of the surface side metal layer 16A, and furthermore, a resist film 12A for etching, which has a plurality of pattern holes 12H formed in accordance with a pattern corresponding to a pattern of the electrode structure 15 to be formed, is provided on a surface of the first back side metal layer 19A.

For a material for forming the resist film 12A, it is possible to use various materials to be utilized as a photoresist for etching.

For the first back side metal layer 19A, subsequently, an etching treatment is carried out over a portion exposed through the pattern hole 12H of the resist film 12A and the portion is then removed. As shown in FIG. 14(c), consequently, a plurality of pattern holes 19H communicating with the pattern holes 12H of the resist film 12A is formed on the first back side metal layer 19A, respectively.

For the insulating sheet 11, then, the etching treatment is carried out over a portion exposed through each of the pattern holes 12H of the resist film 12A and each of the pattern holes 19H of the first back side metal layer 19A and the exposed portion is thus removed. As shown in FIG. 15(a), consequently, the insulating sheet 11 is provided with a plurality of through holes 11H which communicates with the pattern holes 19H of the first back side metal layer 19A and is tapered to have smaller diameters from a back face of the insulating sheet 11 toward a surface thereof, respectively.

Consequently, a back face of the laminate material 10A is provided with a plurality of concave portions 10K for forming a surface electrode portion with which the pattern holes 19H of the first back side metal layer 19A and the through holes 11H of the insulating sheet 11 communicate, respectively.

In the foregoing, an etchant for carrying out the etching treatment over the first back side metal layer 19A is properly selected corresponding to a material for forming these metal layers. In the case in which these metal layers are formed of copper, for example, it is possible to use an iron(III) chloride solution.

Moreover, it is possible to use an amine type etchant, a hydrazine type solution, a potassium hydroxide solution and the like as an etchant for carrying out the etching treatment over the insulating sheet 11. By selecting etching treatment conditions, it is possible to form, on the insulating sheet 11, the tapered through hole 11H having a smaller diameter from a back face toward a surface.

Figure 15:
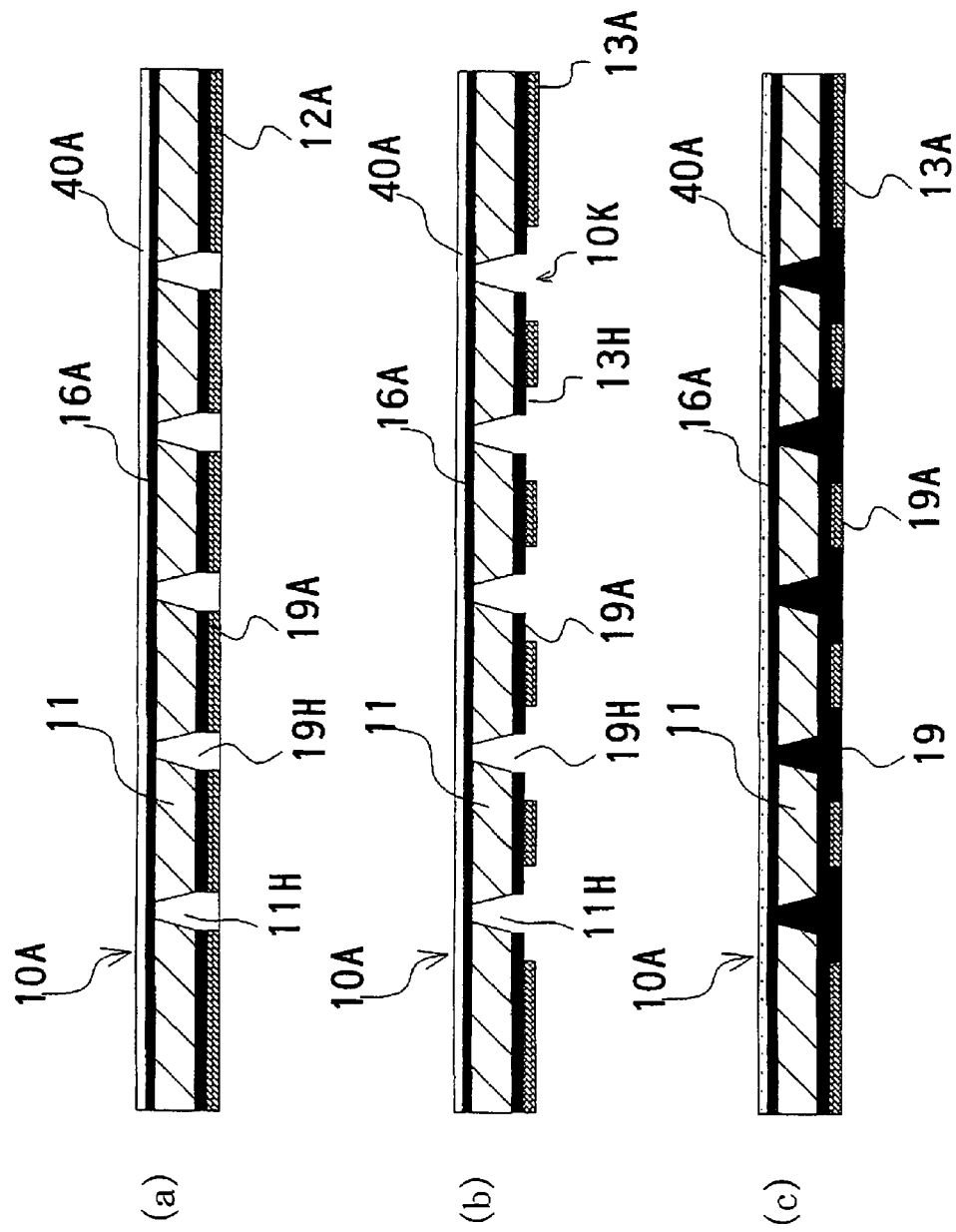
FIG. 15 is an explanatory sectional view showing the structure of the laminate material for manufacturing the sheet-like probe according to the present invention.

Thus, the resist film 12A is removed from the laminate material 10A provided with the concave portion 10K for forming a surface electrode portion. Then, a resist film 13A for plating, which is provided with a plurality of pattern holes 13H in accordance with a pattern corresponding to a pattern of the holding portion 19 in the electrode structure 15 to be formed, is provided on the surface of the first back side metal layer 19A in the laminate material 10A as shown in FIG. 15(*b*).

While various materials utilized as a photoresist for plating can be used as a material forming the resist film 13A, a photosensitive dry film resist is preferable.

Subsequently, an electrolytic plating treatment is carried out over the laminate material 10A by using the surface side metal layer 16A as an electrode, and a metal is filled in each of the concave portions 10K for forming a surface electrode portion and each of the pattern holes 13H of the resist film 13A. As shown in FIG. 15(*c*), consequently, there are formed the surface electrode portions 16 and the holding portions 19 linked to a base end of each of the surface electrode portions 16 and extended outward along the back face of the insulating sheet 11. The holding portions 19 are maintained to be coupled to each other through the first back side metal layer 19A.

Thereafter, the resist film 13A is peeled.

Figure 16:
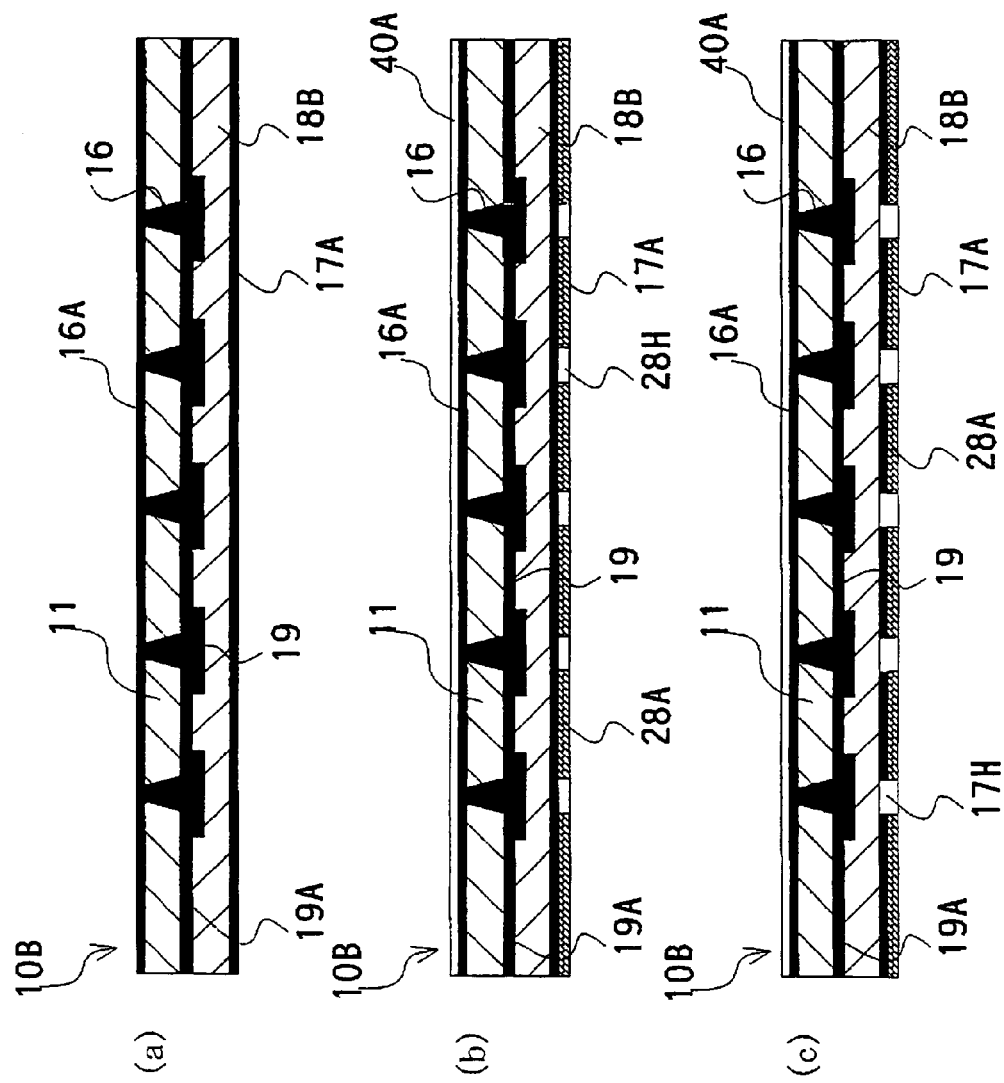
FIG. 16 is an explanatory sectional view showing the structure of the laminate material for manufacturing the sheet-like probe according to the present invention.

In the laminate material 10A which is thus provided with the surface electrode portion 16 and the holding portion 19, the insulating layer 18B is formed in order to cover the first back side metal layer 19A and the holding portion 19 and a second back side metal layer 17A is formed on the surface of the insulating layer 18B so that a laminate material 10B is obtained as shown in FIG. 16(*a*).

The insulating layer 18B is constituted by a plurality of resin layers with different etching speeds in a direction of a thickness.

For a material constituting the insulating layer 18B, moreover, a polymer material which can be etched is used preferably and polyimide is used more preferably.

It is possible to use, for the polyimide, (1) a photosensitive polyimide solution, a polyimide precursor solution, and liquid polyimide or varnish obtained by diluting a polyimide precursor or low-molecular polyimide with a solvent, (2) thermoplastic polyimide, (3) a polyimide film (for example, trade name of "KAPTON" manufactured by DUPONT-TORAY CO., LTD.), and the like.

Since the photosensitive polyimide solution, the polyimide precursor solution and the liquid polyimide or varnish obtained by diluting a polyimide precursor or low molecular polyimide with a solvent in the above-mentioned (1) have a low viscosity, particularly, they can be applied in a solution and are cured (polymerized) after the application. Consequently, a volume is reduced by the evaporation or polymerization of the solvent.

In the case in which the photosensitive polyimide solution, the polyimide precursor solution and the liquid polyimide or varnish obtained by diluting the polyimide precursor or the low-molecular polyimide with the solvent in the above-mentioned (1) are used, it is preferable to apply them onto the laminate material 10A and to cure them, thereby forming the insulating layer 18B.

For the thermoplastic polyimide in the above-mentioned (2), moreover, it is possible to employ:

a method of dissolving the thermoplastic polyimide in a solvent to prepare a polyimide solution, applying the polyimide solution to the laminate material 10A and then evaporating the solvent to form the insulating layer 18B; or a method of laminating a thermoplastic polyimide film on the laminate material 10A and integrating the thermoplastic polyimide film with the laminate material 10A by heating and pressing, thereby forming the insulating layer 18B.

Furthermore, the polyimide film in the above-mentioned (3) is dissolved by neither a heat nor a solvent and is thus stable. In the case in which such a polyimide film is used, it is possible to form the insulating layer 18B by:

a method of laminating the polyimide film in the above-mentioned (3) on the laminate material 10A through the thermoplastic polyimide film and integrating them by heating and pressing;

a method of forming a polyimide layer in a semicuring state on the surface of the polyimide film in the above-mentioned (3) through the photosensitive polyimide solution, the polyimide precursor solution, or the liquid polyimide or varnish obtained by diluting the polyimide precursor or the low-molecular polyimide with the solvent and then laminating the same polyimide layer on the laminate material 10A and curing and integrating them, or the like.

A polyimide layer formed by curing the photosensitive polyimide solution, the polyimide precursor solution, or the liquid polyimide or varnish obtained by diluting a polyimide precursor or low molecular polyimide with a solvent in the above-mentioned (1), a polyimide layer formed of the thermoplastic polyimide in the above-mentioned (2), and the polyimide film in the above-mentioned (3) have a different etching speed.

In general, an etching speed of the polyimide film is lower than that of the polyimide layer formed by curing the above polyimide.

Figure 10:
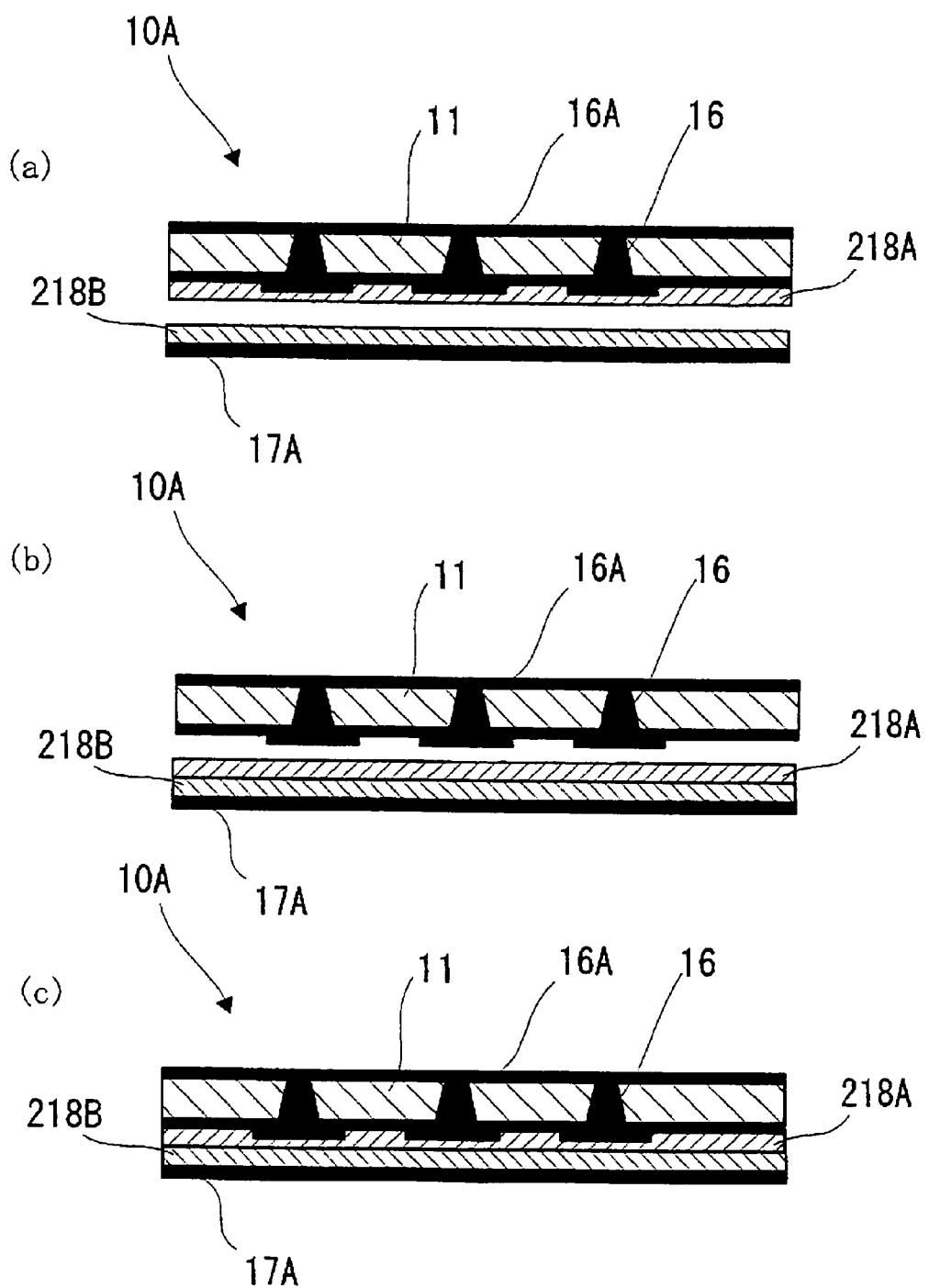
FIG. 10 is a partially enlarged sectional view showing a manufacturing method of the first embodiment of the sheet-like probe according to the present invention.

As shown in FIG. 10(*a*) or 10(*b*), for instance, an insulating layer 18B is configured by laminating and integrating a polyimide film 218B on a laminate material 10A through a polyimide layer 218A formed by curing the photosensitive polyimide solution, the polyimide precursor solution, or the liquid polyimide or varnish obtained by diluting a polyimide precursor or low molecular polyimide with a solvent in the above-mentioned (1), or a polyimide layer 218A formed of the thermoplastic polyimide in the above-mentioned (2).

By the above configuration, the insulating layer 18B has a structure in which resin layers having different etching speeds are laminated in a direction of a thickness thereof.

More specifically, as shown in FIG. 10(*a*), the polyimide layer 218A is formed in such a manner that the first back side metal layer 19A and the holding portion 19 are covered, the polyimide film 218B is formed on the side of the second back side metal layer 17A, and the polyimide film 218B is laminated and integrated on the laminate material 10A through the polyimide layer 218A, thereby forming the insulating layer 18B.

On the other hand, as shown in FIG. 10(b), the polyimide film 218B and the polyimide layer 218A are formed on the side of the second back side metal layer 17A, and the polyimide film 218B is laminated and integrated on the laminate material 10A through the polyimide layer 218A in such a manner that the first back side metal layer 19A and the holding portion 19 are covered, thereby forming the insulating layer 18B.

Here, the insulating layer 18B can have a structure in which resin layers having different etching speeds are laminated in a direction of a thickness thereof by forming a plurality of polyimide layers 218A with different kinds using some types of polyimide to be coated and cured on the laminate material 10A and then by laminating the polyimide film 218B (see FIG. 10(a)).

Moreover, a laminated polyimide sheet having either side on which a metal layer formed of a 42-alloy is laminated is provided on the laminate material 10A through a polyimide layer 218A so that the insulating layer 18B and the second back side metal layer 17A can also be formed, for example (see FIG. 10(b)).

In such a case, the second back side metal layer 17A has a thickness which is equal to a thickness of the metal frame plate 25 to be formed.

For the laminate material 10B, then, a resist film 28A for etching, which has a plurality of pattern holes 28H formed in accordance with a pattern corresponding to the pattern of the electrode structure 15 to be formed, is provided on the surface of the second back side metal layer 17A as shown in FIG. 16(b).

For a material to form the resist film 28A, it is possible to use various materials to be utilized as a photoresist for etching.

For the second back side metal layer 17A, subsequently, an etching treatment is carried out over a portion exposed through the pattern hole 28H of the resist film 28A and the exposed portion is thus removed. As shown in FIG. 16(c), consequently, a plurality of pattern holes 17H communicating with the pattern holes 28H of the resist film 28A is formed on the second back side metal layer 17A, respectively.

For the insulating layer 18B, thereafter, the etching treatment is carried out over a portion exposed through each of the pattern holes 28H of the resist film 28A and each of the through holes 17H of the second back side metal layer 17A and the exposed portion is thus removed. As shown in FIG. 17(a), consequently, the insulating layer 18B is provided with a plurality of tapered through holes 18H which communicates with the pattern holes 19H of the first back side metal layer 19A and has smaller diameters from a back face of the insulating layer 18B toward a surface thereof respectively, and has a bottom face from which the surface electrode portion 16 is exposed.

Consequently, the back face of the laminate material 10B is provided with a plurality of concave portions 18K for forming a short circuit portion with which the pattern holes 17H of the second back side metal layer 17A and the through holes 18H of the insulating layer 18B communicate, respectively.

In the foregoing, an etching agent for carrying out the etching treatment over the second back side metal layer 17A is properly selected depending on materials for constituting these metal layers.

As an etchant for carrying out the etching treatment over the insulating layer 18B, it is possible to use the etchant utilized for etching the insulating sheet 11.

The resist film 28A is removed from the laminate material 10B thus provided with the concave portion 18K for forming a short circuit portion. Thereafter, the resist film 29A for plating, which is provided with a plurality of pattern holes 29H in accordance with a pattern corresponding to the pattern of the back electrode portion 17 in the electrode structure 15 to be formed, is then provided on the surface of the second back side metal layer 17A in the laminate material 10B as shown in FIG. 17(b).

While various materials utilized as a photoresist for plating can be used as a material forming the resist film 29A, a dry film resist is preferable.

Subsequently, an electrolytic plating treatment is carried out over the laminate material 10B by using the surface side metal layer 16A as an electrode, and a metal is filled in each of the concave portions 18K for forming a short circuit portion and each of the pattern holes 29H of the resist film 29A.

As shown in FIG. 17(c), consequently, there are formed the short circuit portions 18 linked to the base ends of the surface electrode portions 16 and extended to penetrate in a direction of a thickness thereof, and the back electrode portion 17 coupled to the back sides of the insulating layers 18B in the short circuit portions 18.

The back electrode portions 17 are coupled to each other through a second back side metal layer 17A.

Figure 18:
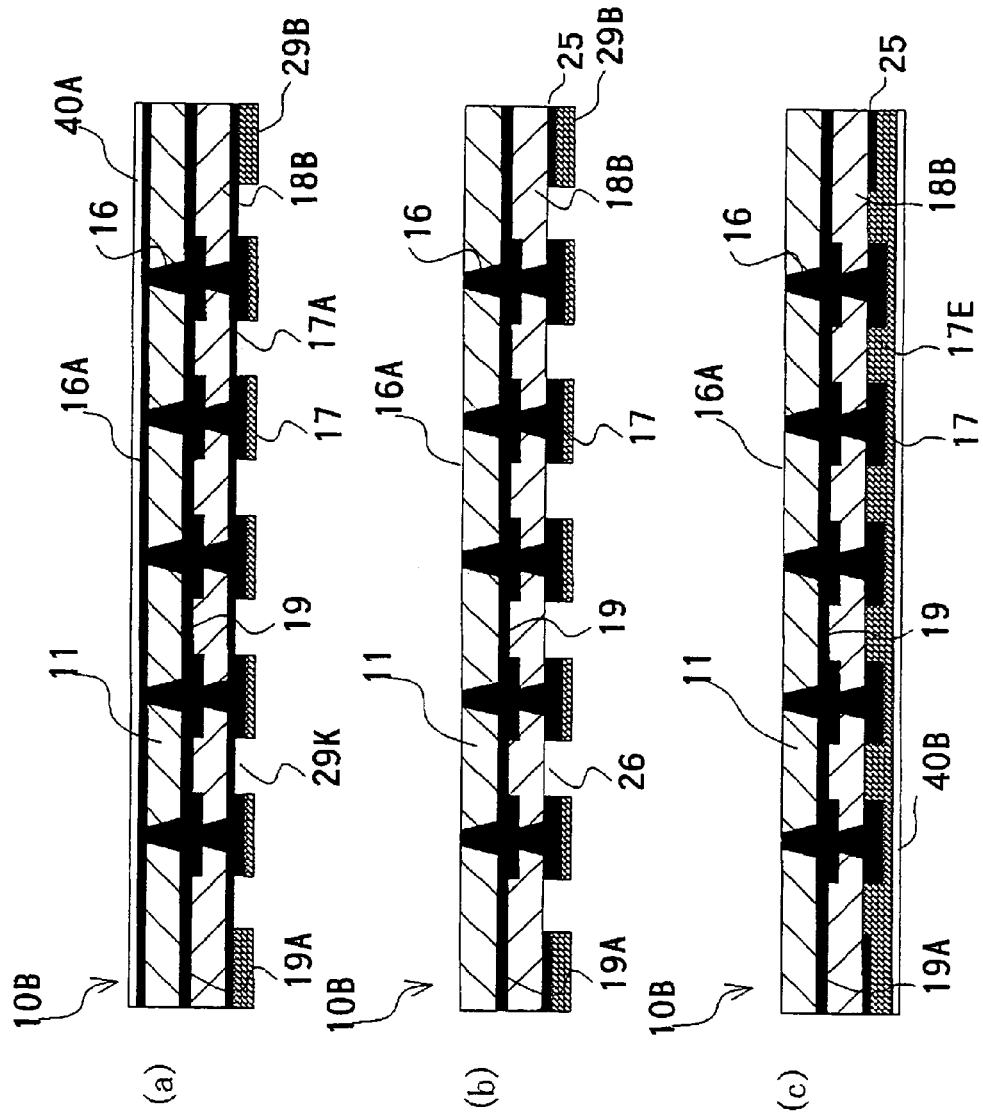
FIG. 18 is an explanatory sectional view showing the structure of the laminate material for manufacturing the sheet-like probe according to the present invention.

The resist film 29A is removed from the laminate material 10B in which the surface electrode portion 16, the holding portion 19, the short circuit portion 18 and the back electrode portion 17 are thus formed. As shown in FIG. 18(a), then, there is formed a patterned resist film 29B for etching which covers portions of the back electrode portion 17 and the second back side metal layer 17A to be the metal frame plate 25 and has a pattern hole 29K in accordance with a pattern corresponding to the portion of the second back side metal layer 17A to be removed.

For a material forming the resist film 29B, it is possible to use various materials utilized as a photoresist for etching.

Thereafter, the protective film 40A provided on the surface side metal layer 16A is removed and an etching treatment is carried out over the surface side metal layer 16A and the second back side metal layer 17A.

Therefore, the surface side metal layer 16A is removed, and a portion in the second back side metal layer 17A which is exposed through the pattern hole 29K is removed to form an opening portion 26 as shown in FIG. 18(b). Consequently, a plurality of back electrode portions 17 separated from each other and the metal frame plate 25 are formed.

As shown in FIG. 18(c), furthermore, the resist film 29B for etching which is provided on a back side is removed and a resist film 17E is then formed in order to cover the back electrode portion 17, the metal frame plate 25 and the opening portion 26.

For a material forming the resist film 17E, it is possible to use various materials utilized as a photoresist for etching.

Thereafter, a protective film 40B is laminated over a whole surface of the resist film 17E.

Figure 19:
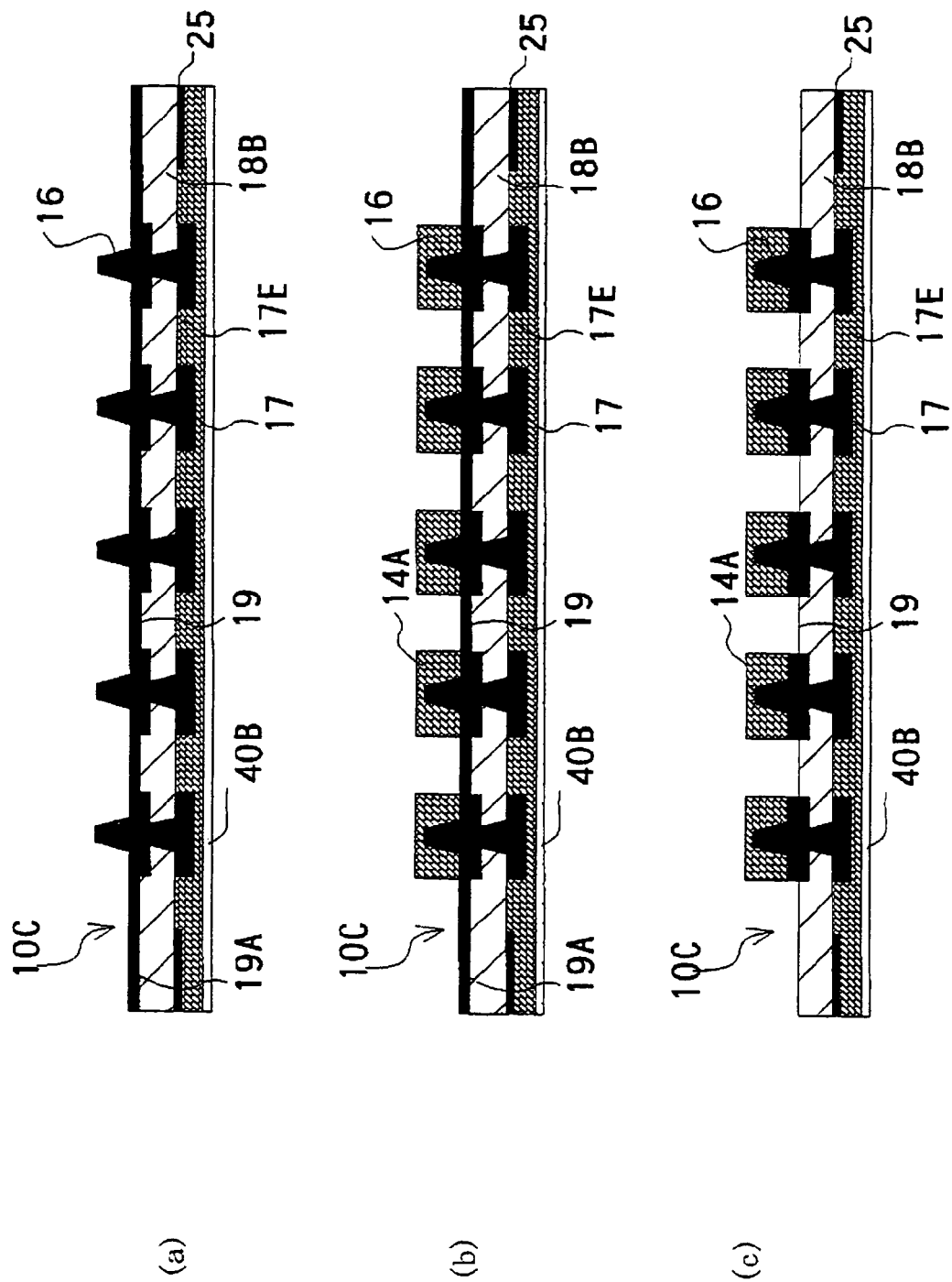
FIG. 19 is an explanatory sectional view showing the structure of the laminate material for manufacturing the sheet-like probe according to the present invention.

Next, the insulating sheet 11 is subjected to the etching treatment and a whole portion thereof is thus removed. Consequently, there is obtained a laminate material 10C from which the surface electrode portion 16 and the first back side metal layer 19A are exposed as shown in FIG. 19(a). As shown in FIG. 19(b), then, a patterned resist film 14A for etching is formed in order to cover the surface electrode portion 16 and a portion to be the holding portion 19 in the first back side metal layer 19A.

Subsequently, a portion exposed after carrying out the etching treatment over the first back side metal layer 19A is removed so that the holding portion 19 is formed to be extended radially outward along the surface of the insulating layer 18B continuously from the peripheral surface of the base end portion of the surface electrode portion 16 as shown in FIG. 19(c). Consequently, the electrode structure 15 is formed.

Figure 13:
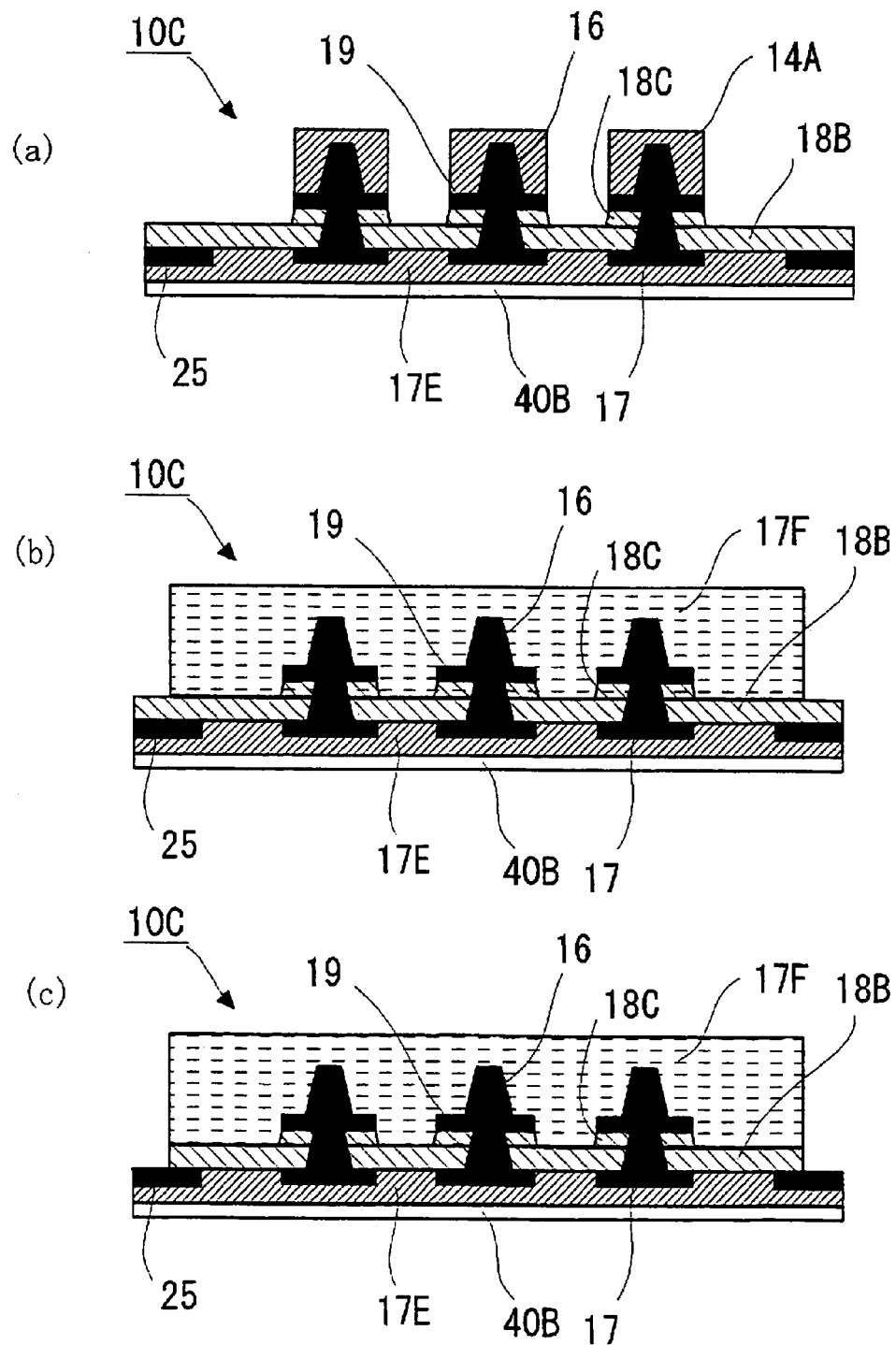
FIG. 13 is a partially enlarged sectional view showing a manufacturing method of the first embodiment of the sheet-like probe according to the present invention.

As shown in FIG. 13(a), an etching treatment is then carried out to the insulating layer 18B and the surface side portion of the insulating layer 18B is removed, thereby decreasing a thickness of the insulating layer.

In such a case, the removal is performed by carrying out an etching treatment to the surface side portion of the insulating layer 18B while utilizing a difference in etching speeds of the resin layers that configure the insulating layer.

For instance, the surface side portion of the insulating layer 18B is formed of the polyimide layer 218A formed by curing the photosensitive polyimide solution, the polyimide precursor solution, or the liquid polyimide or varnish obtained by diluting a polyimide precursor or low molecular polyimide with a solvent in the above-mentioned (1), or the polyimide layer 218A formed of the thermoplastic polyimide in the above-mentioned (2), and the back side portion of the insulating layer 18B is formed of the polyimide film 218B in the above-mentioned (3).

By the above configuration, since an etching speed of the surface side portion of the insulating layer 18B is higher than that of the polyimide film of the back side portion of the insulating layer 18B, the surface layer portion formed of the polyimide layer 218A can be easily removed from the insulating layer 18B by an etching.

In the example shown in FIG. 13(a), a polyimide layer 18C remains between the insulating layer 18B and the holding portion 19 of the electrode structure 15. However, it is not always necessary to leave the polyimide layer 18C, but the polyimide layer 18C between the holding portion 19 and the insulating layer 18B can be removed.

As shown in FIG. 13(b), then, the resist film 14A is removed and a resist film 17F is formed on an upper surface of the laminate material 10C in order to expose a part of the metal frame plate 25. In this state, the insulating layer 18B is subjected to an etching treatment so that a part of the metal frame plate 25 is exposed as shown in FIG. 13(c).

Thereafter, the resist film 17F is removed from the surface of the insulating layer 18B, and the protective film 40B and the resist film 17E are removed from the back face of the insulating layer 18B and the back electrode portion 17 so that the sheet-like probe 10 shown in FIG. 3 is obtained.

Sheet-Like Probe of the Second Embodiment

The sheet-like probe 10 of a second embodiment according to of the present invention will be described below in detail.

Figure 7:
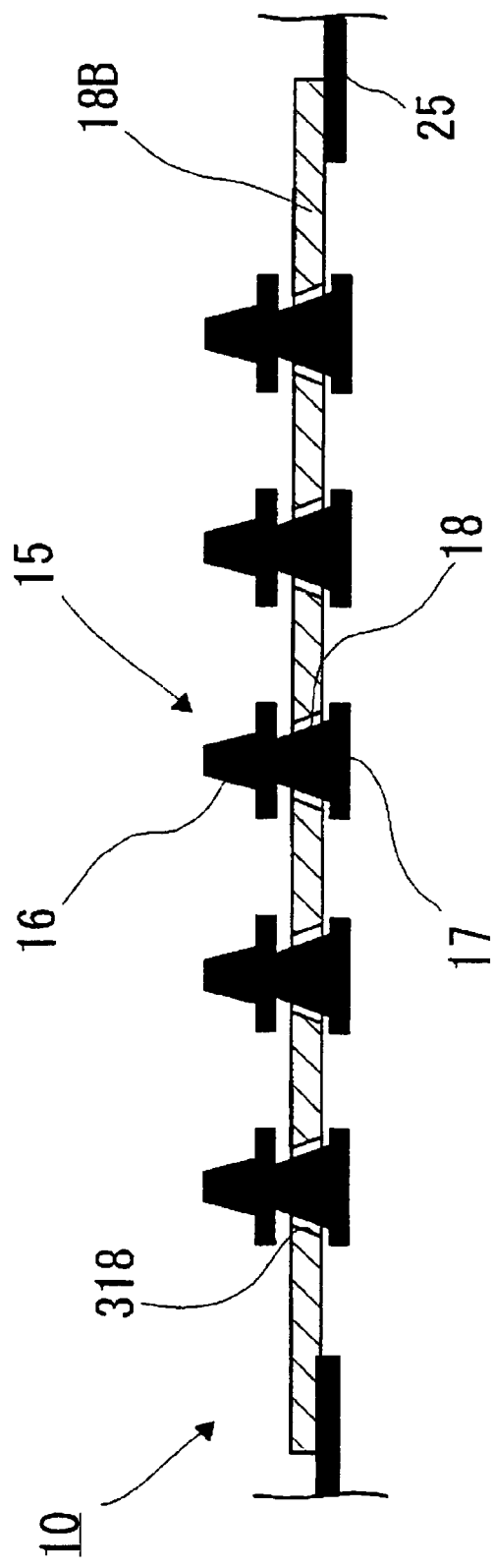
FIG. 7 is an explanatory sectional view showing a sheet-like probe of a second embodiment according to the present invention.
Figure 8:
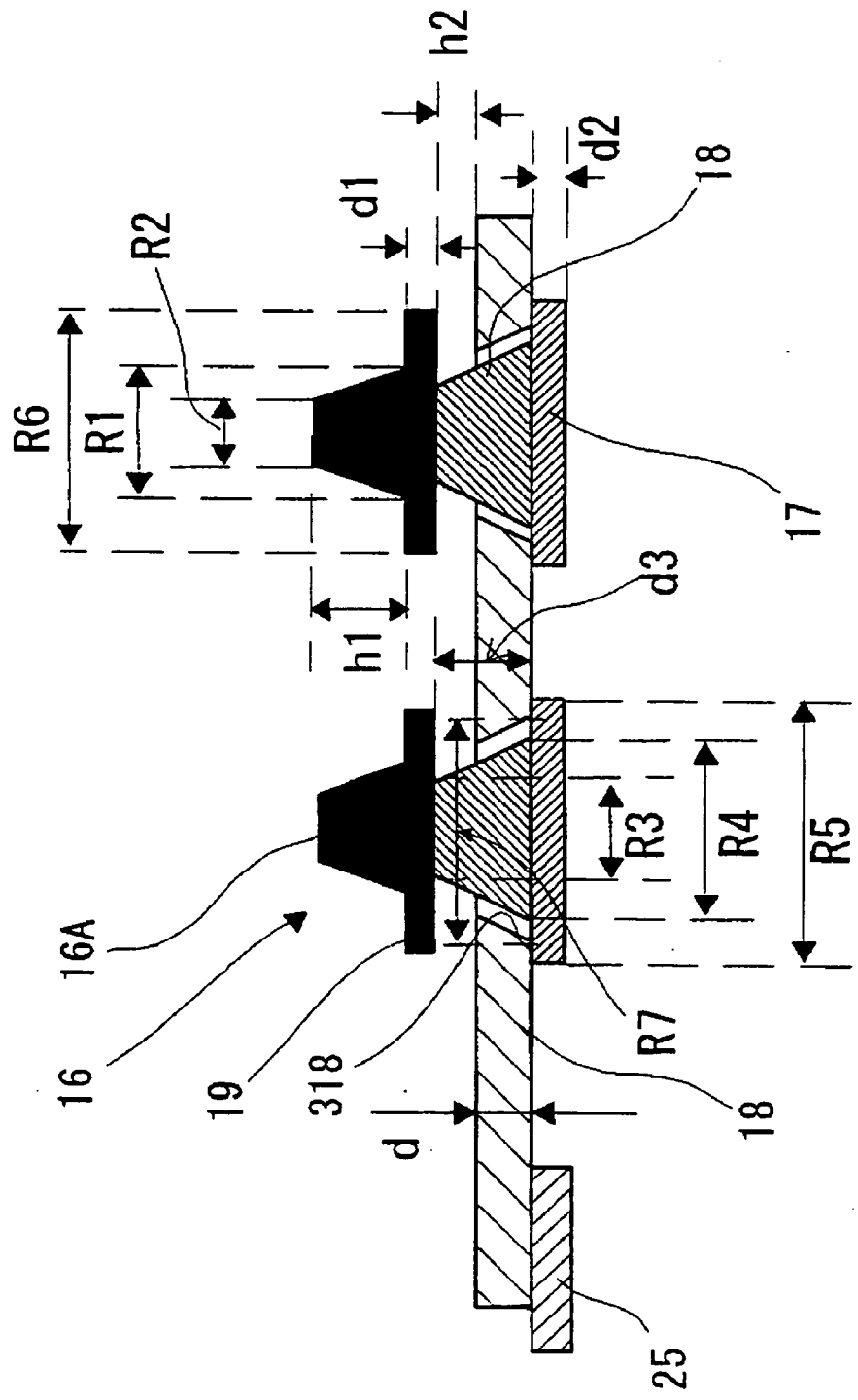
FIG. 8 is an explanatory sectional view showing an enlarged electrode structure in the sheet-like probe of the second embodiment according to the present invention.
Figure 9:
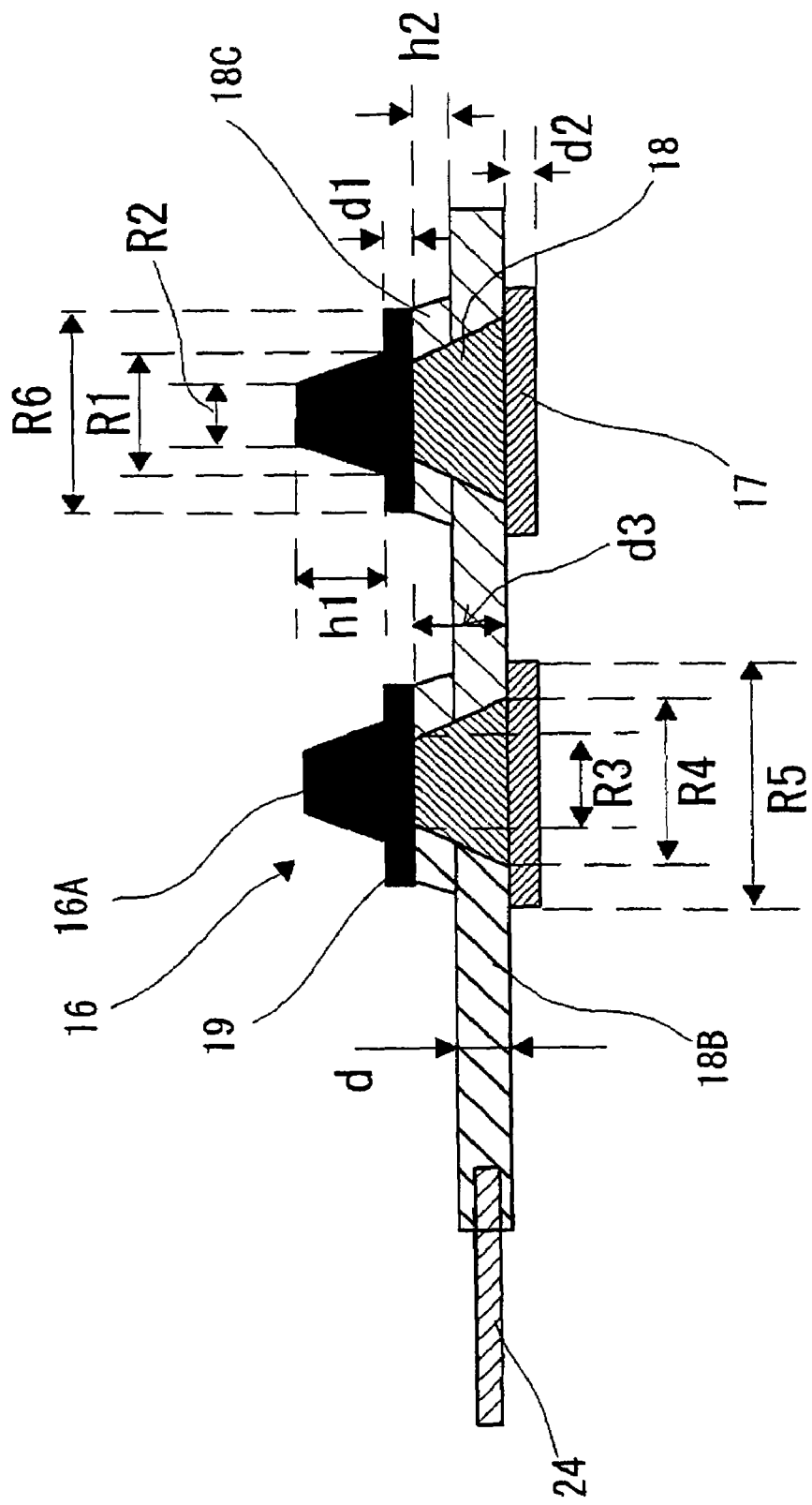
FIG. 9 is an explanatory sectional view showing an enlarged electrode structure in the sheet-like probe of the first embodiment according to the present invention.

FIG. 7 is an explanatory sectional view showing a structure of a sheet-like probe related to a second embodiment according to the present invention, and FIG. 8 is an explanatory sectional view showing an enlarged electrode structure in the sheet-like probe related to a second embodiment according to the present invention.

As shown in FIG. 7, each of the electrode structures 15 is provided with a projected surface electrode portion 16 which is exposed from a surface of the insulating layer 18B and projected from the surface of the insulating layer 18B. The electrode structure 15 is also provided with a rectangular plate-shaped back electrode portion 17 exposed from a back face of the insulating layer 18B. The electrode structure 15 is also provided with a short circuit portion 18 extended to penetrate in the direction of the thickness of the insulating layer 18B continuously from a base end of the surface electrode portion 16 and coupled to the back electrode portion 17. The electrode structure 15 is also provided with a circular ring plate-shaped holding portion 19 which is radially extended outward along the surface of the insulating layer 18B continuously from a peripheral surface of the base end portion of the surface electrode portion 16.

In the electrode structure 15 according to this second embodiment, the surface electrode portion 16 is linked to the short circuit portion 18 and is tapered to have a smaller diameter from the base end toward a tip, and is thus formed wholly like a truncated cone. Furthermore, the short circuit portion 18 linked to the base end of the surface electrode portion 16 is tapered to have a smaller diameter from the back face of the insulating layer 18B toward the surface thereof.

As shown in FIG. 8, moreover, a diameter R6 of the holding portion 19 is larger than a diameter R3 of one of ends of the short circuit portion 18 linked to the base end.

A thickness d of the insulating layer 18B is smaller than a thickness d3 of the short circuit portion 18.

Furthermore, the short circuit portion 18 is held in such a state that the short circuit portion 18 can move in a through hole 318 formed in the insulating layer 18B.

A diameter R7 of the through hole 318 formed in the insulating layer 18B is smaller than a diameter R6 of the holding portion 19 of the electrode structure 15 and a diameter R5 of the back electrode portion 17, and is preferably larger than a diameter R4 of the short circuit portion 18 on the back side of the insulating layer 18B.

By satisfying the above conditions, the short circuit portion 18 of the electrode structure 15 is held in such a state that the short circuit portion 18 of the electrode structure 15 does not slip from the insulating layer 18B and that the short circuit portion 18 can move in a direction of a thickness of the insulating layer 18B.

A length in which the electrode structure can move in a direction of a thickness of the insulating layer is practically equivalent to a difference h2 between a thickness d3 of the short circuit portion 18 and a thickness d of the insulating layer 18B.

More specifically, a length in which the electrode structure can move in a direction of a thickness of the insulating layer is preferably 5 to 30 μm, and more preferably 10 to 25 μm.

The other configurations, preferable dimensions, and materials of the sheet-like probe related to the second embodiment are similar to the sheet-like probe related to the first embodiment.

Method of Manufacturing Sheet-Like Probe of the Second Embodiment

A method of manufacturing the sheet-like probe of the second embodiment will be described below.

According to the processes shown in FIGS. 14(a) to 15(c) in the method of manufacturing the sheet-like probe of the first embodiment, there is obtained the laminate material 10A in which the surface electrode portion 16 and the holding portion 19 have been formed.

The resist film 13A is then peeled from the laminate material 10A.

Figure 20:
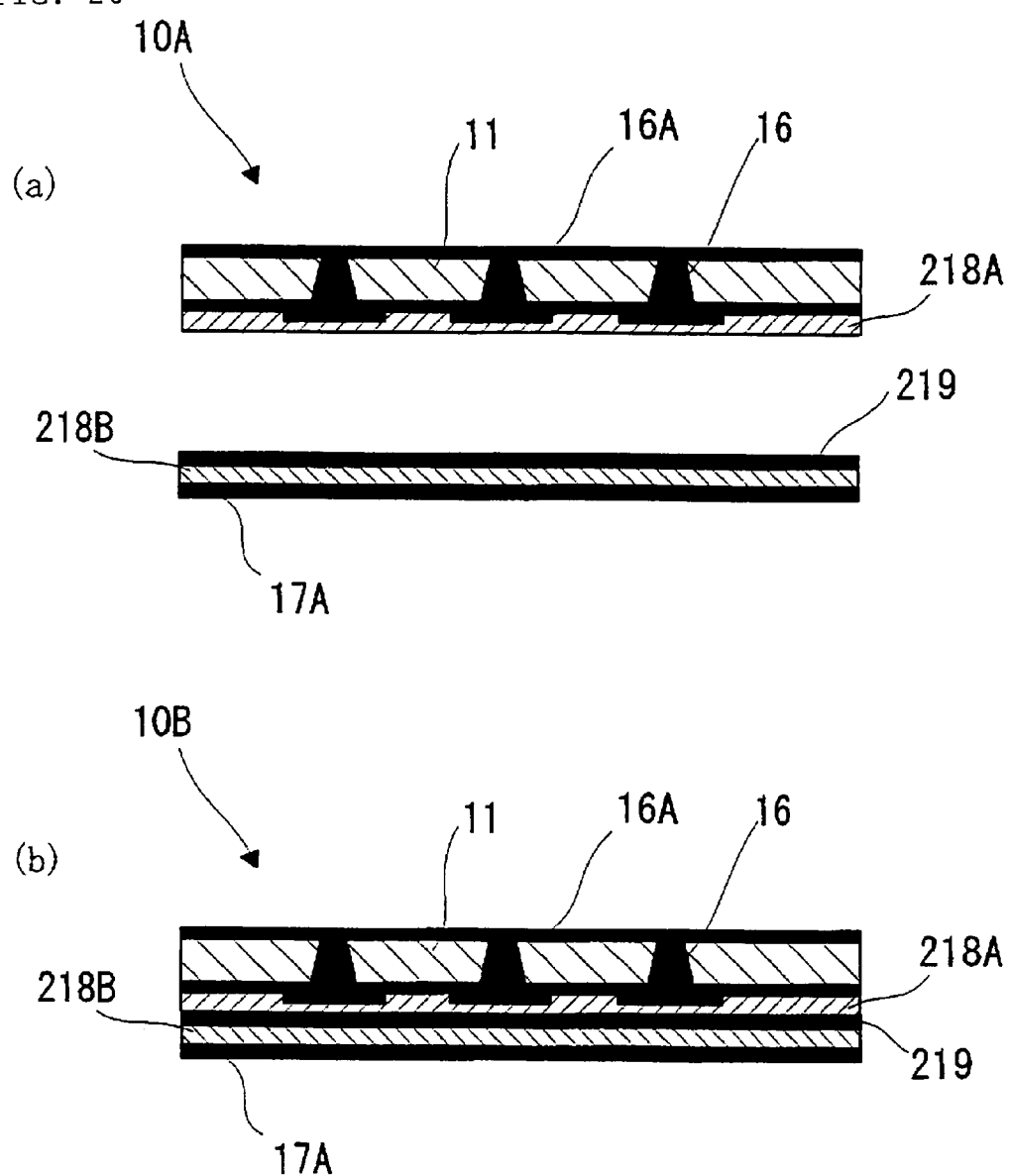
FIG. 20 is an explanatory sectional view showing the structure of the laminate material for manufacturing the sheet-like probe according to the present invention.

Thereafter, as shown in FIG. 20(a), in such a manner that the first back side metal layer 19A and the holding portion 19 of the laminate material 10A are covered, a polyimide layer 218A is formed by coating and curing the photosensitive polyimide solution, the polyimide precursor solution, or the liquid polyimide or varnish obtained by diluting a polyimide precursor or low molecular polyimide with a solvent in the above-mentioned (1), by coating and curing the thermoplastic polyimide solution in the above-mentioned (2), or by laminating, heating and pressing the thermoplastic polyimide film in the above-mentioned (3).

Figure 21:
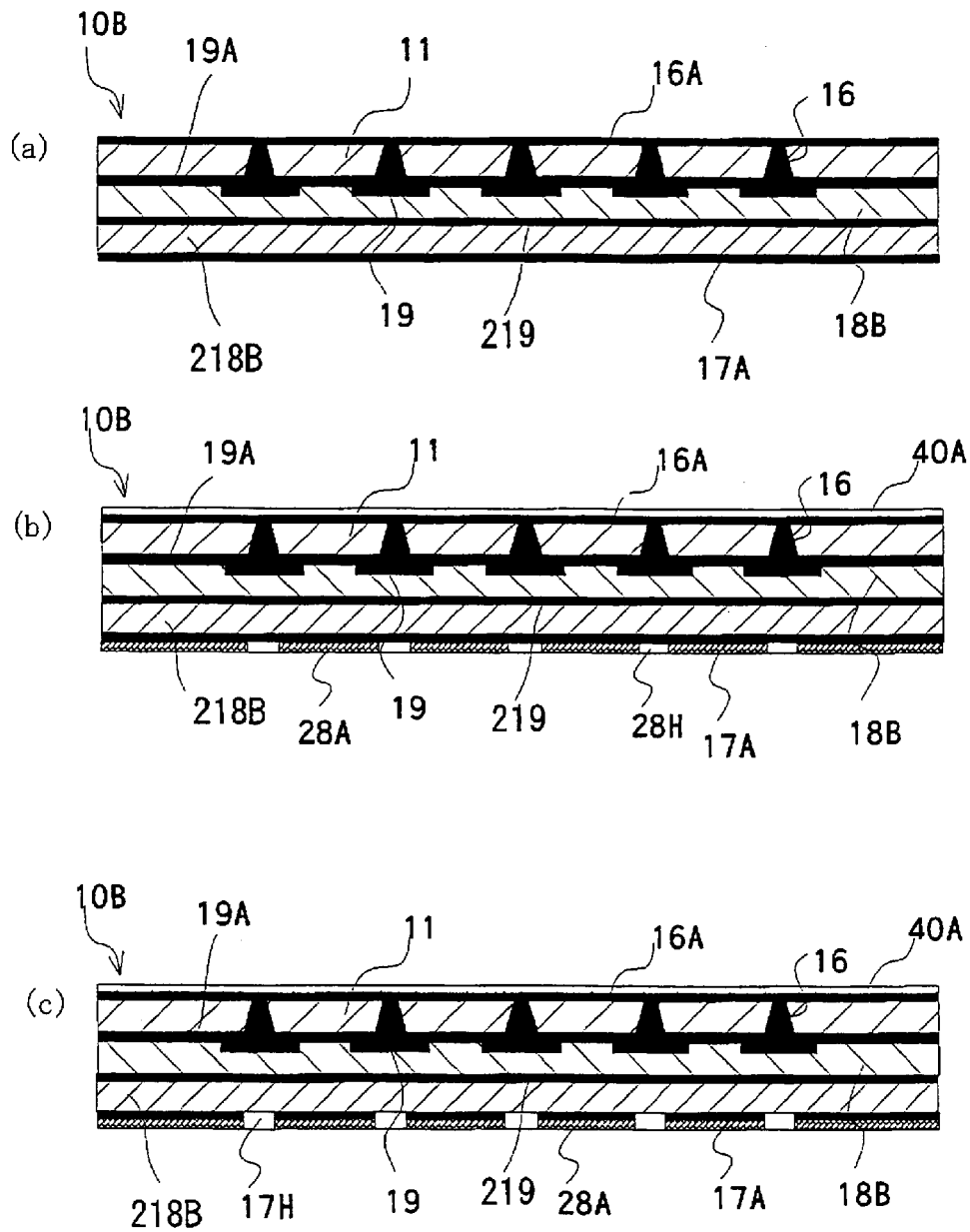
FIG. 21 is an explanatory sectional view showing another structure of the laminate material for manufacturing the sheet-like probe according to the present invention.
Figure 22:
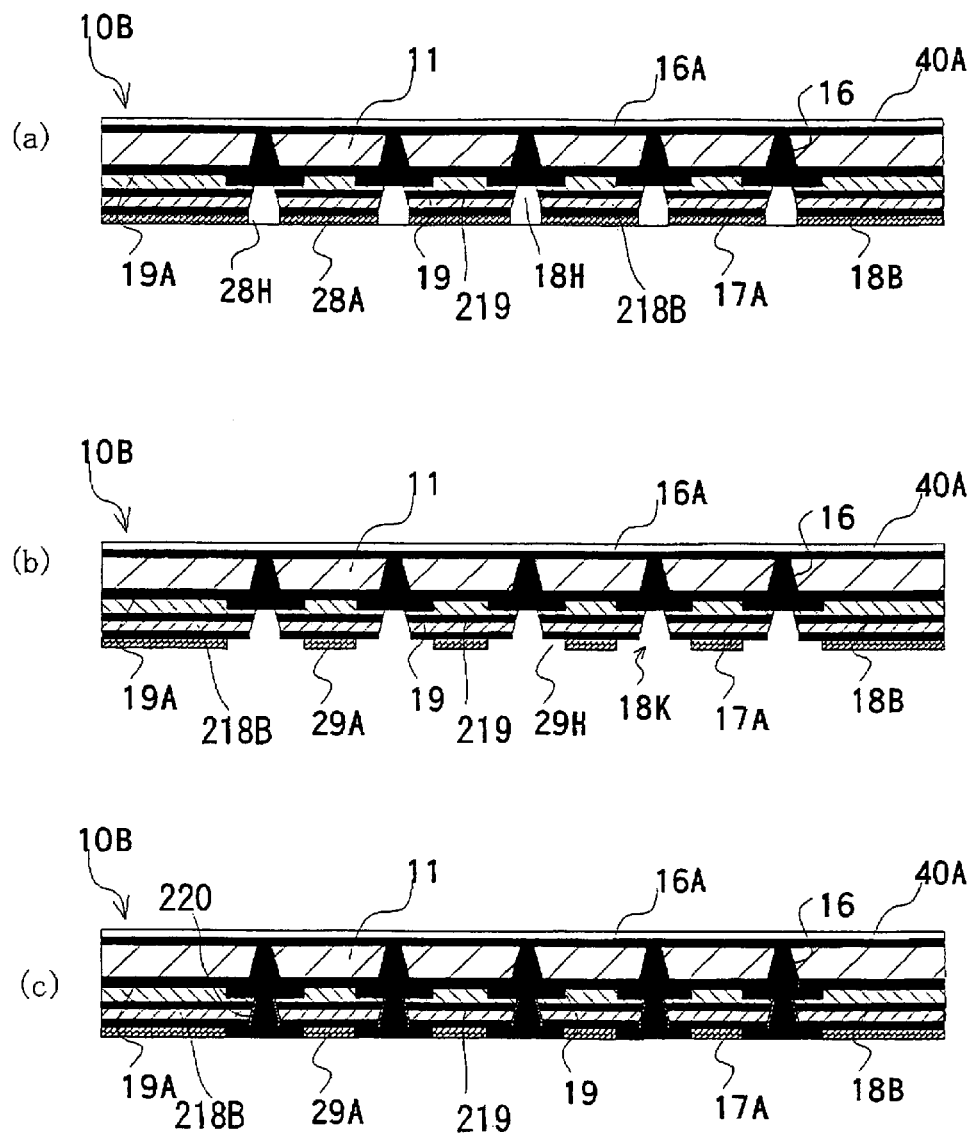
FIG. 22 is an explanatory sectional view showing yet another structure of the laminate material for manufacturing the sheet-like probe according to the present invention.

Next, as shown in FIG. 20(a), a second back side metal layer 17A is formed on one side. For instance, a laminated polyimide sheet having a metal layer formed of a 42-alloy and another side on which a metal layer 219 is formed is laminated in such a manner that the surface on the metal layer 219 side comes into contact with the polyimide layer 218A of the laminate material 10A, and the polyimide layer 218A is cured. By this step, as shown in FIGS. 21(a) and 20(b), there is obtained a laminate material 10B in which the metal layer 219 is provided in the insulating layer 18B and on which the second back side metal layer 17A is laminated.

Then, according to the processes shown in FIGS. 16(b) to 17(b) in the method of manufacturing the sheet-like probe of the first embodiment, as shown in FIGS. 21(b) to 22(b), pattern holes 17H of the second back side metal layer 17A are formed on the back side of the laminate material 10B, and an etching treatment is carried out over the insulating layer 218B through each of the pattern holes 17H to remove a portion exposed, thereby exposing the metal layer 219.

Thereafter, the metal layer 219 is removed by an etching treatment, and an etching treatment is carried out over the insulating layer 218A to provide a plurality of concave portions 18K for forming a short circuit portion with which the pattern holes 17H of the second back side metal layer 17A and the through holes 18H of the insulating layer 18B communicate. Consequently, there is obtained the laminate material 10B provided with a resist film 29A for metal plating in which a plurality of pattern holes 29H is formed on the surface of the second back side metal layer 17A according to a pattern corresponding to a pattern of the back electrode portion 17 in the electrode structure 15 to be formed (see FIGS. 22(b) and 23(a)).

Figure 23:
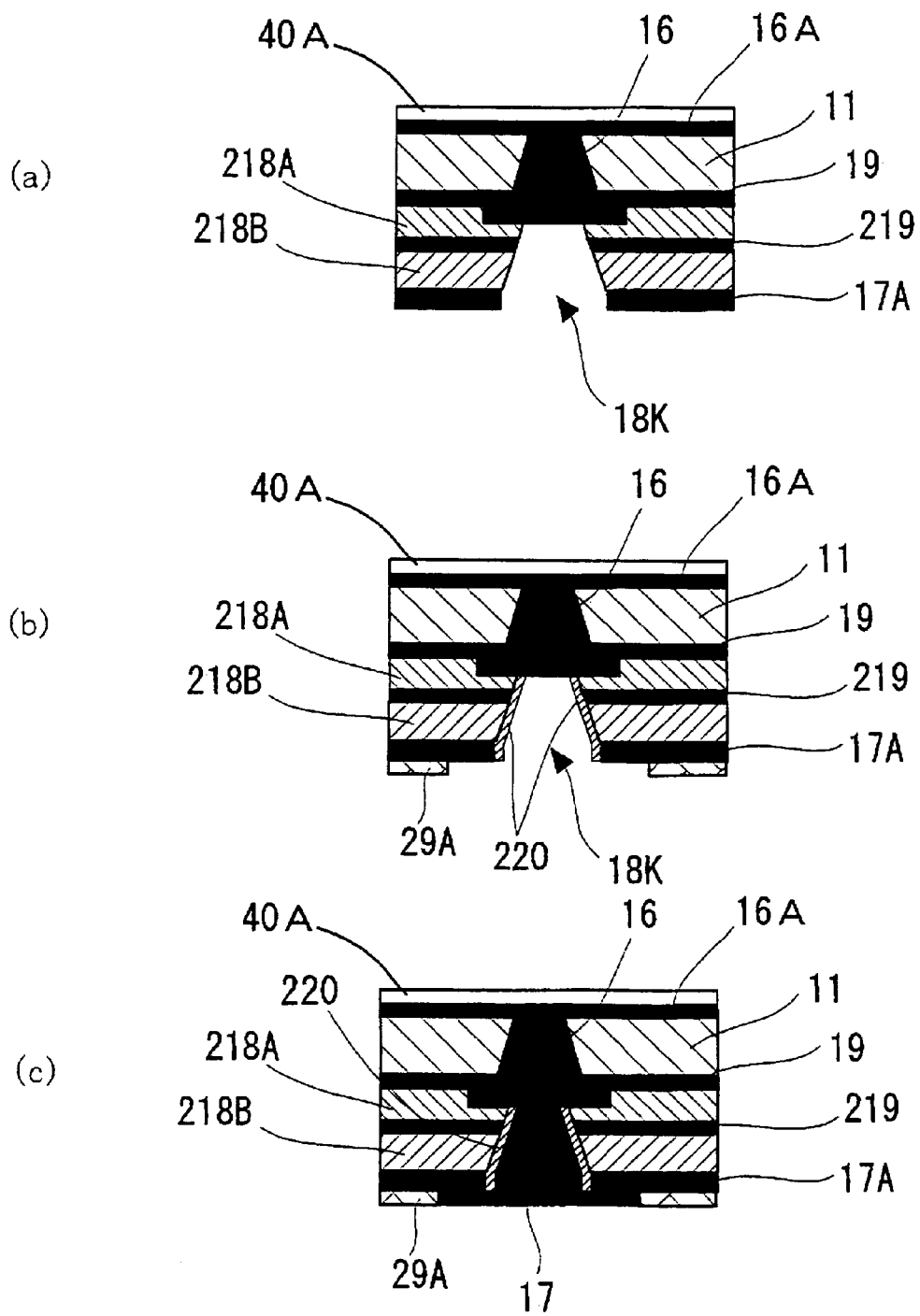
FIG. 23 is an explanatory sectional view showing another structure of the laminate material for manufacturing the sheet-like probe of the second embodiment according to the present invention.
Figure 25:
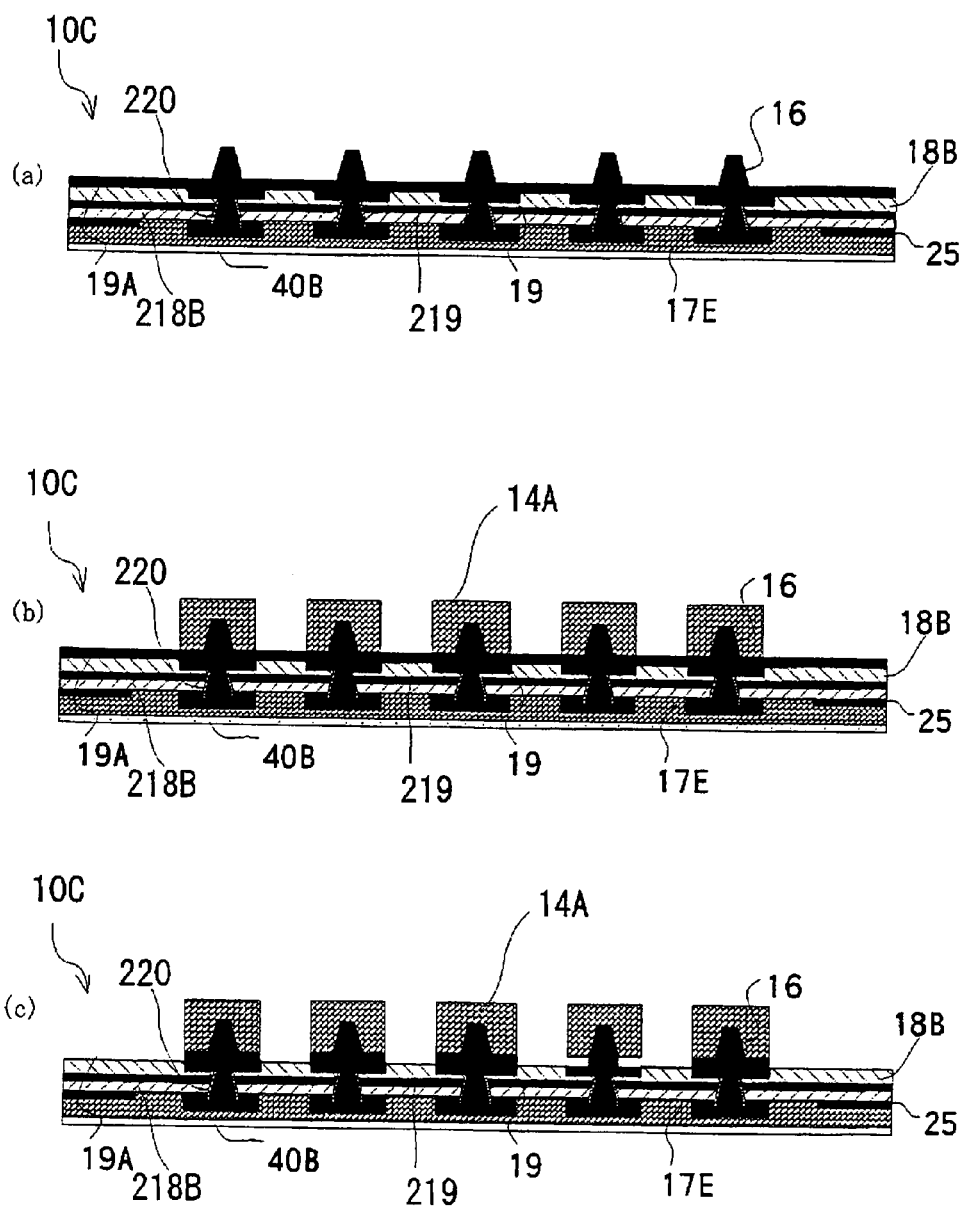
FIG. 25 is an explanatory sectional view showing a further structure of the laminate material for manufacturing the sheet-like probe according to the present invention.

As shown in FIGS. 23(a) and 23(b), the metal thin layer 220 is formed on the internal surface of the concave portion 18K for forming a short circuit portion in the laminate material 10B.

The metal thin layer 220 is preferably formed of a metal with an easy etching property in which an etching speed is higher, and a copper can be used as a metal material with an easy etching property.

After the metal thin layer 220 is formed by using a metal material with an easy etching property on the internal surface of the concave portion 18K for forming a short circuit portion, a metal is filled into the concave portion 18K for forming a short circuit portion by metal plating, thereby forming a short circuit portion 18 (see FIGS. 22(c) and 23(c)).

As described above, after the metal thin layer 220 is formed by using a metal material with an easy etching property, the short circuit portion 18 is formed by filling a metal having a low etching speed by metal plating, thereby easily removing only the metal thin layer 220 by an etching after forming the electrode structure 15.

By such a configuration, as shown in FIG. 8, a diameter R4 of the short circuit portion 18 of the electrode structure 15 on the back side of the insulating layer 18B is smaller than a diameter R7 of the through hole 318 formed in the insulating layer 18B, and the electrode structure 15 is held in such a state that the electrode structure 15 can move in a direction of a thickness thereof.

As a method of forming the metal thin layer 220, an electroless plating method, an electrolytic plating method, and a sputtering method can be adopted. The metal thin layer 220 can be formed by carrying out plural times of treatments using the combination of those methods.

A thickness of the metal thin layer 220 is preferably 3 μm or less, and more preferably 1 μm or less.

Then, according to the processes shown in FIGS. 18(a) to 19(c) in the method of manufacturing the sheet-like probe of the first embodiment, as shown in FIGS. 24(a) to 25(c), there is obtained the laminate material 10C in which the holding portion 19 is formed to be extended radially outward along the surface of the insulating layer 18B continuously from the peripheral surface of the base end portion of the surface electrode portion 16.

Figure 26:
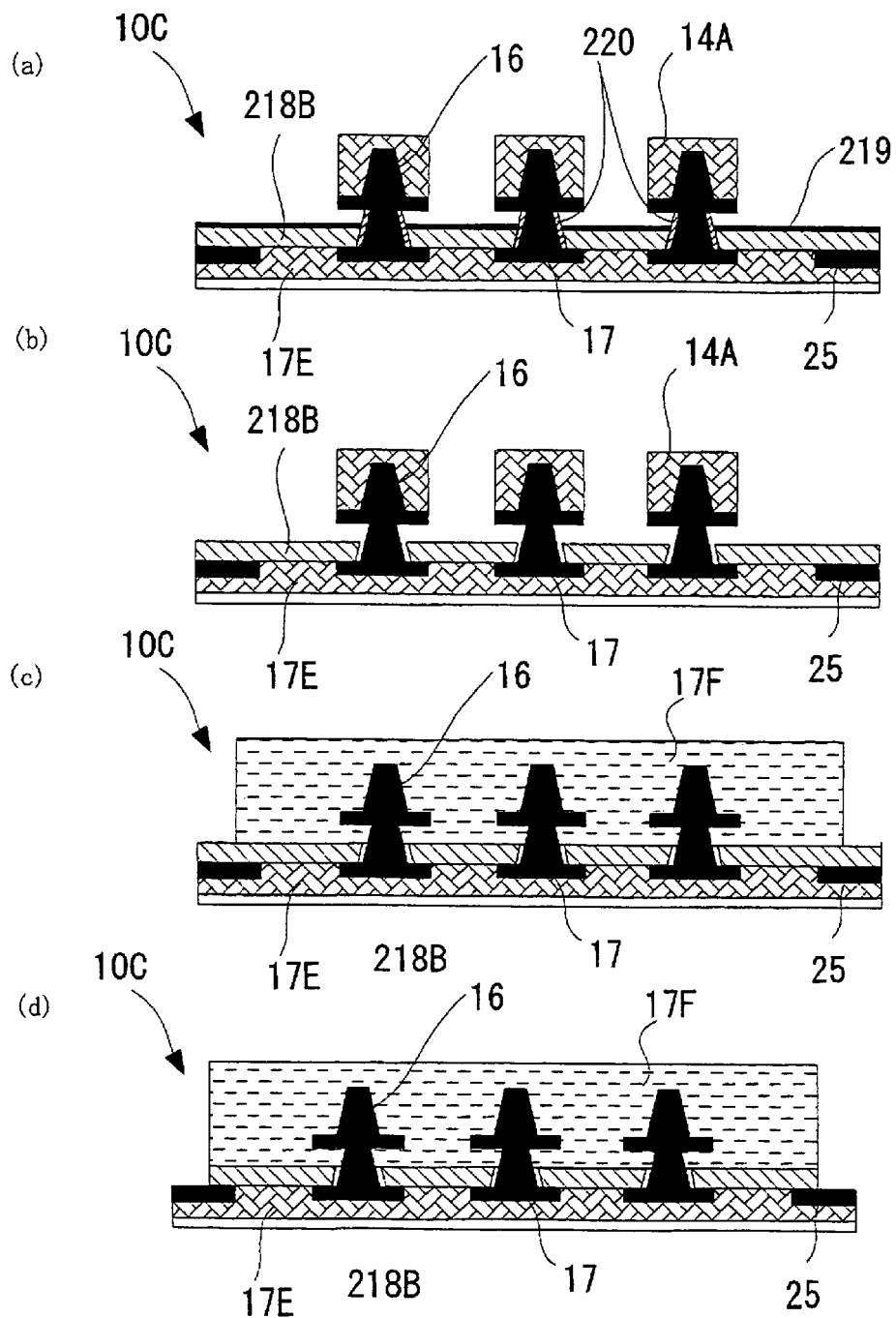
FIG. 26 is an explanatory sectional view showing a further structure of the laminate material for manufacturing the sheet-like probe of the second embodiment according to the present invention.

Thereafter, as shown in FIG. 26(a), an etching treatment is carried out over the insulating layer 18B and the surface side portion of the insulating layer 18B is removed, thereby decreasing a thickness of the insulating layer.

In such a case, since up to the metal layer 219 is removed by an etching, a thickness of the insulating layer 18B can be easily controlled as compared with a method of controlling a thickness of the insulating layer 18B by utilizing a difference in etching speeds of the resin layers. In addition, it is easy to remove the polyimide layer 18C between the insulating layer 18B and the holding portion 19 of the electrode structure 15, and there is an advantage that a thickness of the insulating layer 18B can be easily controlled uniformly over the whole surface of the insulating layer 18B.

Next, as shown in FIG. 26(b), the metal layer 219 and the metal thin layer 220 are removed by carrying out an etching treatment over the laminate material 10C in which the surface side portion of the insulating layer 18B has been removed and a thickness of the insulating layer has been decreased.

An etchant for carrying out the etching treatment over the metal layer 219 and the metal thin layer 220 is properly selected corresponding to a material for forming these metal layers. In the case in which these metal layers are formed of copper, for example, it is possible to use an iron(III) chloride solution.

By carrying out the etching treatment for a short time, since an etching speed of the metal that forms the metal layer 219 and the metal thin layer 220 is higher and an etching speed of the metal that forms the electrode structure 15 is lower, only the metal layer 219 and the metal thin layer 220 are removed and the electrode structure 15 is hardly etched and is left.

A metal that forms the metal layer 219 and the metal thin layer 220 is preferably copper and a metal that forms the electrode structure 15 is preferably nickel. By the combination of the metal kinds, it can be easily achieved that only the metal layer 219 and the metal thin layer 220 are removed and the electrode structure 15 is hardly etched and is left.

As shown in FIG. 26(c), then, the resist film 14A is removed and a resist film 17F is formed on an upper surface of the laminate material 10C in order to expose a part of the metal frame plate 25. In this state, the insulating layer 18B is subjected to an etching treatment so that a part of the metal frame plate 25 is exposed as shown in FIG. 26(d).

Thereafter, the resist film 17F is removed from the surface of the insulating layer 18B, and the protective film 40B and the resist film 17E are removed from the back face of the insulating layer 18B and the back electrode portion 17 so that the sheet-like probe 10 shown in FIG. 7 is obtained.

The method in which the surface side portion of the insulating layer 18B is removed and a thickness of the insulating layer is decreased by removing up to the metal layer 219 with an etching while utilizing the above described metal layer 219 as described in the method of manufacturing the sheet-like probe of the second embodiment can also be adopted to the method of manufacturing the sheet-like probe of the first embodiment (not shown in figures).

<Probe Card and Apparatus for Inspecting Circuit Device>

Figure 27:
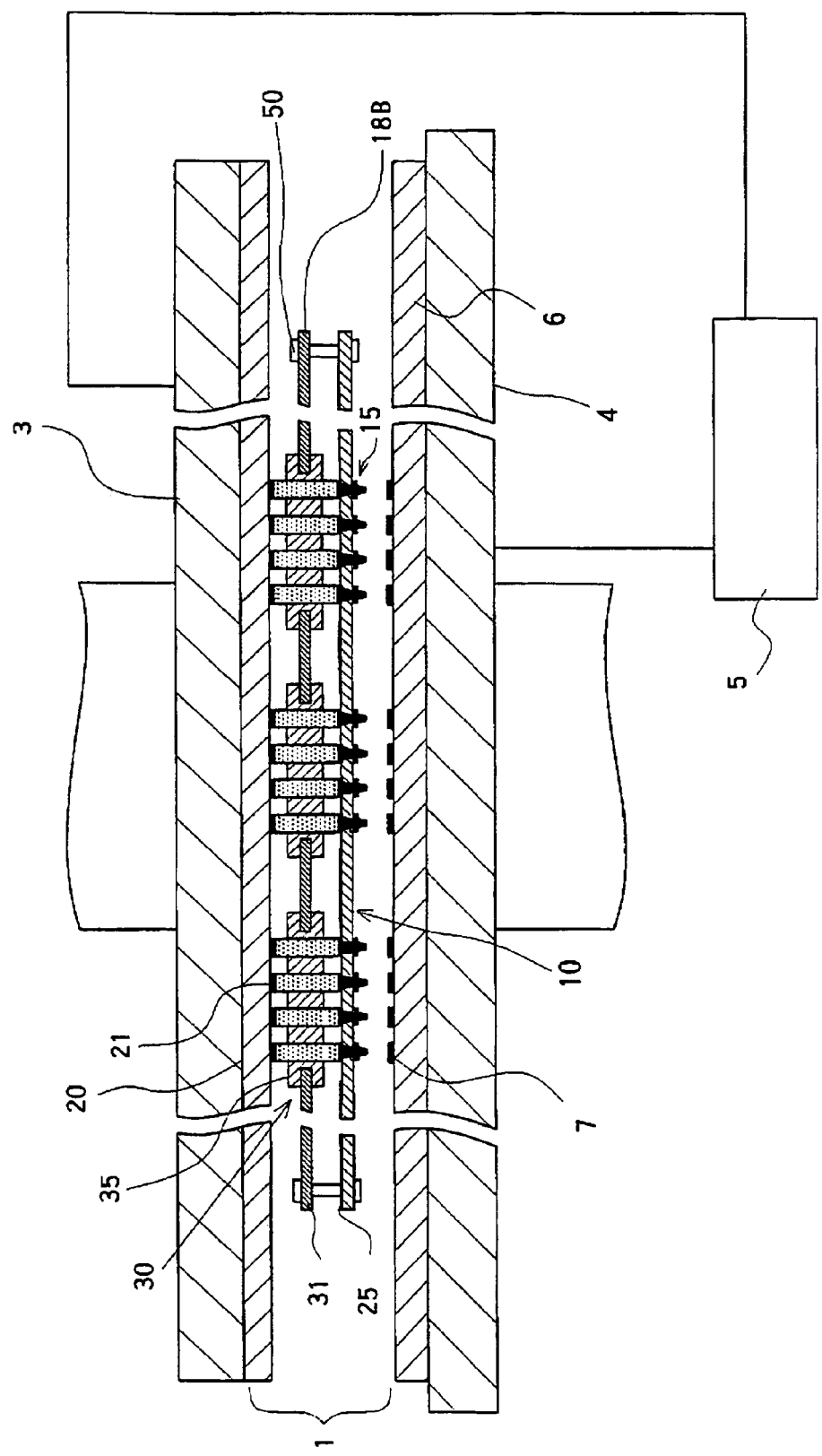
FIG. 27 is a sectional view showing an embodiment of an apparatus for inspecting a circuit device and a probe card to be used therein according to the present invention.

FIG. 27 is an explanatory sectional view showing a structure according to an example of an apparatus for inspecting a circuit device according to the present invention, and the apparatus for inspecting a circuit device serves to carry out an electrical inspection for an integrated circuit in a state of a wafer for each of the integrated circuits formed on the wafer.

The apparatus for inspecting a circuit device has a probe card 1 for carrying out an electrical connection of each of the electrodes 7 to be inspected in the wafer 6 which is a circuit device to be inspected and a tester (a sheet-like probe for supporting the insulating layer 18B on the metal frame plate 25).

Figure 30:
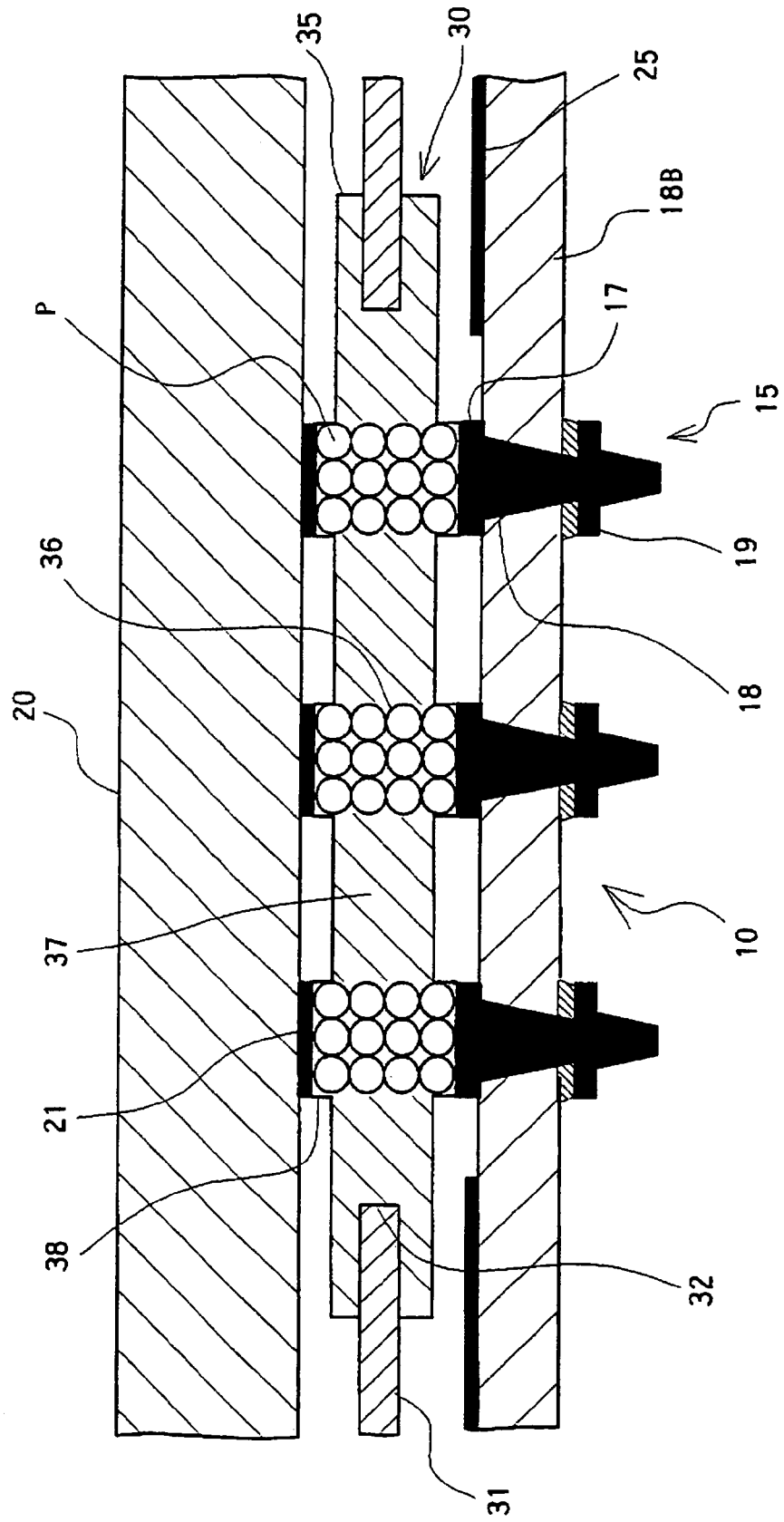
FIG. 30 is an explanatory sectional view showing the enlarged probe card in the inspecting apparatus illustrated in FIG. 28.
Figure 31:
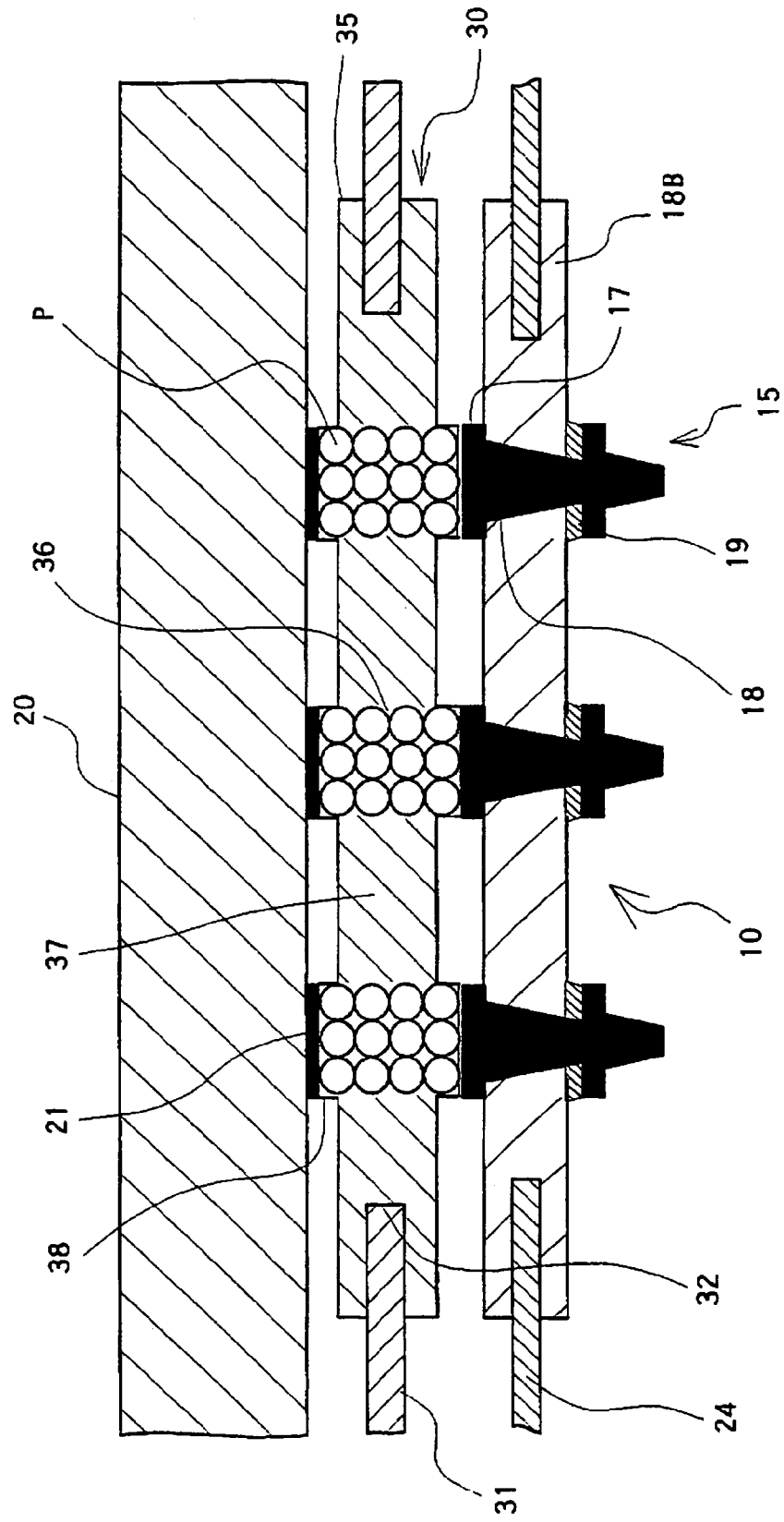
FIG. 31 is an explanatory sectional view showing the enlarged probe card in the inspecting apparatus illustrated in FIG. 29.

As shown in an enlarged view of FIG. 30, the probe card 1 has a circuit board 20 for an inspection which has a surface (a lower surface in the drawing) provided with a plurality of inspection electrodes 21 in accordance with the pattern corresponding to the pattern of the electrodes 7 to be inspected in all of the integrated circuits formed on the wafer 6.

Furthermore, the anisotropically conductive connector 30 is disposed on the surface of the circuit board 20 for an inspection. In addition, a surface (a lower surface in the drawing) of the anisotropically conductive connector 30 is provided with the sheet-like probe 10 having the structure shown in FIG. 1 in which a plurality of electrode structures 15 is disposed in accordance with the pattern corresponding to the pattern of the electrodes 7 to be inspected in all of the integrated circuits formed on the wafer 6.

The sheet-like probe 10 is held by a guide pin 50 in a state in which the anisotropically conductive connector 30, the electrode structure 15 and the conducting portion 36 are fixed to be coincident with each other.

Moreover, a pressurizing plate 3 for pressurizing the probe card 1 downward is provided on a back face (an upper face in the drawing) of the circuit board 20 for an inspection in the probe card 1. In addition, a wafer mounting table 4 for mounting the wafer 6 thereon is provided below the probe card 1 and a heater 5 is connected to each of the pressurizing plate 3 and the wafer mounting table 4.

Figure 28:
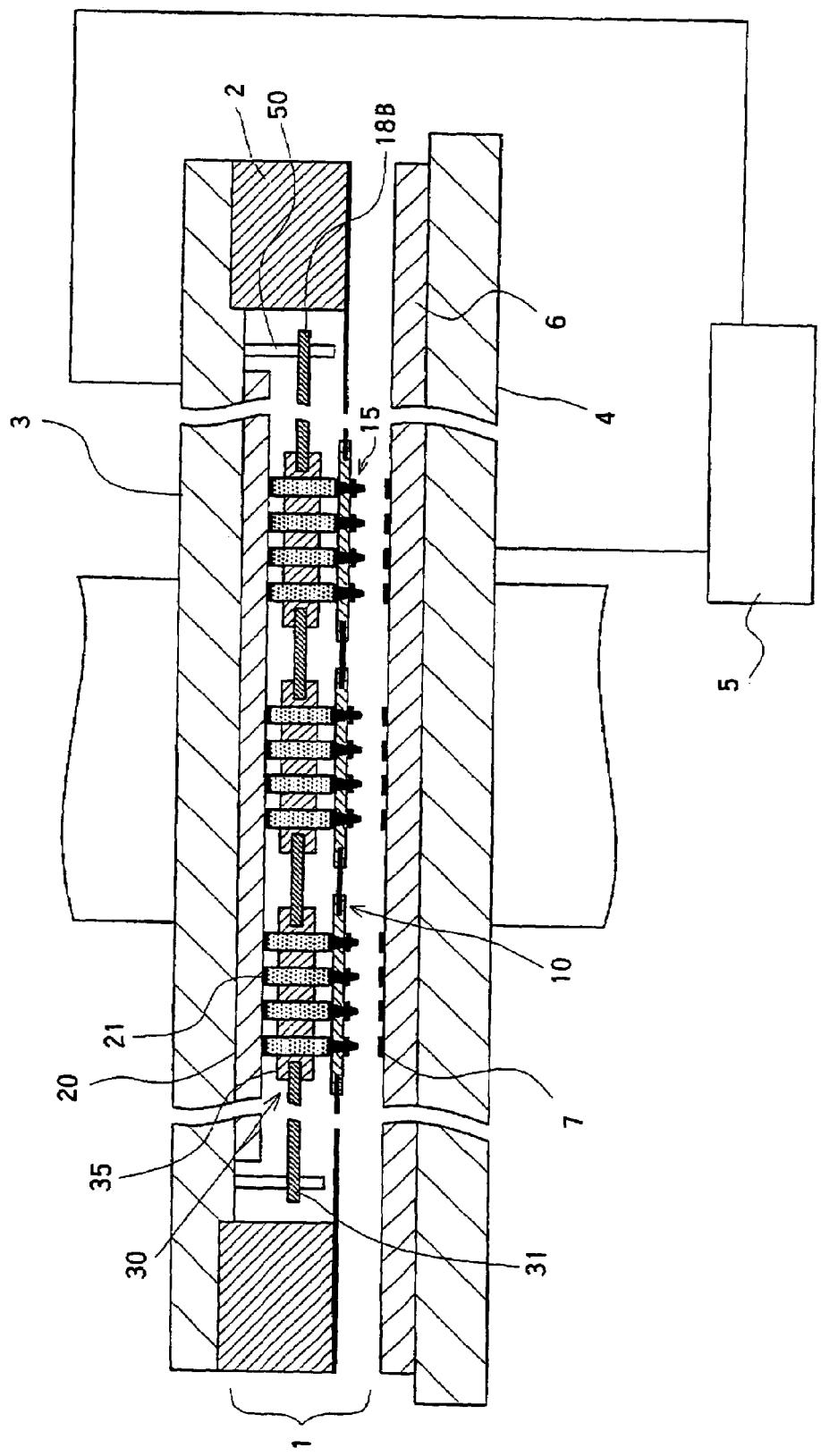
FIG. 28 is a sectional view showing another embodiment of the apparatus for inspecting a circuit device and the probe card to be used therein according to the present invention.

In the apparatus for inspecting the circuit device, moreover, the sheet-like probe 10 is properly used in a state in which the support member 2 is fixed to the outer edge portion of the metal frame plate 25 (including the metal frame plate 24) if necessary as shown in FIG. 28.

Figure 29:
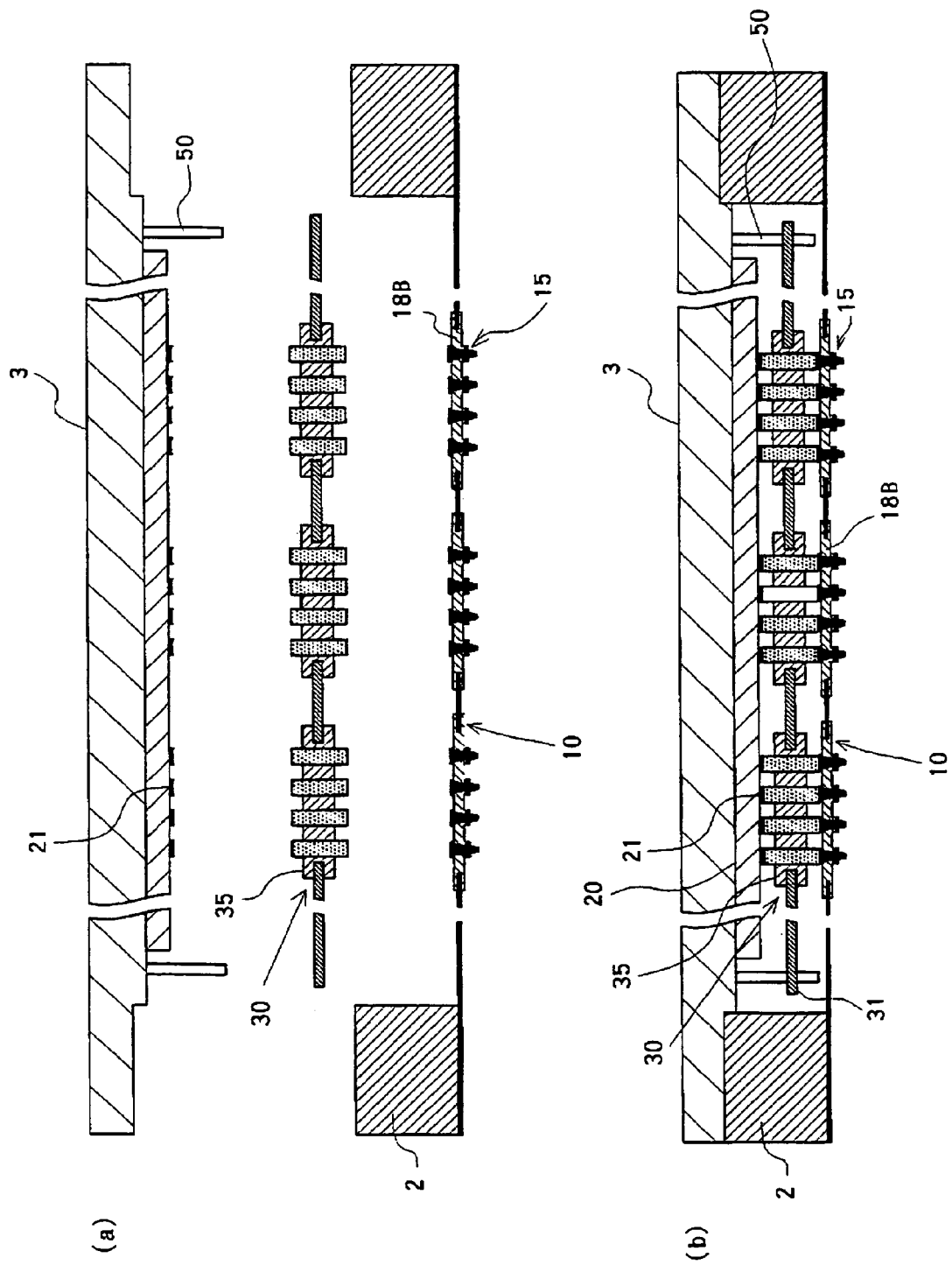
FIG. 29 is a sectional view showing each state brought before and after an assembly in the probe card of FIG. 28.

Furthermore, the apparatus for inspecting the circuit device has an exploded structure shown in FIGS. 29(a) and 29(b), and the guide pin 50 is fitted in a through hole formed on a frame plate 31 of the anisotropically conductive connector 30, thereby carrying out positioning.

In the sheet-like probe 10, moreover, the support member 2 bonded to the outer edge portion of the metal frame plate 25 (including the metal frame plate 24) is fitted in the concave portion of the pressurizing plate 3 so that the positioning can be carried out.

For a board material constituting the circuit board 20 for an inspection, furthermore, it is possible to use various board materials which have been conventionally well-known and specific examples thereof include a composite resin material such as a glass fiber reinforcing type epoxy resin, a glass fiber reinforcing type phenol resin, a glass fiber reinforcing type polyimide resin or a glass fiber reinforcing type bismaleimide triazine resin, a ceramics material such as glass, silicon dioxide or alumina, and the like.

In the case in which an inspecting apparatus for carrying out a WLBI test is to be constituted, moreover, a coefficient of linear thermal expansion is preferably equal to or smaller than $3\times10^{-5}$/K, is more preferably $1\times10^{-7}$ to $1\times10^{-5}$/K, and is particularly preferably $1\times10^{-6}$ to $6\times10^{-6}$/K.

Specific examples of the board material include Pyrex (registered trademark) glass, quartz glass, alumina, beryllia, silicon carbide, aluminum nitride, boron nitride and the like.

Figure 32:
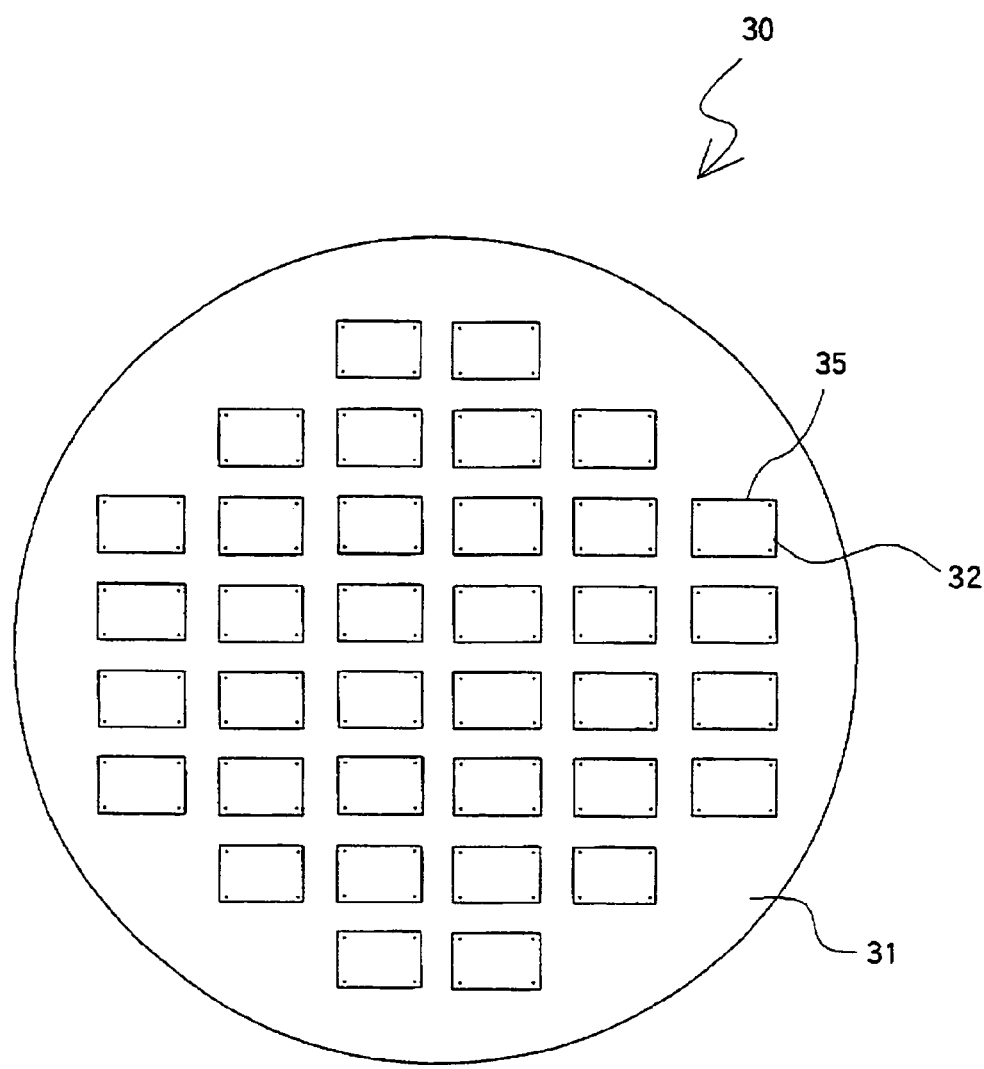
FIG. 32 is a plan view showing an anisotropically conductive connector in the probe card illustrated in FIGS. 30 and 28.

As shown in FIG. 32, the anisotropically conductive connector 30 is constituted by a frame plate 31 provided with a plurality of openings 32 corresponding to an electrode region in which the electrodes 7 to be inspected in all of the integrated circuits formed on the wafer 6 that is the circuit device to be inspected are disposed, and a plurality of anisotropically conductive sheets 35 disposed on the frame plate 31 in order to close one of the openings 32 and fixed to and supported on an opening edge portion of the frame plate 31.

A material for constituting the frame plate 31 is not particularly restricted if the frame plate 31 is not easily deformed and has such a rigidity that a shape thereof is maintained stably. For example, it is possible to use various materials such as a metal material, a ceramics material, a resin material and the like. In the case in which the frame plate 31 is constituted by the metal material, for example, an insulating coated film may be formed on the surface of the frame plate 31.

Specific examples of the metal material for constituting the frame plate 31 include a metal such as iron, copper, nickel, titanium or aluminum, an alloy or alloy steel obtained by combining at least two of them, and the like.

Specific examples of the resin material for constituting the frame plate 31 include a liquid crystal polymer, a polyimide resin and the like.

In the case in which the inspecting apparatus serves to carry out the WLBI (Wafer Level Burn-in) test, moreover, the material for constituting the frame plate 31 preferably has a coefficient of linear thermal expansion of $3\times10^{-5}$/K or less, more preferably $-1\times10^{-7}$ to $1\times10^{-5}$/K, and particularly preferably $1\times10^{-6}$ to $8\times10^{-6}$/K.

Specific examples of such a material include an alloy or alloy steel of a magnetic metal such as an invar type alloy such as invar, an elinvar type alloy such as elinvar, super-invar, kovar or a 42-alloy, and the like.

A thickness of the frame plate 31 is not particularly restricted if a shape thereof is maintained and the anisotropically conductive sheet 35 can be supported. A specific thickness is varied depending on a material and is preferably 25 to 600 μm and is more preferably 40 to 400 μm, for example.

Each of the anisotropically conductive sheets 35 is formed by an elastic polymer substance and is constituted by a plurality of conducting portions 36 formed in accordance with the pattern corresponding to the pattern of the electrode 7 to be inspected in one electrode region formed on the wafer 6 which is the circuit device to be inspected and extended in a direction of a thickness respectively and an insulating portion 37 for insulating the conducting portions 36 from each other.

In the example shown in the drawing, in a place in which the conducting portion 36 and a peripheral portion thereof are positioned, a projected portion 38 projected from the other surface is formed on both sides of the anisotropically conductive sheet 35.

In each of the conducting portions 36 in the anisotropically conductive sheet 35, conductive particles P exhibiting a magnetism are densely contained in a state in which they are oriented to be arranged in a direction of a thickness. On the other hand, the insulating portion 37 does not contain the conductive particles P at all or rarely contains them.

A total thickness of the anisotropically conductive sheet 35 (a thickness in the conducting portion 36 in the example of the drawing) is preferably 50 to 2000 μm, is more preferably 70 to 1000 μm, and is particularly preferably 80 to 500 μm.

If the thickness is equal to or greater than 50 μm, the anisotropically conductive sheet 35 can have a sufficient strength.

On the other hand, if the thickness is equal to or smaller than 2000 μm, the conducting portion 36 having a predetermined conductive characteristic can be obtained reliably.

A total projection height of the projected portion 38 is preferably equal to or greater than 10% of a thickness in the projected portion 38 and is more preferably equal to or greater than 15%.

By forming the projected portion 38 having such a projection height, the conducting portion 36 is sufficiently compressed by a small pressurizing force. Therefore, it is possible to reliably obtain a high conductivity.

Moreover, the projection height of the projected portion 38 is preferably equal to or smaller than 100% of the smallest width or diameter of the projected portion 38 and is more preferably equal to or smaller than 70%.

By forming the projected portion 38 having the projection height, the projected portion 38 can be prevented from being buckled in a pressurization. Therefore, it is possible to reliably obtain a predetermined conductivity.

For an elastic polymer substance for forming the anisotropically conductive sheet 35, a heat-resistant polymer substance having a crosslinking structure is preferable.

For a curing polymeric substance forming material which can be used for obtaining the crosslinked polymeric substance, various materials can be used and the liquid silicone rubber is preferable.

It is preferable that a magnetic core particle for obtaining the conductive particle P should have a number average particle diameter of 3 to 40 μm.

The number average particle diameter of the magnetic core particle is measured by a laser diffraction scattering method.

If the number average particle diameter is equal to or greater than 3 μm, it is possible to easily obtain the conducting portion 36 which can easily be pressurized and deformed and has a low resistance value and a high connecting reliability.

On the other hand, if the number average particle diameter is equal to or smaller than 40 μm, the minute conducting portion 36 can easily be formed, and furthermore, the conducting portion 36 thus obtained can easily have a stable conductivity.

For a material for constituting the magnetic core particle, it is possible to use iron, nickel, cobalt, a substance obtained by coating these metals with copper or a resin, or the like. A material which can be used preferably has a saturation magnetization of 0.1 Wb/m$^2$ or more, more preferably 0.3 Wb/m$^2$ or more and particularly preferably 0.5 Wb/m$^2$ or more, and specifically, includes iron, nickel, cobalt, their alloy or the like.

For a high conductive metal to be coated over a surface of the magnetic core particle, it is possible to use gold, silver, rhodium, platinum, chromium or the like. In particular, the gold is preferably used in that it is chemically stable and has a high conductivity.

The conductive particle P has a rate of a high conductive metal to a core particle [(a mass of a high conductive metal/a mass of a core particle)×100] which is equal to or greater than 15% by mass and is preferably 25 to 35% by mass.

In the case in which the rate of the high conducive metal is lower than 15% by mass, the conductivity of the conductive particle P is remarkably reduced when the anisotropically conductive connector 30 which is obtained is used repetitively in a high temperature environment. As a result, a predetermined conductivity cannot be maintained.

Moreover, the number average particle diameter of the conductive particle P is preferably 3 to 40 μm and is more preferably 6 to 25 μm.

By using such a conductive particle P, the anisotropically conductive sheet 35 which is obtained can easily be pressurized and deformed, and furthermore, a sufficient electrical contact can be obtained between the conductive particles P in the conducting portion 36.

Although a shape of the conductive particle P is not particularly restricted, moreover, it preferably takes the shape of a sphere, a star or a lump formed by a secondary particle obtained by aggregating them in that they can easily be dispersed in a polymeric substance forming material.

A rate of content of the conductive particle P in the conducting portion 36 has a volume fraction of 10 to 60% and preferably 15 to 50%.

In some cases in which the rate is lower than 10%, the conducting portion 36 having a sufficiently small electric resistance value cannot be obtained.

On the other hand, in some cases in which the rate is higher than 60%, the conducting portion 36 which is obtained is apt to be fragile and a necessary elasticity for the conducting portion 36 cannot be obtained.

The anisotropically conductive connector 30 described above can be manufactured by the method described in Japanese Laid-Open Patent Publication No. 2002-324600, for example.

In the inspecting apparatus described above, the wafer 6 to be an inspecting object is mounted on the wafer mounting table 4, and subsequently, the probe card 1 is pressurized downward by means of the pressurizing plate 3. Consequently, each of the surface electrode portions 16 in the electrode structure 15 of the sheet-like probe 10 comes in contact with each of the electrodes 7 to be inspected in the wafer 6. Furthermore, each of the electrodes 7 to be inspected in the wafer 6 is pressurized by each of the surface electrode portions 16.

In this state, each of the conducting portion 36 in the anisotropically conductive sheet 35 of the anisotropically conductive connector 30 is interposed between the inspection electrode 21 of the circuit board 20 for an inspection and the back electrode portion 17 of the electrode structure 15 in the sheet-like probe 10 and is compressed in a direction of a thickness.

For this reason, a conducting path is formed in the conducting portion 36 in the direction of the thickness. As a result, an electrical connection of the electrode 7 to be inspected in the wafer 6 and the inspection electrode 21 of the circuit board 20 for an inspection can be achieved.

Then, the wafer 6 is heated to have a predetermined temperature through the wafer mounting table 4 and the pressurizing plate 3 by means of the heater 5. In this state, a necessary electrical inspection is executed for each of the integrated circuits in the wafer 6.

According to the probe card 1, the sheet-like probe 10 shown in FIG. 1 is provided. For the wafer 6 on which the electrode 7 to be inspected is formed at a small pitch, therefore, it is also possible to reliably achieve a stable electrical connecting state. In addition, the electrode structure 15 in the sheet-like probe 10 can be prevented from slipping off and the insulating layer 18B has a great thickness. Consequently, a high durability can be obtained.

According to the inspecting apparatus, the probe card 1 having the sheet-like probe 10 shown in FIG. 1 is provided.

For the wafer 6 on which the electrode 7 to be inspected is formed at a small pitch, therefore, it is also possible to reliably achieve a stable electrical connecting state. In addition, the probe card 1 has a high durability. Also in the case in which a large number of wafers 6 are to be inspected, therefore, it is possible to execute an inspection having a high reliability for a long period of time.

The apparatus for inspecting a circuit device according to the present invention is not restricted to the above example but various changes can be made as described below.

(1) The probe card 1 shown in FIGS. 27 and 28 collectively achieves an electrical connection to the electrodes 7 to be inspected in all of the integrated circuits formed on the wafer 6 and may be electrically connected to the electrodes 7 to be inspected in the integrated circuits selected from all of the integrated circuits formed on the wafer 6.

The number of the integrated circuits to be selected is properly selected in consideration of the size of the wafer 6, the number of the integrated circuits formed on the wafer 6, the number of the electrodes 7 to be inspected in each of the integrated circuits and the like, and is 16, 32, 64 and 128, for example.

In the inspecting apparatus having the probe card 1, there is repetitively executed the step of electrically connecting the probe card 1 to the electrodes 7 to be inspected in the integrated circuits selected from all of the integrated circuits formed on the wafer 6, thereby carrying out an inspection, and then, electrically connecting the probe card 1 to the electrodes 7 to be inspected in the integrated circuits selected from the other integrated circuits, thereby carrying out the inspection. Thus, it is possible to execute the electrical inspection for all of the integrated circuits formed on the wafer 6.

According to such an inspecting apparatus, in the case in which the electrical inspection is to be carried out for the integrated circuits formed at a high degree of integration on the wafer 6 having a diameter of 8 inches or 12 inches, it is possible to more reduce the numbers of the inspection electrodes and the wirings in the circuit board 20 for an inspection to be used as compared with a method of collectively inspecting all of the integrated circuits. Consequently, it is possible to reduce a manufacturing cost of the inspecting apparatus.

(2) The circuit device to be the inspecting object of the inspecting apparatus according to the present invention is not restricted to the wafer 6 in which a large number of integrated circuits are formed but can be constituted as an apparatus for inspecting a circuit formed in a semiconductor integrated circuit device such as a semiconductor chip, a package LSI, for example, a BGA or a CSP, or a CMC.

(3) The sheet-like probe 10 can also be fixed and integrated with the anisotropically conductive sheet 35 and the circuit board 20 for an inspection through the guide pin 50 or the like, for example, in a state in which it is held by a holding member such as cylindrical ceramic.

(4) In the method of manufacturing the sheet-like probe 10 according to the present invention, the second back side metal layer 17A is not indispensable but may be omitted to fill a metal in the concave portion 18K for forming a short circuit portion and the pattern hole 17H, thereby forming the back electrode portion 17 integrated with the short circuit portion 18.

In this case, if the metal frame plate 25 is required, it is preferable to laminate and integrate the metal frame plate 25 and the manufactured sheet-like probe 10 which are prepared separately with an adhesive or the like.

(5) The sheet-like probe 10 according to the present invention may be set in a state in which a plurality of contact films 9 constituted by the insulating layer 18B having the electrode structure 15 shown in FIG. 11(a) is disposed in the opening portions 26 of the metal frame plate 25 and is supported by the metal frame plate 25, for example. Furthermore, one contact film 9 may be disposed to cover the opening portions 26 of the metal frame plate 25 as shown in FIG. 11(b).

Thus, the sheet-like probe 10 is constituted by the independent contact films 9. In the case in which the sheet-like probe 10 for inspecting a wafer having a diameter of 8 inches or more is constituted, for example, the expansion and contraction of the contact films 9 with a change in a temperature is reduced so that a positional shift of the electrode structure 15 is decreased, which is preferable.

Such a sheet-like probe 10 is obtained by dividing the insulating layer 18B into the contact films 9 having an optional shape through the execution of patterning and etching with a resist over the insulating layer 18B in a state shown in FIG. 13(b) or FIG. 26(c) in the method of manufacturing the sheet-like probe 10 according to the present invention.

EXAMPLES

While specific examples of the present invention will be described below, the present invention is not restricted to these examples.

<Fabrication of Wafer for Test>

Figure 33:
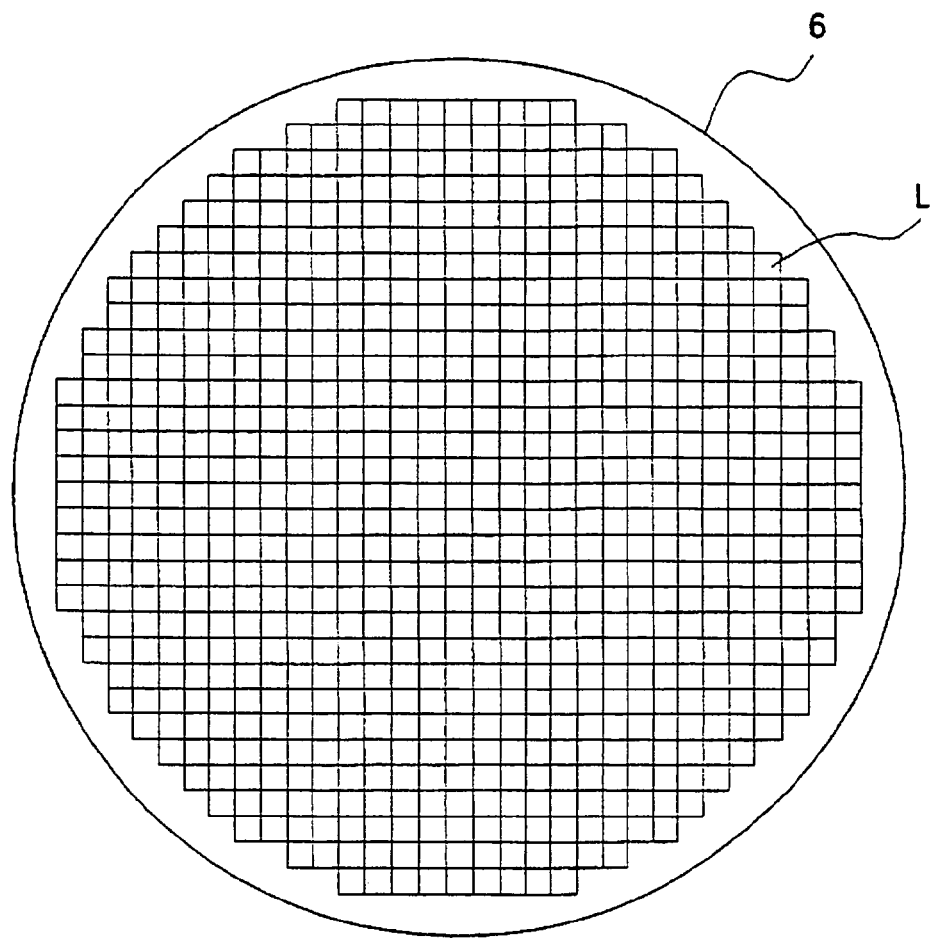
FIG. 33 is a plan view showing a wafer for a test which is fabricated in the example.

As shown in FIG. 33, 483 square integrated circuits L having a dimension of 6.85 mm×6.85 mm in total were formed on the wafer 6 made of silicon having a diameter of 8 inches (a coefficient of linear thermal expansion of $3.3 \times 10^{-6}$/K).

A resin film B1 was formed by spin-coating a photosensitive polyimide on the surface of the wafer 6 on which the integrated circuits L was formed, and the resin film B1 was pre-baked.

After the resin film B1 formed of photosensitive polyimide in the region other than the upper portion of the electrode to be inspected was then exposed, baked, and semicured, a non exposed (non cured) portion of the resin film B1 formed of photosensitive polyimide was developed and removed, thereby forming an opening K1 at the upper portion of the electrode to be inspected.

Thereafter, a high temperature baking treatment was carried out to completely cure the semicured resin film B1 formed of photosensitive polyimide, and there was formed an insulating film B2 made of polyimide having a thickness of approximately 10 μm in which a rectangular opening K1 of 90 μm×90 μm was formed at the upper portion of the electrode to be inspected.

Figure 34:
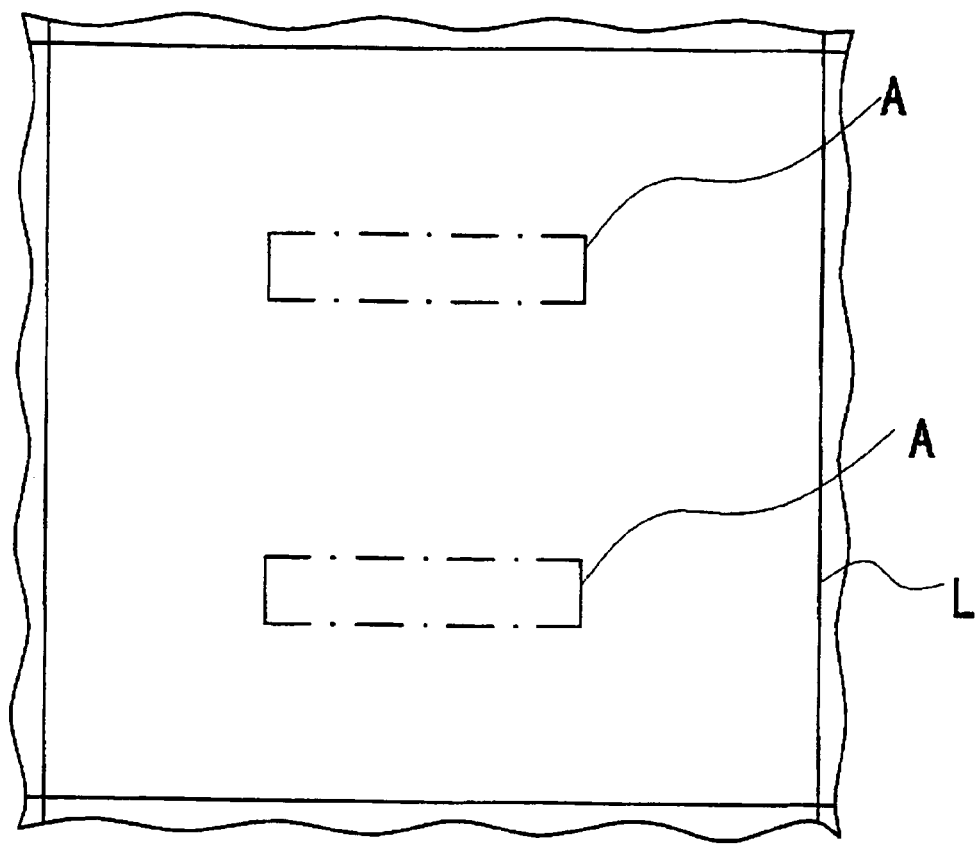
FIG. 34 is an explanatory view showing a position of an electrode region to be inspected in an integrated circuit formed on the wafer for a test illustrated in FIG. 33.

Each of the integrated circuits L formed on the wafer 6 has an electrode region A to be inspected on a center thereof in two lines at an interval of 2500 μm as shown in FIG. 34. Furthermore, the electrode region A to be inspected is provided with 26 rectangular electrodes 7 to be inspected having a dimension in a longitudinal direction (a vertical direction in FIG. 35(a)) of 90 μm and a dimension in a transverse direction (a lateral direction in FIG. 35(a)) of 90 μm in a line in the transverse direction at a pitch of 120 μm as shown in FIG. 35(a).

Figure 35:
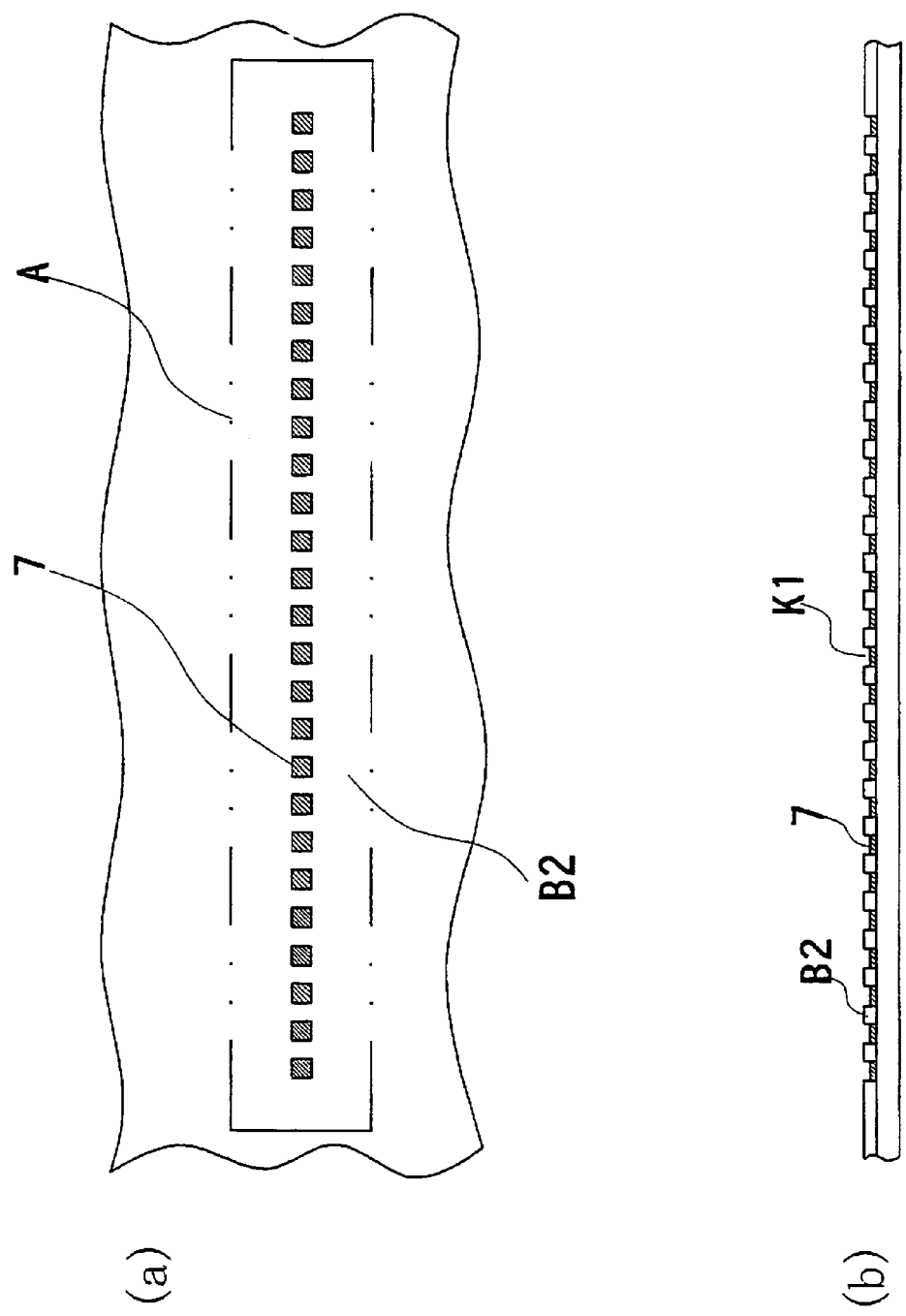
FIG. 35 is an explanatory view showing an arrangement pattern of an electrode to be inspected in an integrated circuit formed on the wafer for a test illustrated in FIG. 34.

As shown in FIG. 35(b), the peripheral surface of the electrodes 7 to be inspected is covered by an insulating layer having a thickness of approximately 10 μm.

The total number of the electrodes 7 to be inspected in the whole wafer 6 is 26116 and all of the electrodes 7 to be inspected are electrically insulated from each other. The wafer 6 will be hereinafter referred to as "a wafer W1 for a test".

Moreover, 483 integrated circuits L having the same structure as the structure of the wafer W1 for a test were formed on the wafer 6 except that every two electrodes 7 to be inspected from an outermost one of the 26 electrodes to be inspected in the integrated circuit L were electrically connected to each other in place of the mutually electrical insulation of all of the electrodes 7 to be inspected.

The wafer will be hereafter referred to as "a wafer W2 for a test".

Example 1

There was prepared a laminated polyimide sheet in which a metal layer formed of copper having a diameter of 20 cm and a thickness of 4 µm is laminated on both sides of a polyimide sheet having a diameter of 20 cm and a thickness of 12.5 µm (which will be hereinafter referred to as "a laminate material 10A" (see FIG. 14(a)).

The laminate material 10A has a first back side metal layer 19A formed of copper having a thickness of 4 µm on one of surfaces of an insulating sheet 11 formed by a polyimide sheet having a thickness of 12.5 µm and has a surface side metal layer 16A formed of copper having a thickness of 4 µm on the other surface.

For the laminate material 10A, a protective film 40A was formed over a whole surface of the surface side metal layer 16A through a protective seal formed of polyethylene terephthalate having a thickness of 25 µm. Furthermore, a resist film 12A provided with 26116 circular pattern holes 12H having a diameter of 45 µm was formed on a whole back face of the first back side metal layer 19A in accordance with a pattern corresponding to a pattern of an electrode 7 to be inspected which is formed in the wafer W1 for a test (see FIG. 14(b)).

In the formation of the resist film 12A, an exposing treatment was carried out by irradiating 80 mJ of ultraviolet rays by means of a high-pressure mercury lamp and a developing treatment was carried out by repeating an operation for performing an immersion in a developer constituted by a 1% sodium hydroxide solution for 40 seconds twice.

Subsequently, the first back side metal layer 19A was subjected to an etching treatment at 50° C. for 30 seconds by using an iron(III) chloride type etchant, thereby forming 26116 pattern holes 19H communicating with the pattern holes 12H of the resist film 12A (see FIG. 14(c)).

Then, the insulating sheet 11 was subjected to the etching treatment at 80° C. for 10 minutes by using an amine type polyimide etchant ("TPE-3000" prepared by TORAY ENGINEERING CO., LTD.), thereby forming, on the insulating sheet 11, 26116 through holes 11H communicating with the pattern holes 19H of the first back side metal layer 19A respectively (see FIG. 15(a)).

Each of the through holes 11H took a tapered shape having a diameter which is gradually reduced from the back face of the insulating sheet 11 toward the surface thereof, and had an opening diameter on the back side of 45 µm and an opening diameter on the surface side of 25 µm (an average value).

Subsequently, the laminate material 10A was immersed in a sodium hydroxide solution at 45° C. for 2 minutes, thereby removing the resist film 12A from the laminate material 10A. For the laminate material 10A, then, a resist film 13A was formed in order to cover a whole surface of the first back side metal layer 19A by a dry film resist (prepared by HITACHI CHEMICAL CO., LTD.; PHOTEK RY-3210) having a thickness of 10 µm. Furthermore, 26116 rectangular pattern holes 13H having a diameter of 60 µm which communicate with the through holes 11H of the insulating sheet 11 were formed on the resist film 13A (see FIG. 15(b)).

In the formation of the resist film 13A, an exposing treatment was carried out by irradiating 80 mJ of ultraviolet rays by means of a high-pressure mercury lamp and a developing treatment was carried out by repeating an operation for performing an immersion in a developer constituted by a 1% sodium hydroxide solution for 40 seconds twice.

Thus, the back face of the insulating sheet 11 was provided with 26116 concave portions 10K for forming a surface electrode portion with which the through holes 11H of the insulating sheet 11, the pattern holes 19H of the first back side metal layer 19A and the pattern holes 13H of the resist film 13A communicate, respectively.

Subsequently, the laminate material 10A was immersed in a plating bath containing nickel sulfamate, and was subjected to an electrolytic plating treatment by using the surface side metal layer 16A as an electrode, thereby filling a metal in each of the concave portions 10K for forming a surface electrode portion. Consequently, there were formed a surface electrode portion 16 and holding portions 19 coupled to each other through the first back side metal layer 19A (see FIG. 15(c)).

Then, the laminate material 10A provided with the surface electrode portion 16 was immersed in the sodium hydroxide solution at 45° C. for 2 minutes, thereby removing the resist film 13A from the laminate material 10A.

Thereafter, a polyimide layer 218A having a thickness of about 12 µm was formed on the first back side metal layer 19A and a surface of the holding portion 19 in the laminate material 10A by repeating the coating and drying of a polyimide varnish (product name: U-Varnish, manufactured by UBE INDUSTRIES, LTD.).

Next, a polyimide film 218B having a diameter of 20.4 cm and a thickness of 25 µm, on which a metal sheet having a diameter of 22 cm and a thickness of 10 µm and formed of a 42-alloy was integrated and laminated, was laminated on the liquid polyimide layer 218A thus formed, in such a manner that a polyimide film side comes into contact with the polyimide layer 218A.

Then, a protective tape having an inside diameter of 20.4 cm and an outside diameter of 22 cm and formed of polyethylene terephthalate was disposed on a surface of a peripheral edge portion of the metal sheet at a side provided in contact with the liquid polyimide layer 218A, and a thermal pressure bonding treatment was carried out in this state. Consequently, a laminate material 10B shown in FIG. 16(a) was fabricated.

In the laminate material 10B, the insulating layer 18B formed of a polyimide sheet having a thickness of 36 µm is laminated on one of the surfaces of the laminate material 10A provided with the surface electrode portion 16 and the second back side metal layer 17A formed of the 42-alloy is formed on the surface of the insulating layer 18B (see FIG. 16(a)).

For the laminate material 10B, subsequently, a resist film 28A provided with 26116 circular pattern holes 28H having a diameter of 60 µm was formed on a whole surface of the second back side metal layer 17A in accordance with a pattern corresponding to a pattern of the electrode to be inspected which is formed in the wafer W1 for a test (see FIG. 16(b)).

In the formation of the resist film 28A, an exposing treatment was carried out by irradiating 80 mJ of ultraviolet rays by means of a high-pressure mercury lamp and a developing treatment was carried out by repeating an operation for performing an immersion in a developer constituted by a 1% sodium hydroxide solution for 40 seconds twice.

Subsequently, the second back side metal layer 17A was subjected to an etching treatment at 50° C. for 30 seconds by using an iron(III) chloride type etchant, thereby forming, on the second back side metal layer 17A, 26116 pattern holes 17H communicating with the pattern holes 28H of the resist film 28A respectively (see FIG. 16(c)).

Then, the insulating layer 18B was subjected to the etching treatment at 80° C. for 15 minutes by using an amine type polyimide etchant ("TPE-3000" prepared by TORAY ENGINEERING CO., LTD.), thereby forming, on the insulating layer 18B, 26116 through holes 18H communicating with the pattern holes 17H of the second back side metal layer 17A respectively (see FIG. 17(a)).

Each of the through holes 18H took a tapered shape having a diameter which is gradually reduced toward the surface of the insulating layer 18B and had a bottom face from which the back electrode portion 17 is exposed, and had an opening diameter on the back side of 80 μm and an opening diameter on the surface side of 35 μm.

Subsequently, the laminate material 10B provided with the through holes 18H was immersed in a sodium hydroxide solution at 45° C. for 2 minutes, thereby removing the resist film 28A from the laminate material 10B. For the laminate material 10B, then, a resist film 29A was formed in order to cover a whole surface of the second back side metal layer 17A by a dry film resist having a thickness of 25 μm. Furthermore, 26116 rectangular pattern holes 29H having a dimension of 200 μm×80 μm which communicate with the through holes 18H of the insulating layer 18B were formed on the resist film 29A (see FIG. 17(b)).

In the formation of the resist film 29A, an exposing treatment was carried out by irradiating 80 mJ of ultraviolet rays by means of a high-pressure mercury lamp and a developing treatment was carried out by repeating an operation for performing an immersion in a developer constituted by a 1% sodium hydroxide solution for 40 seconds twice.

Thus, the back face of the laminate material 10B was provided with 26116 concave portions 18K for forming a short circuit portion with which the through hole 18H of the insulating layer 18B, the pattern holes 17H of the second back side metal layer 17A and the pattern holes 29H of the resist film 29A communicate, respectively.

Subsequently, the laminate material 10B was immersed in a plating bath containing nickel sulfamate, and was subjected to an electrolytic plating treatment by using the surface side metal layer 16A as an electrode, thereby filling a metal in each of the concave portions 18K for forming a short circuit portion. Consequently, there were formed the back electrode portions 17 coupled to the surface electrode portion 16 and coupled to each other through the short-circuit portion 18 and the second back side metal layer 17A (see FIG. 17(c)).

Subsequently, the laminate material 10B was immersed in a sodium hydroxide solution at 45° C. for 2 minutes, thereby removing the resist film 29A from the laminate material 10B. Then, a resist film 29B for etching which has a pattern hole 29K was formed by a dry film resist having a thickness of 25 μm through patterning in order to cover a portion to be a metal frame plate 25 in the second back side metal layer 17A and the back electrode portion 17 (see FIG. 18(a)).

In the formation of the resist film 29B, an exposing treatment was carried out by irradiating 80 mJ of ultraviolet rays by means of a high-pressure mercury lamp and a developing treatment was carried out by repeating an operation for performing an immersion in a developer constituted by a 1% sodium hydroxide solution for 40 seconds twice.

Then, the protective film 40A was removed from the laminate material 10B. Thereafter, the surface side metal layer 16A and the second back side metal layer 17A were subjected to the etching treatment at 50° C. for 30 seconds by using an ammonium type etchant, thereby removing the whole surface side metal layer 16A and removing a portion of the second back side metal layer 17A which is exposed from the pattern hole 29K. Consequently, the back electrode portions 17 were separated from each other, and furthermore, there was formed the metal frame plate 25 having a plurality of opening portions 26 provided in accordance with a pattern corresponding to a pattern of an electrode region in an integrated circuit formed in the wafer W1 for a test (see FIG. 18(b)).

Each of the opening portions 26 provided on the metal frame plate 25 has a dimension of 3600 μm in a transverse direction by 1000 μm in a longitudinal direction.

Subsequently, the laminate material 10B was immersed in a sodium hydroxide solution at 45° C. for 2 minutes, thereby removing the resist film 29B from the back face of the metal frame plate 25 and the back electrode portion 17.

Then, a resist film 17E was formed by a dry film resist having a thickness of 25 μm in order to cover the back face of the metal frame plate 25, the back face of the insulating layer 18B and the back electrode portion 17. Furthermore, the resist film 17E was covered with a protective film 40B having a thickness of 25 μm and formed of polyethylene terephthalate (see FIG. 18(c)).

Thereafter, the laminate material 10B was subjected to the etching treatment at 80° C. for 10 minutes by using an amine type polyimide etchant ("TPE-3000" prepared by TORAY ENGINEERING CO., LTD.), thereby removing the insulating sheet 11 and obtaining a laminate material 10C (see FIG. 19(a)).

Subsequently, a patterned resist film 14A was formed by a dry film resist having a thickness of 25 μm in order to cover the surface electrode portion 16 and a portion of the first back side metal layer 19A which is to be the holding portion 19 (see FIG. 19(b)).

In the formation of the resist film 14A, an exposing treatment was carried out by irradiating 80 mJ of ultraviolet rays by means of a high-pressure mercury lamp and a developing treatment was carried out by repeating an operation for performing an immersion in a developer constituted by a 1% sodium hydroxide solution for 40 seconds twice.

Thereafter, the first back side metal layer 19A was subjected to the etching treatment at 50° C. for 30 seconds by using an iron(III) chloride type etchant, thereby forming the circular holding portion 19 extended outward along the surface of the insulating layer 18B continuously from a peripheral surface of a base end portion of the surface electrode portion 16 and having a diameter of 60 μm. Thus, an electrode structure 15 was formed (see FIG. 19(c)).

In such a state, the laminate material 10C was subjected to the etching treatment at 40° C. for 3 minutes by using an amine type polyimide etchant ("TPE-3000" prepared by TORAY ENGINEERING CO., LTD.), thereby removing the surface portion of the insulating layer 18B (see FIG. 13(a)).

Subsequently, the resist film 14A was removed from the surface electrode portion 16 and the holding portion 19 by an immersion in a sodium hydroxide solution at 45° C. for 2 minutes.

Then, a resist film was formed by a dry film resist having a thickness of 25 μm in order to cover the surface electrode portion 16 and the insulating layer 18B in the laminate material 10C, and a patterned resist film 17F was formed in order to cover a portion to be a contact film 9 (FIG. 13(b)).

Each of the resist films 17F has a dimension of 4600 μm in a transverse direction by 2000 μm in a longitudinal direction.

In this state, the etching treatment was carried out at 80° C. for 10 minutes by using an amine type polyimide etchant ("TPE-3000" prepared by TORAY ENGINEERING CO., LTD.), thereby obtaining a laminate material 10C comprising the contact film 9 having the electrode structure 15 formed in each of the through holes of the metal frame plate (FIG. 13(c)).

Thereafter, the protective film 40B was removed from the laminate material 10C, and subsequently, the resist film 17E and the resist film 17F were removed by an immersion in the sodium hydroxide solution at 45° C. for 2 minutes.

Then, the protective tape formed of polyethylene terephthalate was removed from a peripheral edge portion in the metal frame plate 25 and an adhesive (CEMEDINE CO., LTD.: two-liquid type acryl adhesive Y-620) was applied to a surface of the peripheral edge portion in the metal frame plate 25 to form an adhesive layer. Then, a ring-shaped holding member 40 having an outside diameter of 22 cm, an inside diameter of 20.5 cm and a thickness of 2 mm and formed of silicon nitride was disposed, and the holding member 40 and the metal frame plate 25 were thereafter pressurized at a load of 50 kg and was held at 25° C. for 8 hours and the holding member 40 was thus bonded to the metal frame plate 25. Thus, the sheet-like probe 10 according to the present invention was manufactured.

In the foregoing, H-K350 manufactured by HITACHI CHEMICAL CO., LTD. was used for the dry film resist which has not been particularly described.

In the sheet-like probe 10 thus obtained, the insulating layer 18B has a thickness d of 25 μm, the surface electrode portion 16 of the electrode structure 15 takes a shape of a truncated cone, a base end thereof has a radius R1 of 45 μm, a tip thereof has a radius R2 of 25 μm and a projection height h is 12.5 μm.

Moreover, the short circuit portion 18 takes a shape of a truncated cone, one of ends on a surface side thereof has a radius R3 of 35 μm, a thickness d3 of 36 μm, and the other end on a back side thereof has a radius R4 of 80 μm. In addition, the back electrode portion 17 takes a shape of a rectangular plate and has a lateral width (radius R5) of 80 μm, a longitudinal width of 200 μm and a thickness d2 of 35 μm. Furthermore, the holding portion 19 takes a circular shape and has a diameter of 60 μm and a thickness d1 of 14 μm.

Thus, four sheet-like probes in total were manufactured. These sheet-like probes are set to be "a sheet-like probe M1" to "a sheet-like probe M4".

Example 2

Similarly to Example 1, there was obtained the laminate material 10A which was provided with the surface electrode portion 16 and the holding portion 19 (see FIG. 15(c)).

Then, the laminate material 10A provided with the surface electrode portion 16 was immersed in the sodium hydroxide solution at 45° C. for 2 minutes, thereby removing the resist film 13A from the laminate material 10A.

Thereafter, a polyimide layer 218A having a thickness of about 12 μm was formed on the first back side metal layer 19A and a surface of the holding portion 19 in the laminate material 10A by repeating the coating and drying of a polyimide varnish (product name: U-Varnish, manufactured by UBE INDUSTRIES, LTD.) (see FIG. 20(c)).

Next, a polyimide film 218B having a diameter of 20.4 cm and a thickness of 25 μm, on which a metal sheet having a diameter of 22 cm and a thickness of 10 μm and formed of a 42-alloy was laminated on one face and a copper layer having a diameter of 20.4 cm and a thickness of 4 μm was laminated on another face, was laminated on the liquid polyimide layer 218A thus formed, in such a manner that a copper layer side comes into contact with the polyimide layer 218A.

Then, a protective tape having an inside diameter of 20.4 cm and an outside diameter of 22 cm and formed of polyethylene terephthalate was disposed on a surface of a peripheral edge portion of the metal sheet at a side provided in contact with the liquid polyimide layer 218A, and a thermal pressure bonding treatment was carried out in this state. Consequently, a laminate material 10B shown in FIG. 21(a) was fabricated.

In the laminate material 10B, the insulating layer 18B formed of a polyimide sheet having a thickness of 40 μm and having a metal layer 219 formed of a copper having a thickness of 4 μm inside is laminated on one of the surfaces of the laminate material 10A provided with the surface electrode portion 16 and the second back side metal layer 17A formed of the 42-alloy is formed on the surface of the insulating layer 18B (see FIG. 21(a)).

For the laminate material 10B, subsequently, a resist film 28A provided with 26116 circular pattern holes 28H having a diameter of 60 μm was formed on a whole surface of the second back side metal layer 17A in accordance with a pattern corresponding to a pattern of the electrode to be inspected which is formed in the wafer W1 for a test (see FIG. 21(b)).

In the formation of the resist film 28A, an exposing treatment was carried out by irradiating 80 mJ of ultraviolet rays by means of a high-pressure mercury lamp and a developing treatment was carried out by repeating an operation for performing an immersion in a developer constituted by a 1% sodium hydroxide solution for 40 seconds twice.

Subsequently, the second back side metal layer 17A was subjected to an etching treatment at 50° C. for 30 seconds by using an iron (III) chloride type etchant, thereby forming, on the second back side metal layer 17A, 26116 pattern holes 17H communicating with the pattern holes 28H of the resist film 28A respectively (see FIG. 21(c)).

Then, the insulating layer 18B was subjected to the etching treatment at 80° C. for 10 minutes by using an amine type polyimide etchant ("TPE-3000" prepared by TORAY ENGINEERING CO., LTD.), thereby forming, on the insulating layer 18B, the opening portions communicating with the pattern holes 17H of the second back side metal layer 17A respectively and exposing the metal layer 219 at the bottom.

Subsequently, the metal layer 219 exposed at the bottom of the opening portions on the insulating layer 18B was subjected to an etching treatment at 50° C. for 30 seconds by using an iron (III) chloride type etchant, thereby removing the metal layer 219.

Then, the insulating layer 18B was subjected to the etching treatment at 80° C. for 10 minutes by using an amine type polyimide etchant ("TPE-3000" prepared by TORAY ENGINEERING CO., LTD.), thereby forming, on the insulating layer 18B, 26116 through holes 18H communicating with the pattern holes 17H of the second back side metal layer 17A respectively (see FIG. 22(a))

Each of the through holes 18H took a tapered shape having a diameter which is gradually reduced toward the surface of the insulating layer 18B and had a bottom face from which the back electrode portion 17 is exposed, and had an opening diameter on the back side of 80 μm and an opening diameter on the surface side of 35 μm.

Subsequently, the laminate material 10B provided with the through holes 18H was immersed in a sodium hydroxide solution at 45° C. for 2 minutes, thereby removing the resist film 28A from the laminate material 10B (see FIG. 23(a)).

In such a state, the laminate material 10B was subjected to an electroless copper plating treatment and was subjected to an electrolytic copper plating treatment by using the surface side metal layer 16A as an electrode, thereby forming the metal thin layer 220 made of a copper having a thickness of about 1 μm on the internal surface of the through holes 18H.

For the laminate material 10B, then, a resist film 29A was formed in order to cover a whole surface of the second back side metal layer 17A by a dry film resist having a thickness of 25 μm. Furthermore, 26116 rectangular pattern holes 29H having a dimension of 200 μm×80 μm which communicate with the through holes 18H of the insulating layer 18B were formed on the resist film 29A.

In the formation of the resist film 29A, an exposing treatment was carried out by irradiating 80 mJ of ultraviolet rays by means of a high-pressure mercury lamp and a developing treatment was carried out by repeating an operation for performing an immersion in a developer constituted by a 1% sodium hydroxide solution for 40 seconds twice.

Thus, the back face of the laminate material 10B was provided with 26116 concave portions 18K for forming a short circuit portion with which the through hole 18H of the insulating layer 18B, the pattern holes 17H of the second back side metal layer 17A and the pattern holes 29H of the resist film 29A communicate, respectively (see FIGS. 22(b) and 23(b)).

Subsequently, the laminate material 10B was immersed in a plating bath containing nickel sulfamate, and was subjected to an electrolytic plating treatment by using the surface side metal layer 16A as an electrode, thereby filling a metal in each of the concave portions 18K for forming a short circuit portion. Consequently, there were formed the back electrode portions 17 coupled to the surface electrode portion 16 and coupled to each other through the short-circuit portion 18 and the second back side metal layer 17A (see FIGS. 22(c) and 23(c)).

Subsequently, the laminate material 10B was immersed in a sodium hydroxide solution at 45° C. for 2 minutes, thereby removing the resist film 29A from the laminate material 10B. Then, a resist film 29B for etching which has a pattern hole 29K was formed by a dry film resist having a thickness of 25 μm through patterning in order to cover a portion to be a metal frame plate 25 in the second back side metal layer 17A and the back electrode portion 17 (see FIG. 24(a)).

In the formation of the resist film 29B, an exposing treatment was carried out by irradiating 80 mJ of ultraviolet rays by means of a high-pressure mercury lamp and a developing treatment was carried out by repeating an operation for performing an immersion in a developer constituted by a 1% sodium hydroxide solution for 40 seconds twice.

Then, the protective film 40A was removed from the laminate material 10B. Thereafter, the surface side metal layer 16A and the second back side metal layer 17A were subjected to the etching treatment at 50° C. for 30 seconds by using an ammonium type etchant, thereby removing the whole surface side metal layer 16A and removing a portion of the second back side metal layer 17A which is exposed from the pattern hole 29K. Consequently, the back electrode portions 17 were separated from each other, and furthermore, there was formed the metal frame plate 25 having a plurality of opening portions 26 provided in accordance with a pattern corresponding to a pattern of an electrode region in an integrated circuit formed in the wafer W1 for a test (see FIG. 24(b)).

Each of the opening portions 26 provided on the metal frame plate 25 has a dimension of 3600 μm in a transverse direction by 1000 μm in a longitudinal direction.

Subsequently, the laminate material 10B was immersed in a sodium hydroxide solution at 45° C. for 2 minutes, thereby removing the resist film 29B from the back face of the metal frame plate 25 and the back electrode portion 17.

Then, a resist film 17E was formed by a dry film resist having a thickness of 25 μm in order to cover the back face of the metal frame plate 25, the back face of the insulating layer 18B and the back electrode portion 17. Furthermore, the resist film 17E was covered with a protective film 40B having a thickness of 25 μm and formed of polyethylene terephthalate (see FIG. 24(c)).

Thereafter, the laminate material 10B was subjected to the etching treatment at 80° C. for 10 minutes by using an amine type polyimide etchant ("TPE-3000" prepared by TORAY ENGINEERING CO., LTD.), thereby removing the insulating sheet 11 and obtaining a laminate material 10C (see FIG. 25(a)).

Subsequently, a patterned resist film 14A was formed by a dry film resist having a thickness of 25 μm in order to cover the surface electrode portion 16 and a portion of the first back side metal layer 19A which is to be the holding portion 19 (see FIG. 25(b)).

In the formation of the resist film 14A, an exposing treatment was carried out by irradiating 80 mJ of ultraviolet rays by means of a high-pressure mercury lamp and a developing treatment was carried out by repeating an operation for performing an immersion in a developer constituted by a 1% sodium hydroxide solution for 40 seconds twice.

Thereafter, the first back side metal layer 19A was subjected to the etching treatment at 50° C. for 30 seconds by using an iron (III) chloride type etchant, thereby forming the circular holding portion 19 extended outward along the surface of the insulating layer 18B continuously from a peripheral surface of a base end portion of the surface electrode portion 16 and having a diameter of 60 μm. Thus, an electrode structure 15 was formed (see FIG. 25(c)).

In such a state, the laminate material 10C was subjected to the etching treatment at 40° C. for 3 minutes by using an amine type polyimide etchant ("TPE-3000" prepared by TORAY ENGINEERING CO., LTD.), thereby removing the surface portion of the insulating layer 18B (see FIG. 26(a)).

Subsequently, the laminate material 10C, on which the surface portion of the insulating layer 18B was removed, was subjected to an etching treatment at 50° C. for 1 minute by using an iron (III) chloride type etchant, thereby removing the metal layer 219 and the metal thin layer 220.

Subsequently, the resist film 14A was removed from the surface electrode portion 16 and the holding portion 19 by an immersion in a sodium hydroxide solution at 45° C. for 2 minutes.

Then, a resist film was formed by a dry film resist having a thickness of 25 μm in order to cover the surface electrode portion 16 and the insulating layer 18B in the laminate material 10C, and a patterned resist film 17F was formed in order to cover a portion to be a contact film 9 (FIG. 26(c)).

Each of the resist films 17F has a dimension of 4600 μm in a transverse direction by 2000 μm in a longitudinal direction.

In this state, the etching treatment was carried out at 80° C. for 10 minutes by using an amine type polyimide etchant ("TPE-3000" prepared by TORAY ENGINEERING CO., LTD.), thereby obtaining a laminate material 10C comprising the contact film 9 having the electrode structure 15 formed in each of the through holes of the metal frame plate (FIG. 26(d)).

Thereafter, the protective film 40B was removed from the laminate material 10C, and subsequently, the resist film 17E and the resist film 17F were removed by an immersion in the sodium hydroxide solution at 45° C. for 2 minutes.

Then, the protective tape formed of polyethylene terephthalate was removed from a peripheral edge portion in the metal frame plate 25 and an adhesive (CEMEDINE CO., LTD.: two-liquid type acryl adhesive Y-620) was applied to a surface of the peripheral edge portion in the metal frame plate 25 to form an adhesive layer. Then, a ring-shaped holding member 40 having an outside diameter of 22 cm, an inside diameter of 20.5 cm and a thickness of 2 mm and formed of silicon nitride was disposed, and the holding member 40 and the metal frame plate 25 were thereafter pressurized at a load of 50 kg and was held at 25° C. for 8 hours and the holding member 40 was thus bonded to the metal frame plate 25. Thus, the sheet-like probe 10 according to the present invention was manufactured.

In the foregoing, H-K350 manufactured by HITACHI CHEMICAL CO., LTD. was used for the dry film resist which has not been particularly described.

In the sheet-like probe 10 thus obtained, the insulating layer 18B has a thickness d of 25 μm, the surface electrode portion 16 of the electrode structure 15 takes a shape of a truncated cone, a base end thereof has a radius R1 of 45 μm, a tip thereof has a radius R2 of 25 μm and a projection height h is 12.5 μm.

Moreover, the short circuit portion 18 takes a shape of a truncated cone, one of ends on a surface side thereof has a radius R3 of 35 μm, a thickness d3 of 40 μm, and the other end on a back side thereof has a radius R4 of 80 μm. In addition, the back electrode portion 17 takes a shape of a rectangular plate and has a lateral width (radius R5) of 80 μm, a longitudinal width of 200 μm and a thickness d2 of 35 μm. Furthermore, the holding portion 19 takes a circular shape and has a diameter of 60 μm and a thickness d1 of 14 μm.

Furthermore, a moving length of the electrode structure 15, that is, a difference between a thickness d3 of the short circuit portion 18 and a thickness d of the insulating layer 18B is about 15 μm.

Thus, four sheet-like probes in total were manufactured.

These sheet-like probes are set to be "a sheet-like probe N1" to "a sheet-like probe N4".

Comparative Example 1

Figure 44:
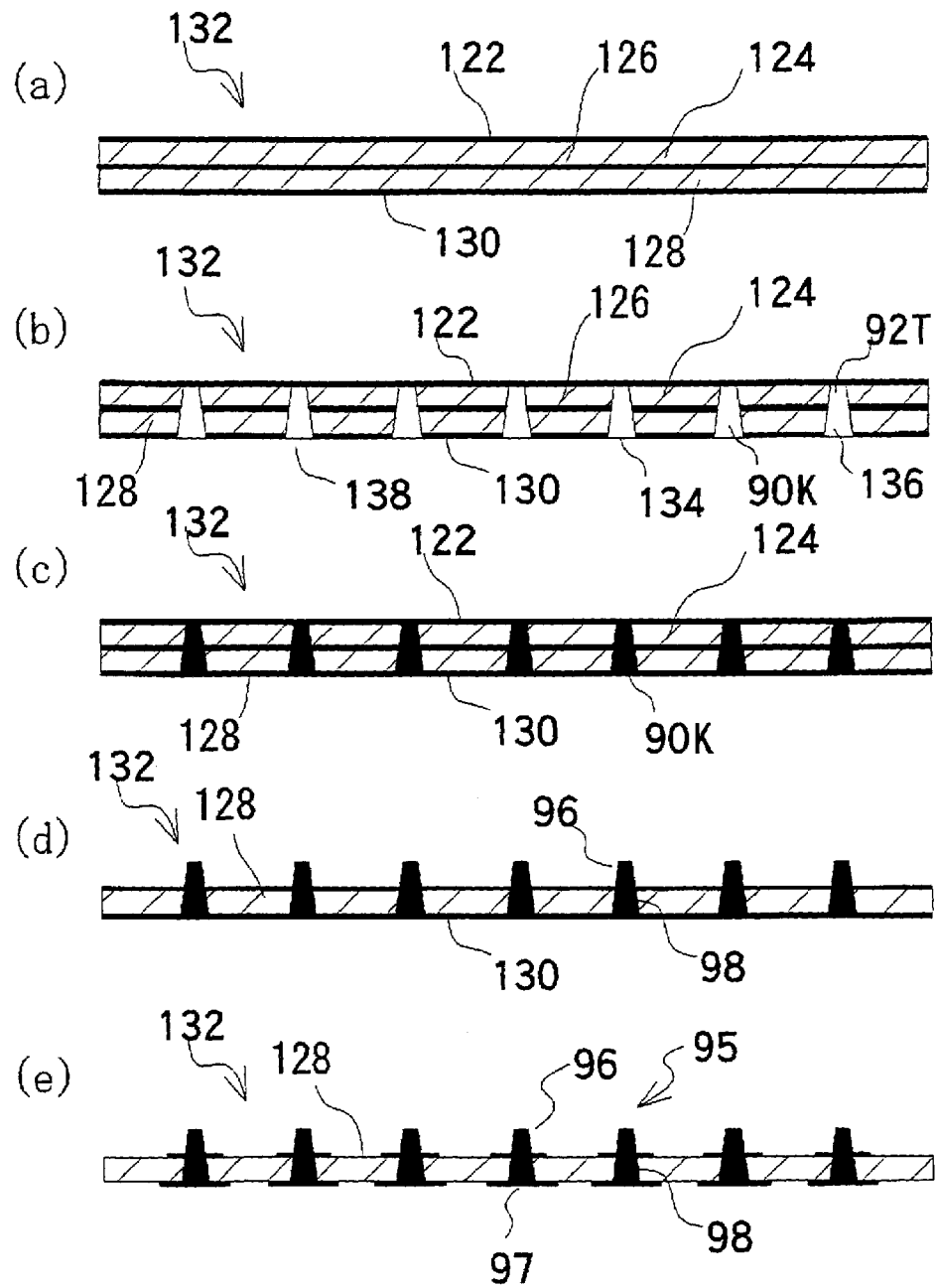
FIG. 44 is a sectional view for explaining a method of manufacturing a sheet-like probe according to a comparative example 1.
Figure 45:
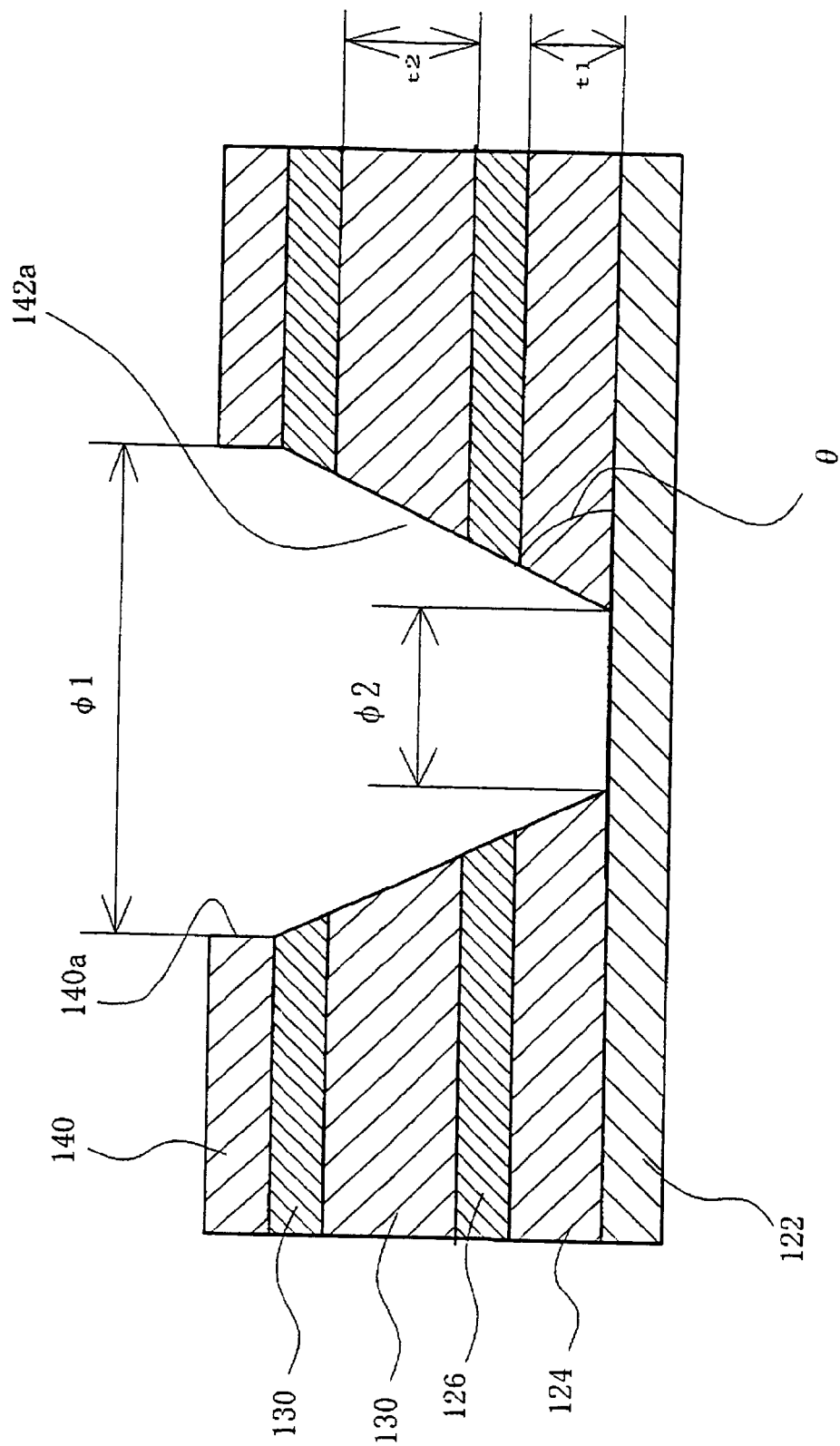
FIG. 45 is a schematic view for explaining a through hole of the conventional sheet-like probe.

There was prepared a laminate material 132 having a surface side metal layer 92A, a second back side metal layer 92B, a first back side metal layer 92C and formed of an insulating sheet 11 and an insulating layer 18B as shown in FIG. 44(a).

In the laminate material 90C, the surface side metal layer 92A was formed of copper having a thickness of 4 μm, the insulating sheet 18B was formed of polyimide having a thickness of 12.5 μm, the first back side metal layer 92C was formed of copper having a thickness of 4 μm, the insulating layer 91B was formed of polyimide having a thickness of 37.5 μm, and the second back side metal layer 92B was formed of a 42-alloy having a thickness of 10 μm.

For the laminate material 90C, in accordance with the method described in Japanese Laid-Open Patent Publication No. 2004-172589, a pattern hole having a diameter of 90 μm was formed on the second back side metal layer 92B, and a through hole linked sequentially to the insulating layer 18B, the first back side metal layer 92C, and the insulating sheet 11 was formed, and the surface side metal layer 92A was exposed from a bottom face of the through hole. Consequently, a concave portion 90K for forming an electrode structure in which a short circuit portion and a surface electrode portion are collectively formed was fabricated (see FIG. 41(b)).

Subsequently, the laminate material 90C was immersed in a plating bath containing nickel sulfamate, and was subjected to an electrolytic plating treatment by using the surface side metal layer 92A as an electrode, thereby filling a metal in each of the concave portions 90K for forming a short circuit portion (see FIG. 41(c)).

Figure 41:
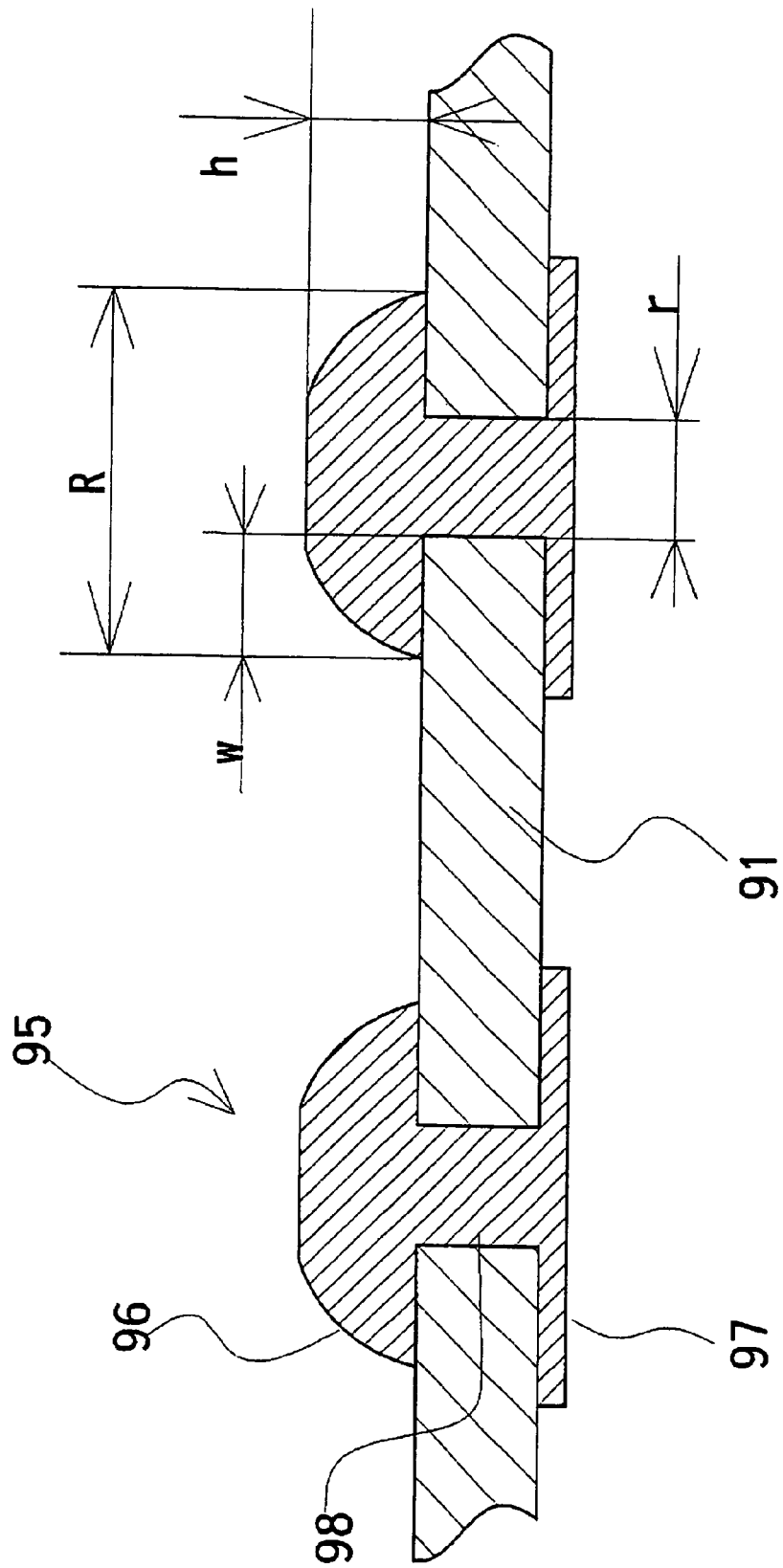
FIG. 41 is an explanatory sectional view showing an enlarged sheet-like probe in the probe card illustrated in FIG. 40.
Figure 42:
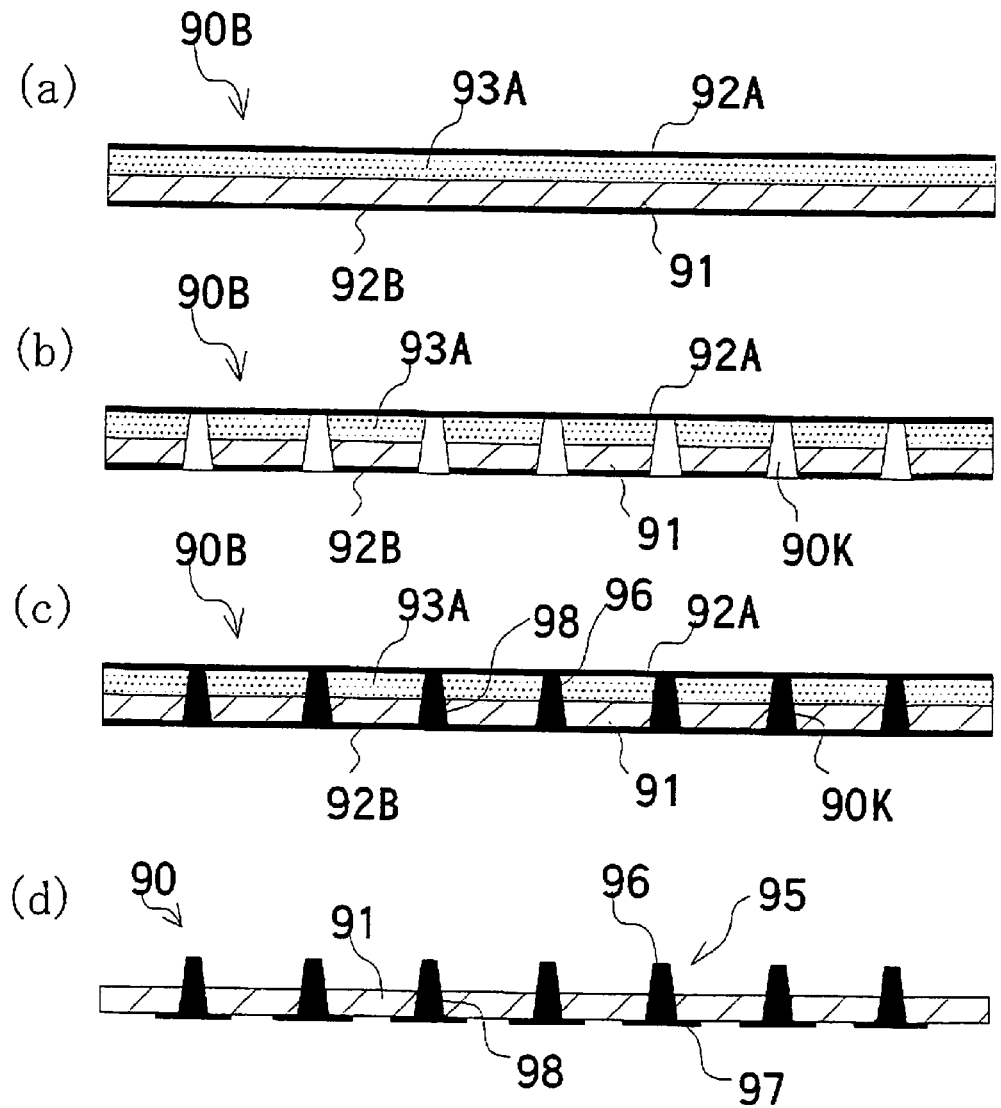
FIG. 42 is an explanatory sectional view showing another example of the manufacture of the conventional sheet-like probe.
Figure 43:
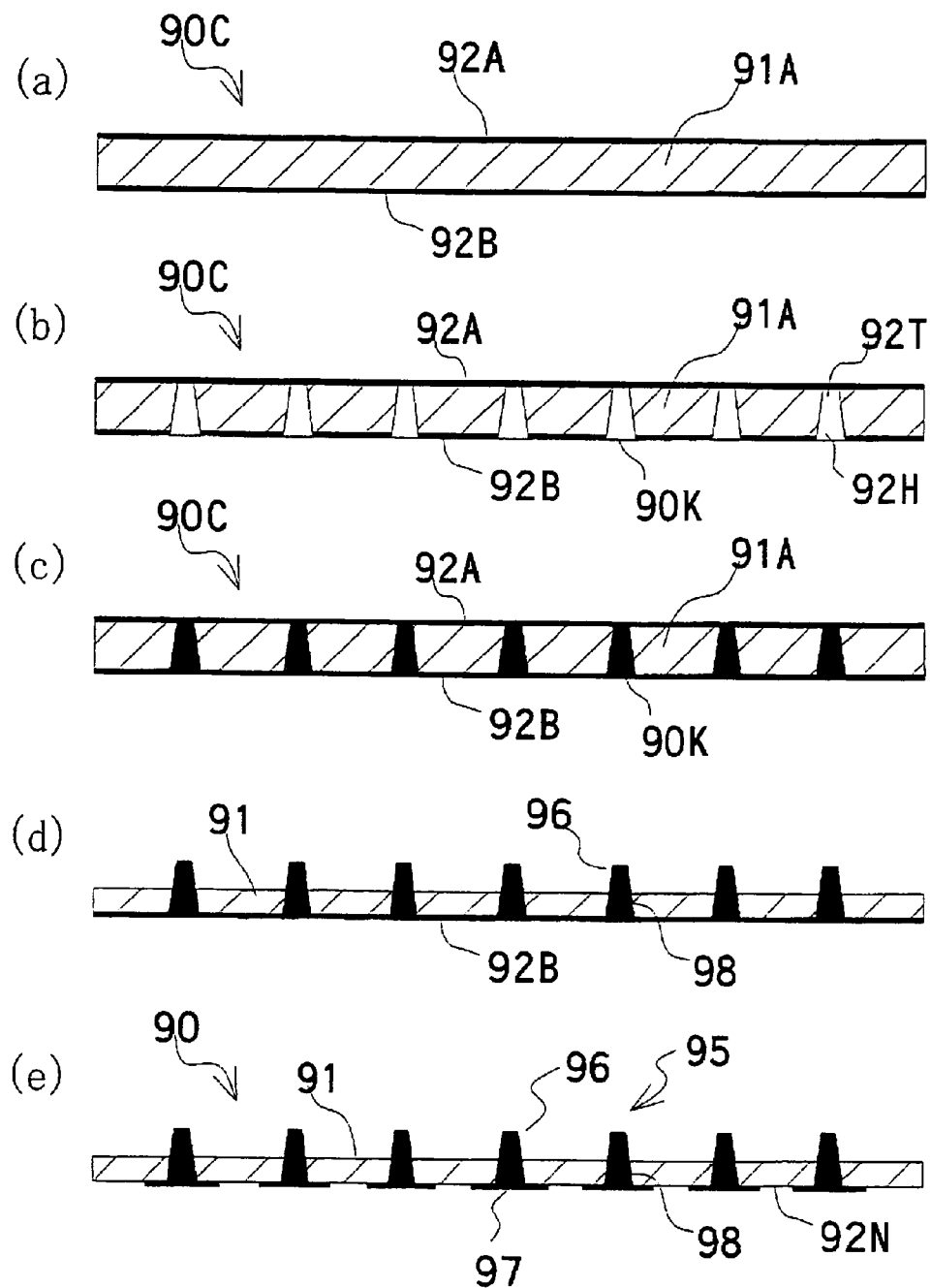
FIG. 43 is an explanatory sectional view showing a further example of the manufacture of the conventional sheet-like probe.

Next, the insulating sheet 11 was removed by etching (see FIG. 41(d)).

Then, the first back side metal layer was subjected to the etching to form a holding portion, and the second back side metal layer was subjected to the etching to remove a part thereof, thereby forming a back electrode portion and a support portion 92E, and the insulating layer 18B was subjected to the etching to divide the insulating layer into each contact film (see FIG. 41(e)).

Thereafter, an adhesive layer was formed by dropping a cyano acrylate type adhesive (product name: Aron Alpha, product number: #200, manufactured by Toagosei Co., Ltd.) on the surface of a support member 2 formed of ring-shaped silicon nitride having an outside diameter of 22 cm, an inside diameter of 20.5 cm and a thickness of 2 mm. A laminate material in which the contact film was formed was then laminated on the support member 2. Subsequently, the adhesive layer was hardened by being held at 25° C. for 30 minutes, thereby manufacturing a sheet-like probe.

In a sheet-like probe thus obtained, the insulating layer has a thickness d of 37.5 μm, the surface electrode portion of the electrode structure takes a shape of a truncated cone, a base end thereof has a radius of 37 μm, a tip thereof has a radius of 13 μm (average value) and a projection height is 12.5 μm, the holding portion has a lateral width of 60 μm, a longitudinal width of 200 μm and a thickness of 4 μm, the short circuit portion takes a shape of a truncated cone, one of ends on a surface side thereof has a radius of 37 μm, and the other end on a back side thereof has a radius of 90 μm, the back electrode portion takes a shape of a rectangular plate and has a lateral width of 90 μm, a longitudinal width of 200 μm and a thickness of 20 μm.

Thus, four sheet-like probes in total were manufactured.

These sheet-like probes are set to be "a sheet-like probe O1" to "a sheet-like probe O4".

<Fabrication of Anisotropically Conductive Connector>

(1) Preparation of Magnetic Core Particle:

By using a nickel particle ("FC1000" manufactured by Westaim Co., Ltd.) put on the market, a magnetic core particle was prepared in the following manner.

By an air classifier "TURBO-CLASSIFIER TC-15N" manufactured by NISSHIN ENGINEERING CO., LTD., 2 kg of nickel particles were subjected to a classifying treatment at a specific gravity of 8.9, a gas quantity of 2.5 m$^3$/min, a rotor speed of 2250 rpm, a classifying point of 15 μm, and a nickel particle feeding speed of 60 g/min, and 0.8 kg of nickel particles having a particle diameter of 15 μm or less were collected. Furthermore, 0.8 kg of nickel particles were subjected to the classifying treatment at a specific gravity of 8.9, a gas quantity of 2.5 m$^3$/min, a rotor speed of 2930 rpm, a classifying point of 10 μm, and a nickel particle feeding speed of 30 g/min so that 0.5 kg of nickel particles were collected.

The nickel particle thus obtained had a number-average particle diameter of 7.4 μm, a coefficient of variance of the particle diameter of 27%, a BET specific surface area of $0.46 \times 10^3$ m$^2$/kg and a saturation magnetization of 0.6 Wb/m$^2$.

The nickel particle is set to be a magnetic core particle Q.

(2) Preparation of Conductive Particle:

100 g of magnetic core particles Q were put in a treating bath of a powder plating device, and furthermore, 2 L of a 0.32N hydrochloric acid solution was added thereto and they were stirred so that a slurry containing the magnetic core particle Q was obtained. The slurry was stirred at an ordinary temperature for 30 minutes to carry out an acid treatment for the magnetic core particle Q, and was then put stationarily for one minute to precipitate the magnetic core particle Q, thereby removing a supernatant solution.

Subsequently, 2 L of pure water was added to the magnetic core particle Q subjected to the acid treatment and they were stirred for two minutes at an ordinary temperature and were then put stationarily for one minute to precipitate the magnetic core particle Q, thereby removing a supernatant solution. This operation was further repeated twice and a treatment for washing the magnetic core particle Q was carried out.

Thereafter, 2 L of a gold plating solution having a content of gold of 20 g/L was added to the magnetic core particle Q subjected to the acid treatment and the washing treatment, and a temperature in the treating bath was raised to 90° C. and they were stirred so that a slurry was prepared. In this state, gold substitution plating was carried out over the magnetic core particle Q while the slurry was stirred. Subsequently, the slurry was left and cooled, and at the same time, was put stationarily to precipitate the particle, thereby removing a supernatant solution. Thus, a conductive particle P was prepared.

2 L of pure water was added to the conductive particle thus obtained and they were stirred for two minutes at an ordinary temperature and were then put stationarily for one minute to precipitate the conductive particle, thereby removing a supernatant solution. This operation was further repeated twice and 2 L of pure water heated to 90° C. was then added, and they were stirred. A slurry thus obtained was filtrated through a filter paper, thereby recovering the conductive particle. Thereafter, the conductive particle was subjected to a drying treatment by a drier set to 90° C.

The conductive particle thus obtained had a number-average particle diameter of 7.3 μm, a BET specific surface area of $0.38 \times 10^3$ m$^2$/kg, and a value of (mass of gold forming a covered layer)/(a mass of a magnetic core particle [A]) of 0.3.

The conductive particle is set to be "a conductive particle (a)".

Figure 36:
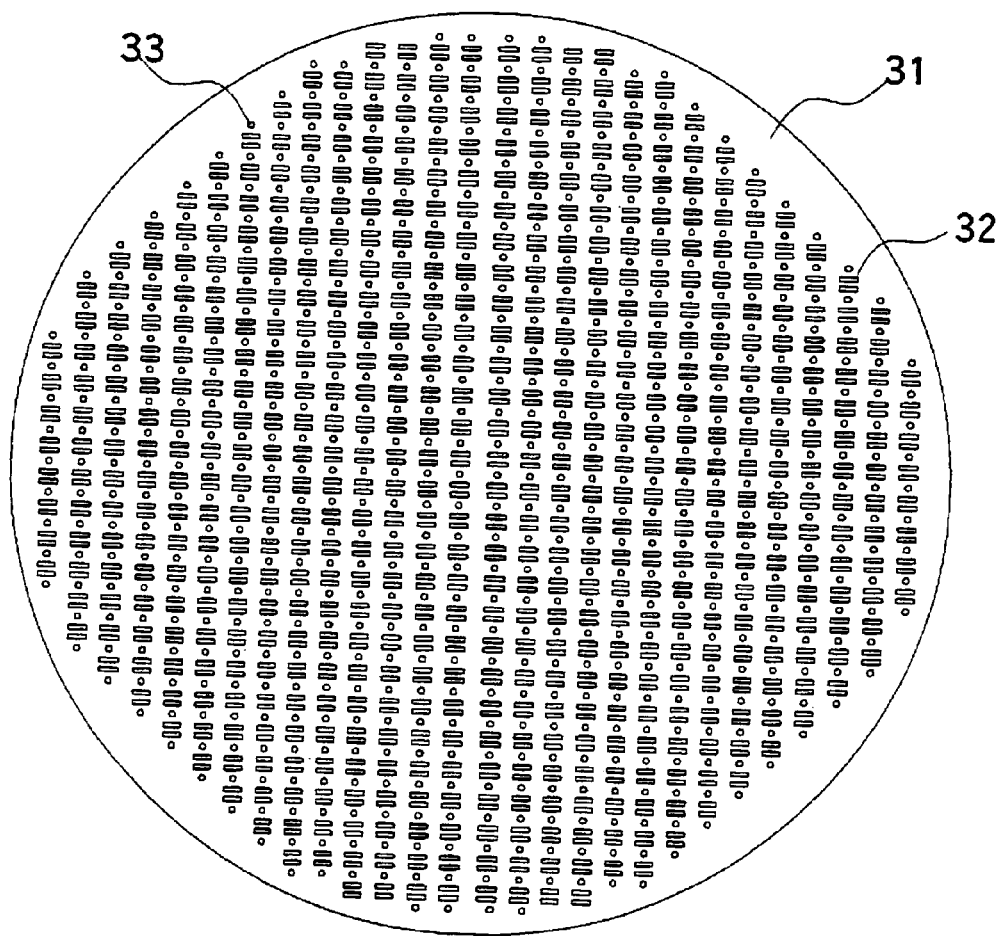
FIG. 36 is a plan view showing a frame plate in the anisotropically conductive connector fabricated in the example.
Figure 37:
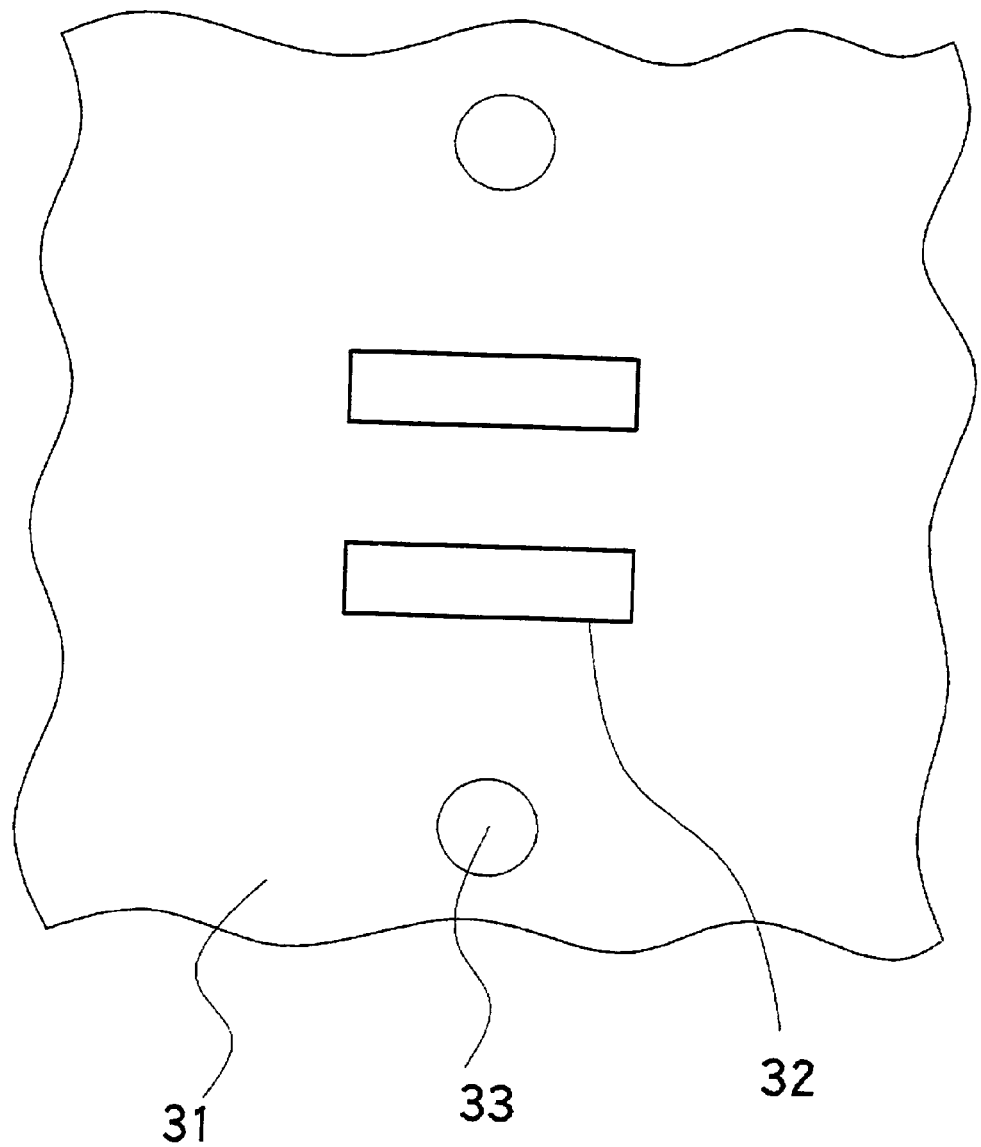
FIG. 37 is an explanatory view showing an enlarged part of the frame plate illustrated in FIG. 36.
Figure 39:
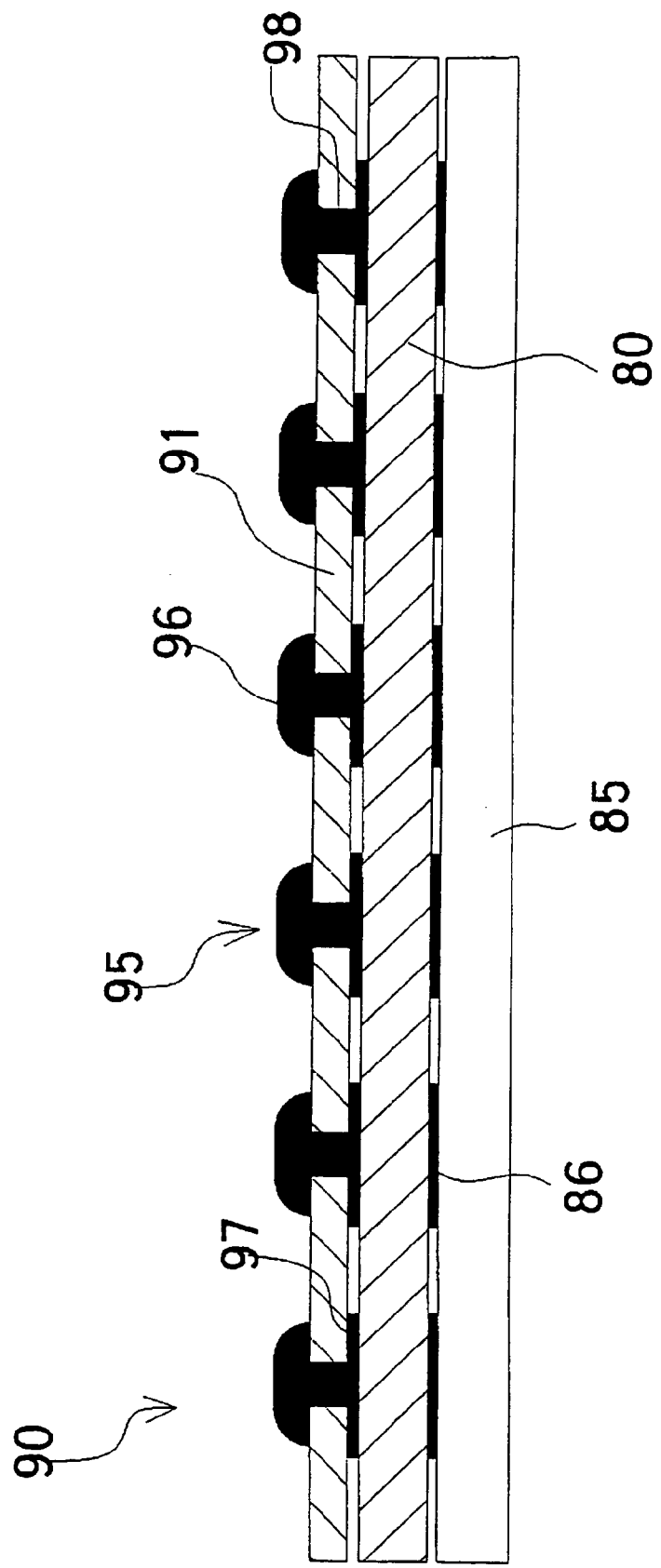
FIG. 39 is an explanatory sectional view showing a structure according to an example of a conventional probe card.
Figure 40:
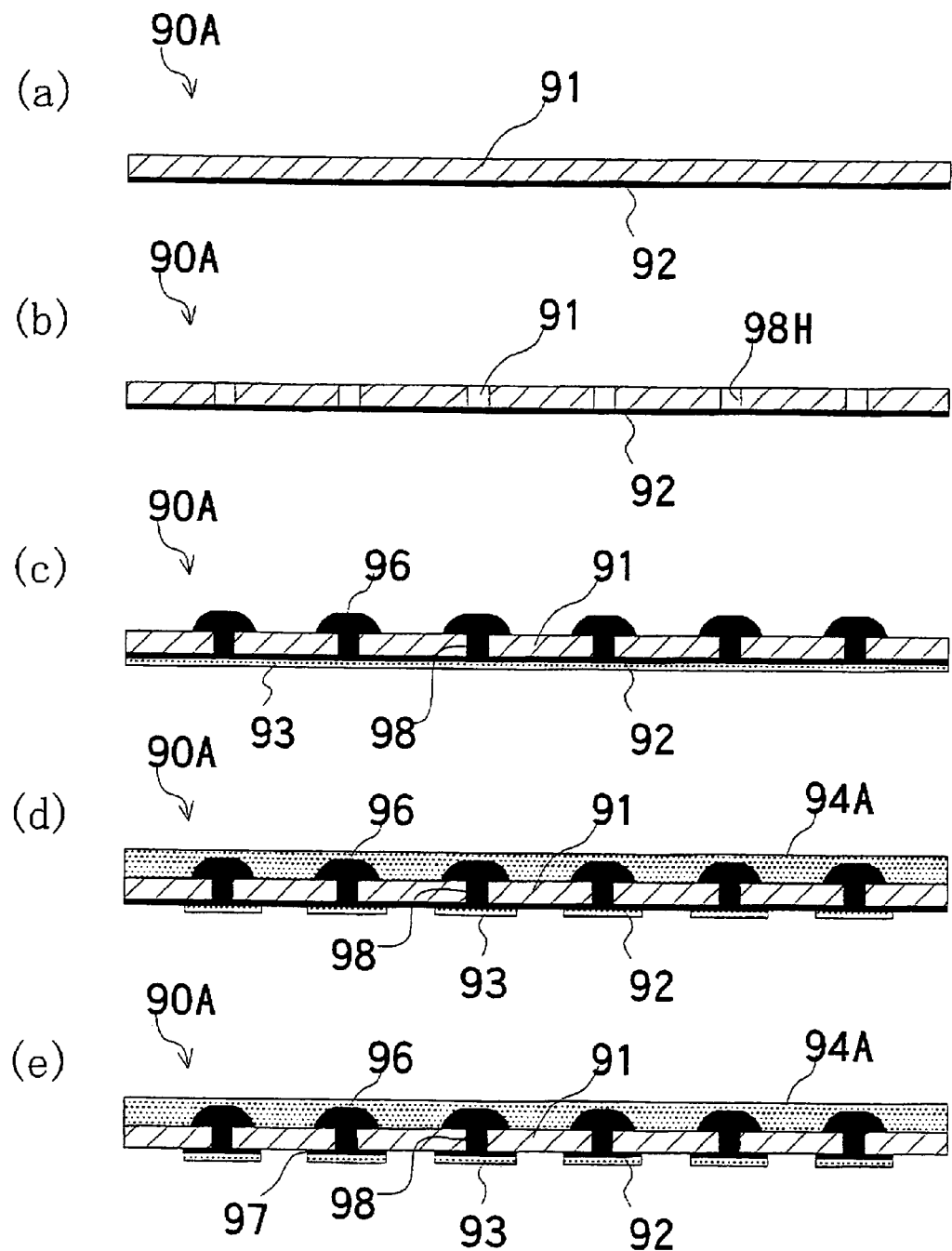
FIG. 40 is an explanatory sectional view showing an example of the manufacture of the conventional sheet-like probe.

(3) Fabrication of Frame Plate:

In accordance with structures shown in FIGS. 36 and 37, there was fabricated a frame plate 31 having a diameter of 8 inches which includes 966 openings 32 formed corresponding to each electrode region to be inspected in the wafer W1 for a test by the following conditions.

The material of the frame plate 31 is cover (a coefficient of linear thermal expansion of $5 \times 10^{-6}$/K) and as a thickness of 60 μm.

Each of the openings 32 has a dimension of 3600 μm in a transverse direction (a lateral direction in FIGS. 36 and 37) and a dimension of 900 μm in a longitudinal direction (a vertical direction in FIGS. 36 and 37).

Two openings 32 of the frame plate 31 are formed for one integrated circuit L formed on the wafer for a test as shown in FIG. 37 and the openings 32 of the frame plate 31 provided for the same integrated circuit L are disposed in a pitch of 2000 μm at a distance between centers (the vertical direction in FIG. 37).

A circular air inflow hole 33 is formed in a central position between the openings 32 which are adjacent to each other in a longitudinal direction and has a diameter of 1000 μm.

(4) Preparation of Molding Material for Anisotropically Conductive Sheet:

30 parts by weight of conductive particles were added to and mixed with 100 parts by weight of the addition type liquid silicone rubber. Thereafter, the resultant mixture was subjected to a defoaming treatment by a pressure reduction, thereby preparing a molding material for an anisotropically conductive sheet.

In the above-described process, the addition type liquid silicone rubber which was used is of a two-liquid type containing liquids A and B having a viscosity of 250 Pa·s respectively, and a cured product thereof has a compression set of 5%, a durometer A hardness of 32 and a tear strength of 25 kN/m.

The characteristics of the addition type liquid silicone rubber and the cured product were measured in the following manner.

(i) For the viscosity of the addition type liquid silicone rubber, a value at 23±2° C. was measured by means of a Brookfield type viscometer.

(ii) The compression set of the cured product of the silicone rubber was measured in the following manner.

The liquids A and B in the addition type liquid silicone rubber of the two-liquid type were stirred and mixed in proportions that their amounts are equal to each other. After this mixture was then poured into a mold and was subjected to a defoaming treatment by a pressure reduction, a curing treatment was conducted under conditions of 120° C. for 30 minutes, thereby producing a columnar body formed of a cured product of the silicone rubber which has a thickness of 12.7 mm and a diameter of 29 mm. The columnar body was post-cured under conditions of 200° C. for 4 hours. The columnar body thus obtained was used as a specimen to measure a compression set at 150±2° C. in accordance with JIS K 6249.

(iii) A tear strength of the cured product of the silicone rubber was measured in the following manner.

The curing treatment and post curing for the addition type liquid silicone rubber was conducted under the same conditions as in (ii), thereby producing a sheet having a thickness of 2.5 mm.

A crescent type specimen was prepared by punching this sheet to measure a tear strength at 23±2° C. in accordance with the JIS K 6249.

(iv) For a durometer A hardness, five sheets produced in the same manner as in (iii) were stacked on one another, and the resultant laminate body was used as a specimen to measure a value at 23±2° C. in accordance with the JIS K 6249.

(5) Fabrication of Anisotropically Conductive Connector:

The frame plate 31 fabricated in the (3) and the molding material prepared in the (4) were used to form 966 anisotropically conductive sheets 35 having such a structure as to be disposed to close the respective openings 32 of the frame plate 31 and to be fixed and supported onto an opening edge portion of the frame plate 31 as shown in FIG. 30 in accordance with the method described in the Japanese Laid-Open Patent Publication No. 2002-324600. Thus, the anisotropically conductive connector 30 was manufactured.

A treatment for curing the molding material layer was carried out for one hour at 100° C. while a magnetic field of 2 T acts in the direction of a thickness by means of an electromagnet.

More specific description will be given to the anisotropically conductive sheet 35 thus obtained. Each of the anisotropically conductive sheets 35 has a dimension in a transverse direction of 6000 μm and a dimension in a longitudinal direction of 2000 μm, and 26 conducting portions 36 are arranged in a line in a transverse direction at a pitch of 120 μm. In addition, each of the conducting portions 36 has a dimension in a transverse direction of 60 μm, a dimension in a longitudinal direction of 200 μm, and a thickness of 150 μm.

Moreover, the projected portion 38 has a projection height of 25 μm and the insulating portion 37 has a thickness of 100 μm.

Moreover, the conducting portion 36 for non-connection is disposed between the conducting portion 36 positioned on an outermost side in the transverse direction and an opening edge of the frame plate 31.

Each of the conducting portions 36 for non-connection has a dimension in a transverse direction of 60 μm, a dimension in a longitudinal direction of 200 μm, and a thickness of 150 μm.

Furthermore, the content rate of the conductive particles in the conducting portion 36 in each anisotropically conductive sheet 35 was examined. All of the conducting portions 36 had a volume fraction of approximately 25%.

Thus, 12 anisotropically conductive connectors in total were manufactured.

These anisotropically conductive connectors are set to be "an anisotropically conductive connector C1" to "an anisotropically conductive connector C12".

<Fabrication of Circuit Board for Inspection>

Alumina ceramics (a coefficient of linear thermal expansion of $4.8 \times 10^{-6}$/K) was used as a board material and a circuit board 20 for inspection which is provided with an inspection electrode 21 was fabricated in accordance with a pattern corresponding to a pattern of an electrode to be inspected in the wafer W1 for a test.

The circuit board 20 for an inspection takes a rectangular shape having a whole dimension of 30 cm×30 cm, and the inspection electrode has a dimension in a transverse direction of 60 μm and a dimension in a longitudinal direction of 200 μm. The circuit board for an inspection thus obtained is set to be "a circuit board T1 for an inspection".

<Evaluation of Sheet-Like Probe>

(1) Test 1 (Insulating Property between Adjacent Electrode Structures):

For each of sheet-like probes M1 and M2, sheet-like probes N1 and N2, and sheet-like probes O1 and O2, an insulating property between adjacent electrode structures was evaluated in the following manner.

At a room temperature (25° C.), the wafer W1 for a test was disposed on a test table and the sheet-like probe was provided on a surface of the wafer W1 for a test in such a manner that each of the surface electrode portions 16 was aligned to be positioned on the electrode 7 to be inspected in the wafer W1 for a test. Moreover, the anisotropically conductive connector 30 was disposed on the sheet-like probe in such a manner that each of the conducting portions 36 was aligned to be positioned on the back electrode portion 17 of the sheet-like probe. In addition, a circuit board T1 for an inspection was disposed on the anisotropically conductive connector 30 in such a manner that each of the inspection electrodes 21 was aligned to be positioned on the conducting portion 36 of the anisotropically conductive connector 30. Furthermore, the circuit board T1 for an inspection was pressurized downward at a load of 200 kg (a load to be applied per electrode structure is approximately 8 g on average).

The anisotropically conductive connector 30 shown in the following Table 1 was used.

A voltage was sequentially applied to each of 26116 inspection electrodes 21 in the circuit board T1 for an inspection. Furthermore, an electric resistance between the inspection electrode having the voltage applied thereto and another inspection electrode was measured as an electric resistance between the electrode structures 15 in the sheet-like probe (which will be hereinafter referred to as an "insulating resistance"). As a result, a rate of any of all measuring points on which the insulating resistance is equal to or lower than 10 MΩ (which will be hereinafter referred to as an "insulating failure rate") were obtained.

In the case in which the insulating resistance is equal to or lower than 10 MΩ, it is hard to practically carry out use in an electrical inspection for an integrated circuit formed on a wafer.

The above results are shown in the following Table 1.

TABLE 1

| | Sheet-like probe | Anisotropically conductive connector | Insulating failure rate |
|---|---|---|---|
| Example 1 | M1 | C1 | 0% |
| | M2 | C2 | 0% |
| Example 2 | N1 | C3 | 0% |
| | N2 | C4 | 0% |
| Comparative example 1 | O1 | C5 | 0% |
| | O2 | C6 | 0% |

(2) Test 2 (Connecting Stability of Electrode Structure):

For each of sheet-like probes M3 and M4, sheet-like probes N3 and N4, and sheet-like probes O3 and O4, the connecting stability of the electrode structure 15 to the electrode to be inspected was evaluated in the following manner.

At a room temperature (25° C.), a wafer W2 for a test was disposed on a test table having an electric heater and the sheet-like probe was provided on a surface of the wafer W2 for a test in such a manner that each of the surface electrode portions 16 was aligned to be positioned on the electrode 7 to be inspected in the wafer W2 for a test. Furthermore, the anisotropically conductive connector 30 was disposed on the sheet-like probe in such a manner that each of the conducting portions 36 was aligned to be positioned on the back electrode portion 17 of the sheet-like probe. Moreover, the circuit board T1 for an inspection was disposed on the anisotropically conductive connector 30 in such a manner that each of the inspection electrodes 21 was aligned to be positioned on the conducting portion 36 of the anisotropically conductive connector 30. Furthermore, the circuit board T1 for an inspection was pressurized downward at a load of 200 kg (a load to be applied per electrode structure is approximately 8 g on average).

The anisotropically conductive connector 30 shown in the following Table 2 was used.

Referring to the 26116 inspection electrodes 7 in the circuit board T1 for an inspection, an electric resistance was sequentially measured between two inspection electrodes 21 connected electrically to each other through the sheet-like probe, the anisotropically conductive connector 30 and the wafer W2 for a test. In addition, a value to be a half of the electric resistance value thus measured was recorded as an electric resistance between the inspection electrode 21 of the circuit board T1 for an inspection and the electrode 7 to be inspected in the wafer W2 for a test (which will be hereinafter referred to as "a conducting resistance"). As a result, a rate of any of all measuring points on which the conducting resistance is equal to or higher than 1Ω (which will be hereinafter referred to as "a connection failure rate") were obtained.

This operation is set to be "an operation (1)".

Subsequently, the pressurization for the circuit board T1 for an inspection was released and the temperature of the test table was then raised to 125° C. and was left until the temperature was stabilized. Thereafter, the circuit board T1 for an inspection was pressurized downward at a load of 200 kg (a load to be applied per electrode structure is approximately 8 g on average). As a result, a connecting failure rate in the same manner as in the operation (1) described above were obtained. This operation is set to be "an operation (2)".

Next, the test table was cooled to a room temperature (25° C.) and the pressurization for the circuit board T1 for a inspection was released. This operation is set to be "an operation (3)".

The operations (1), (2) and (3) were set to be one cycle and 200 cycles in total were carried out continuously.

In the case in which the conducting resistance is equal to or higher than 1Ω, it is hard to practically carry out use in an electrical inspection for an integrated circuit formed on a wafer.

The above results are shown in the following Table 2.

TABLE 2

|  | Sheet-like probe | Anisotropically conductive connector | Temperature/ Number of cycles | Connection failure rate | | | | |
| --- | --- | --- | --- | --- | --- | --- | --- | --- |
|  |  |  |  | Once | 10 times | 50 times | 100 times | 200 times |
| Example 1 | M3 | C7 | 25° C. | 0% | 0% | 0% | 0% | 0% |
|  |  |  | 125° C. | 0% | 0% | 0% | 0% | 0% |
|  | M4 | C8 | 25° C. | 0% | 0% | 0% | 0% | 0% |
|  |  |  | 125° C. | 0% | 0% | 0% | 0% | 0% |
| Example 2 | N3 | C9 | 25° C. | 0% | 0% | 0% | 0% | 0% |
|  |  |  | 125° C. | 0% | 0% | 0% | 0% | 0% |
|  | N4 | C10 | 25° C. | 0% | 0% | 0% | 0% | 0% |
|  |  |  | 125° C. | 0% | 0% | 0% | 0% | 0% |
| Comparative example 1 | O3 | C11 | 25° C. | 7% | 11% | 15% | 25% | 30% or higher |
|  |  |  | 125° C. | 11% | 13% | 21% | 30% or higher | 30% or higher |
|  | O4 | C12 | 25° C. | 8% | 12% | 16% | 28% | 30% or higher |
|  |  |  | 125° C. | 12% | 14% | 21% | 30% or higher | 30% or higher |

After the test 2 was ended, moreover, the sheet-like probe was observed. Consequently, the electrode structure 15 did not slip from the insulating layer 18B.

From the results shown in Table 2, referring to the sheet-like probe O according to the comparative example, a projection height of the surface electrode portion is small and a thickness of the insulating layer 18B is large. Consequently, it is found that an electrical connecting state cannot be stably maintained to a wafer having an electrode to be inspected of which the peripheral surface is covered by an insulating film.

The invention claimed is:

1. A sheet-like probe comprising:
   an insulating layer; and
   a contact film including a plurality of electrode structures disposed on the insulating layer apart from each other by 40 to 160 μm in a planar direction thereof and extended to penetrate in a direction of a thickness of the insulating layer, at least part of the electrode structures including a metal extended to penetrate in the direction of the thickness of the insulating layer through a tapered through hole of the insulating layer to fill in the tapered through hole by carrying out a plate treatment, the tapered through hole being formed in the insulating layer by an etching treatment,
   each of the electrode structures including:
      a surface electrode portion exposed from a surface of the insulating layer, projected from the surface of the insulating layer, and shaped to have a diameter which is gradually reduced from the base end toward a tip;
      a back electrode portion exposed from a back face of the insulating layer; and
      a short circuit portion extended to penetrate through the insulating layer in a direction of a thickness thereof continuously from a base end of the surface electrode portion and coupled to the back electrode portion,
   wherein a diameter of the base end of the surface electrode portion is larger than a diameter of the end of the side which comes into contact with the surface electrode portion on the short circuit portion, and
   a thickness of the short circuit portion is larger than a thickness of the insulating layer.

2. The sheet-like probe according to claim 1, wherein the short circuit portion is movable in a direction of a thickness of the insulating layer.

3. The sheet-like probe according to claim 2, wherein a length in which the electrode structure can move in a direction of a thickness of the insulating layer is in the range of 5 to 30 μm.

4. A probe card for electrically connecting a circuit device to be an inspecting object to a tester, comprising:
   a circuit board for an inspection which has a plurality of inspection electrodes formed thereon corresponding to an electrode to be inspected in the circuit device to be the inspecting object;
   an anisotropically conductive connector disposed on the circuit board for an inspection; and
   the sheet-like probe according to claim 1 which is disposed on the anisotropically conductive connector.

5. The probe card according to claim 4, wherein the circuit device to be the inspecting object is a wafer having a large number of integrated circuits formed thereon, and
   the anisotropically conductive connector includes:
      a frame plate having a plurality of openings formed thereon corresponding to an electrode region on which electrodes to be inspected in all or a part of integrated circuits formed on a wafer to be the inspecting object are disposed; and
      an anisotropically conductive sheet disposed to close each of the openings of the frame plate.

6. An apparatus for inspecting a circuit device comprising the probe card according to claim 4.

7. A method of inspecting a wafer comprising the steps of:
electrically connecting each of the integrated circuits of a wafer having a plurality of integrated circuits formed thereon to a tester through the probe card according to claim 4; and
electrically inspecting each of the integrated circuits.

8. A method of manufacturing a sheet-like probe comprising the steps of:
preparing a laminate material having at least an insulating sheet,
a surface side metal layer formed on a surface of the insulating sheet, and
a first back side metal layer formed on a back face of the insulating sheet;
forming a through hole mutually communicating with the first back side metal layer and the insulating sheet in the laminate material and extended in a direction of a thickness, thereby providing a concave portion for forming a surface electrode portion on a back face of the laminate material;
carrying out a plating treatment over the laminate material by using the surface side metal layer as an electrode to fill a metal in the concave portion for forming a surface electrode portion, thereby forming a surface electrode portion projected from a surface of an insulating layer,
forming an insulating layer configured by a plurality of resin layers having different etching speeds in a direction of a thickness on a back side of the laminate material and a second back side metal layer formed on a surface of the insulating layer;
providing a concave portion for forming a short circuit portion mutually communicating with each of the second back side metal layer and the insulating layer in the laminate material and having a bottom face from which the surface electrode portion is exposed;
carrying out the plating treatment over the laminate material by using the surface side metal layer as an electrode to fill a metal in the concave portion for forming a short circuit portion, thereby forming a short circuit portion extended to penetrate through the insulating layer in a direction of a thickness thereof continuously from a base end of the surface electrode portion;
then carrying out an etching treatment over the second back side metal layer, thereby forming a back electrode portion;
removing the surface side metal layer and the insulating sheet, thereby exposing the surface electrode portion and the first back side metal layer;
thereafter carrying out the etching treatment over the first back side metal layer, thereby forming a holding portion extended outward along the surface of the insulating sheet continuously from the base end portion of the surface electrode portion; and
thereafter carrying out an etching treatment over the insulating layer to remove the surface side portion of the insulating layer, thereby decreasing a thickness of the insulating layer.

9. The method of manufacturing a sheet-like probe according to claim 8, wherein an etching speed of a resin layer on the side which comes into contact with the surface electrode portion is higher among the resin layers having different etching speeds that configure the insulating layer.

10. The method of manufacturing a sheet-like probe according to claim 8, further comprising the step of removing at least one resin layer in a plurality of resin layers having different etching speeds that configure the insulating layer.

11. The method of manufacturing a sheet-like probe according to claim 8, wherein the insulating layer is formed of a plurality of resin layers laminated through the metal layer and a resin layer on the surface electrode portion side from the metal layer is removed by an etching.

12. A probe card for electrically connecting a circuit device to be an inspecting object to a tester, comprising:
a circuit board for an inspection which has a plurality of inspection electrodes formed thereon corresponding to an electrode to be inspected in the circuit device to be the inspecting object;
an anisotropically conductive connector disposed on the circuit board for an inspection; and
a sheet-like probe manufactured by the method according to claim 8 which is disposed on the anisotropically conductive connector.

13. The probe card according to claim 12, wherein the circuit device to be the inspecting object is a wafer having a large number of integrated circuits formed thereon, and
the anisotropically conductive connector includes:
a frame plate having a plurality of openings formed thereon corresponding to an electrode region on which electrodes to be inspected in all or a part of integrated circuits formed on a wafer to be the inspecting object are disposed; and
an anisotropically conductive sheet disposed to close each of the openings of the frame plate.

14. An apparatus for inspecting a circuit device comprising the probe card according to claim 12.

* * * * *